US011731990B2

(12) United States Patent
Parham et al.

(10) Patent No.: US 11,731,990 B2
(45) Date of Patent: Aug. 22, 2023

(54) CARBAZOLE-BASED BODIPYS FOR ORGANIC ELECTROLUMINESCENT DEVICES

(71) Applicant: Merck Patent GmbH, Darmstadt (DE)

(72) Inventors: Amir Parham, Frankfurt am Main (DE); Jonas Kroeber, Frankfurt am Main (DE); Dominik Joosten, Ober-Ramstadt (DE); Aurélie Ludemann, Frankfurt am Main (DE); Tobias Grossmann, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 635 days.

(21) Appl. No.: 16/611,872

(22) PCT Filed: May 8, 2018

(86) PCT No.: PCT/EP2018/061781
§ 371 (c)(1),
(2) Date: Nov. 8, 2019

(87) PCT Pub. No.: WO2018/206537
PCT Pub. Date: Nov. 15, 2018

(65) Prior Publication Data
US 2021/0079024 A1  Mar. 18, 2021

(30) Foreign Application Priority Data
May 11, 2017  (EP) .................................... 17170651

(51) Int. Cl.
| | |
|---|---|
| *C07F 5/02* | (2006.01) |
| *H10K 50/11* | (2023.01) |
| *H10K 85/60* | (2023.01) |
| *H10K 101/10* | (2023.01) |
| *H10K 50/15* | (2023.01) |
| *H10K 50/16* | (2023.01) |

(52) U.S. Cl.
CPC ................ *C07F 5/02* (2013.01); *C07F 5/025* (2013.01); *H10K 50/11* (2023.02); *H10K 85/654* (2023.02); *H10K 85/657* (2023.02); *H10K 50/15* (2023.02); *H10K 50/16* (2023.02); *H10K 2101/10* (2023.02)

(58) Field of Classification Search
CPC ....................................................... C07F 5/02
See application file for complete search history.

(56) References Cited

U.S. PATENT DOCUMENTS

| | | | |
|---|---|---|---|
| 4,539,507 | A | 9/1985 | VanSlyke et al. |
| 9,166,176 | B2 | 10/2015 | Hatakeyama et al. |

FOREIGN PATENT DOCUMENTS

| | | |
|---|---|---|
| WO | WO-2012121398 A1 | 9/2012 |
| WO | WO-2013023292 A1 | 2/2013 |
| WO | WO-2013039413 A1 | 3/2013 |

OTHER PUBLICATIONS

Curiel, David, et al. "Indolocarbazole-Based Ligands for Ladder-Type Four-Coordinate Boron Complexes." Org. Lett. (2012), vol. 14, No. 13, pp. 3360-3363. (Year: 2012).*
Curiel, D., et al., "Idolocarbazole-Based Ligands for Ladder-Type Four-Coordinate Boron Complexes", Organic Letters, vol. 14, No. 13, (2012), pp. 3360-3363.
International Search Report for PCT/EP2018/061767 dated Jul. 3, 2018.
International Search Report for PCT/EP2018/061781 dated Jun. 12, 2018.
Liu, Q.-D., et al., "From Blue to Red: Syntheses, Structures, Electronic, and Electroluminescent Properties of Tunable Luminescent N,N Chelate Boron Complexes", Advanced Functional Materials, vol. 15, No. 1, (2005), pp. 143-154.
Maeda, C., et al., "Color-Tunable Solid-State Fluorescence Emission from Carbazole-Based BODIPYs", Chemistry—a European Journal, vol. 22, No. 22, (2016), pp. 7508-7513.
Más-Montoya, M., et al., "Single Heteroatom Fine-Tuning of the Emissive Properties in Organoboron Complexes with 7-(Azaheteroaryl)indole Systems", Journal of Organic Chemistry, vol. 81, No. 8, (2016), pp. 3296-3302.
Pidlypnyi, N., et al., "Betaine-Carbene Interconversions. From N-Ylides to Zwitterionic H-Heterocyclic Carbene-Borane Adducts", Journal of Organic Chemistry, vol. 78, No. 3, (2013), pp. 1070-1079.
Written Opinion of the International Searching Authority for PCT/EP2018/061767 dated Jul. 3, 2018.
Written Opinion of the International Searching Authority for PCT/EP2018/061781 dated Jun. 12, 2018.

* cited by examiner

*Primary Examiner* — John S Kenyon
(74) *Attorney, Agent, or Firm* — Faegre Drinker Biddle & Reath LLP

(57) ABSTRACT

The present invention relates to compounds of the formula (1) which are suitable for use in electronic devices, in particular organic electroluminescent devices, and to electronic devices which comprise these compounds.

17 Claims, No Drawings

CARBAZOLE-BASED BODIPYS FOR ORGANIC ELECTROLUMINESCENT DEVICES

CROSS-REFERENCE TO RELATED APPLICATIONS

This application is a national stage application (under 35 U.S.C. § 371) of PCT/EP2018/061781, filed May 8, 2018, which claims benefit of European Application No. 17170651.8, filed May 11, 2017, both of which are incorporated herein by reference in their entirety.

The present invention relates to a compound of the formula (1), to the use of the compound in an electronic device, and to an electronic device comprising a compound of the formula (1). The present invention furthermore relates to a process for the preparation of a compound of the formula (1) and to a formulation comprising one or more compounds of the formula (1).

The structure of organic electroluminescent devices (OLEDs) in which organic semiconductors are employed as functional materials is described, for example, in U.S. Pat. No. 4,539,507. The emitting materials employed here are very often organometallic complexes which exhibit phosphorescence. For quantum-mechanical reasons, an up to four-fold increase in efficiency is possible using phosphorescent instead of fluorescent emitters. In general, however, there is still a need for improvement in the case of OLEDs, in particular also in the case of OLEDs which exhibit triplet emission (phosphorescence), for example with respect to efficiency, operating voltage and lifetime.

The properties of phosphorescent OLEDs are not only determined by the triplet emitters employed but also by the other materials used together with triplet emitters in OLEDs, such as matrix materials, also called host materials. Improvements in these materials and their charge-transport properties can thus also result in significant improvements in the OLED properties.

Thus, the choice of the matrix material in an emission layer comprising a phosphorescent emitter has a great influence on OLEDs properties, especially in terms of efficiency. The matrix material limits the quenching of excited states of emitter molecules by energy transfer.

The object of the present invention is the provision of compounds, which are suitable for use in an OLED, in particular as matrix material for phosphorescent emitters. A further object of the present invention is to provide further organic semiconductors for organic electroluminescent devices to provide the person skilled in the art with a greater possible choice of materials for the production of OLEDs.

Organoboron complexes are known from the prior art for their optical properties (for example in Más-Montoya et al., J. Org. Chem. 2016, 81, 3296-3302 and in Liu et al., Adv. Funct. Mater. 2005, 15, No. 1, January, 143-154).

Surprisingly, it has been found that certain organoboron complexes described in greater detail below are highly suitable for use in OLEDs, in particular as matrix material for phosphorescent emitters. When employed as matrix materials, these compounds lead to OLEDs exhibiting very good properties in terms of lifetime and/or efficiency and/or electroluminescent emission. In addition, these compounds have a high glass transition temperature and a good thermal stability, which is an important property for OLED materials, especially when the materials are vapor-deposited via a vacuum process.

The present invention therefore relates to these compounds and to electronic devices, in particular organic electroluminescent devices, which comprise compounds of this type.

The present invention relates to a compound of the formula (1):

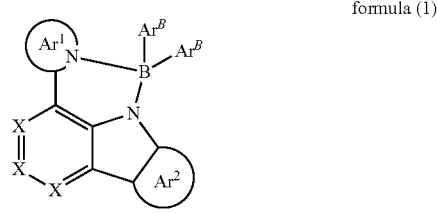

formula (1)

where the following applies to the symbols and indices used:

$Ar^1$ is a heteroaryl group comprising at least one nitrogen which is represented in formula (1), having 5 to 30 aromatic ring atoms, which may be substituted by one or more radicals $R^1$;

$Ar^2$ stands for an aryl or heteroaryl group having 5 to 30 aromatic ring atoms, which may be substituted by one or more radicals $R^2$;

$Ar^B$ is, on each occurrence, identically or differently, an aromatic or heteroaromatic ring system having 5 to 60 aromatic ring atoms, which may be substituted by one or more radicals $R^3$;

X stands, on each occurrence, identically or differently, for $CR^2$ or N; or two adjacent groups X stand for a group of formula (X-1),

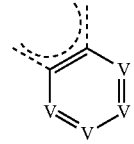

formula (X-1)

where the dashed bonds in formula (X-1) indicate the bonding of the corresponding adjacent groups X to the structure of formula (1);

V is on each occurrence, identically or differently, $CR^2$ or N;

$R^1$, $R^2$, $R^3$ stand on each occurrence, identically or differently, for H, D, F, C, Br, I, CHO, CN, C(=O)$Ar^3$, P(=O)($Ar^3$)$_2$, S(=O)$Ar^3$, S(=O)$_2Ar^3$, N($Ar^3$)$_2$, NO$_2$, Si($R^4$)$_3$, B(O$R^4$)$_2$, OSO$_2R^4$, a straight-chain alkyl, alkoxy or thioalkyl groups having 1 to 40 C atoms or branched or a cyclic alkyl, alkoxy or thioalkyl groups having 3 to 40 C atoms, each of which may be substituted by one or more radicals $R^4$, where in each case one or more non-adjacent CH$_2$ groups may be replaced by $R^4$C=C$R^4$, C≡C, Si($R^4$)$_2$, Ge($R^4$)$_2$, Sn($R^4$)$_2$, C=O, C=S, C=Se, P(=O)($R^4$), SO, SO$_2$, O, S or CON$R^4$ and where one or more H atoms may be replaced by D, F, Cl, Br, I, CN or NO$_2$, an aromatic or heteroaromatic ring systems having 5 to 60 aromatic ring atoms, which may in each case be substituted by one or more radicals $R^4$, or an aryloxy groups having 5 to 60 aromatic ring atoms, which may be substituted by one or more radicals $R^4$; where two adjacent substituents R¹, two adjacent substituents R² and/or two adjacent substituents R³ may form an aliphatic or aromatic ring system together, which may be substituted by one or more radicals R⁴; and where one substituent R¹ of the group Ar¹ and one substituent R² of the adjacent 6-membered ring comprising the groups X may form an aliphatic or aromatic ring system together;

Ar³ is, on each occurrence, identically or differently, an aromatic or heteroaromatic ring system having 5 to 60 aromatic ring atoms, which may in each case also be substituted by one or more radicals R⁴;

R⁴ stands on each occurrence, identically or differently, for H, D, F, Cl, Br, I, CN, a straight-chain alkyl, alkoxy or thioalkyl groups having 1 to 20 C atoms or branched or cyclic alkyl, alkoxy or thioalkyl groups having 3 to 20 C atoms, where in each case one or more non-adjacent CH₂ groups may be replaced by SO, SO₂, O, S and where one or more H atoms may be replaced by D, F, Cl, Br or I, or an aromatic or heteroaromatic ring system having 5 to 24 C atoms.

Adjacent substituents in the sense of the present invention are substituents which are bonded to carbon atoms which are linked directly to one another or which are bonded to the same carbon atom.

Furthermore, the following definitions of chemical groups apply for the purposes of the present application:

An aryl group in the sense of this invention contains 6 to 60 aromatic ring atoms; a heteroaryl group in the sense of this invention contains 5 to 60 aromatic ring atoms, at least one of which is a heteroatom. The hetero atoms are preferably selected from N, O and S. This represents the basic definition. If other preferences are indicated in the description of the present invention, for example with respect to the number of aromatic ring atoms or the heteroatoms present, these apply.

An aryl group or heteroaryl group here is taken to mean either a simple aromatic ring, i.e. benzene, or a simple heteroaromatic ring, for example pyridine, pyrimidine or thiophene, or a condensed (annelated) aromatic or heteroaromatic polycycle, for example naphthalene, phenanthrene, quinoline or carbazole. A condensed (annelated) aromatic or heteroaromatic polycycle in the sense of the present application consists of two or more simple aromatic or heteroaromatic rings condensed with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aryloxy group in accordance with the definition of the present invention is taken to mean an aryl group, as defined above, which is bonded via an oxygen atom. An analogous definition applies to heteroaryloxy groups.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an sp³-hybridised C, Si, N or O atom, an sp²-hybridised C or N atom or an sp-hybridised C atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may in each case also be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazole, 1,2,3,4-tetrazine, 1,2,3,5-tetrazine, purine, pteridine, indolizine and benzothiadiazole, or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The formulation that two radicals may form a ring with one another is, for the purposes of the present application, intended to be taken to mean, inter alia, that the two radicals are linked to one another by a chemical bond. This is illustrated by the following schemes:

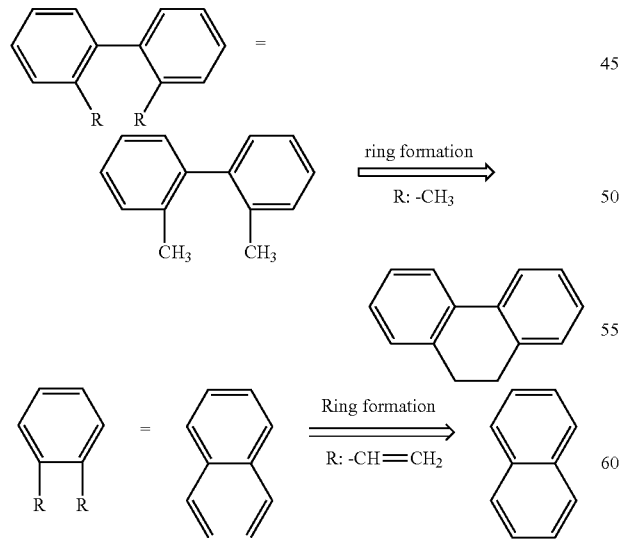

Furthermore, the above-mentioned formulation is also intended to be taken to mean that, in the case where one of the two radicals represents hydrogen, the second radical is bonded at the position to which the hydrogen atom was bonded, with formation of a ring. This is illustrated by the following scheme:

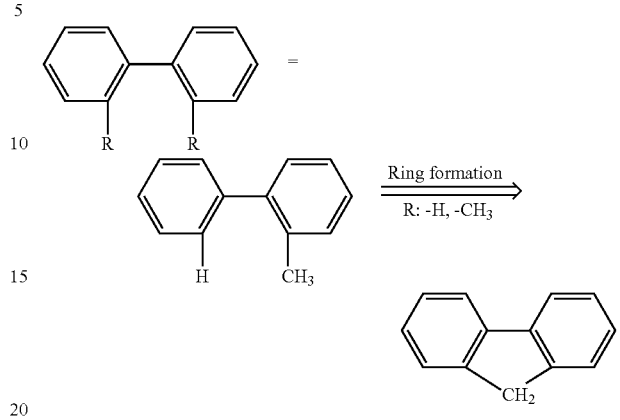

In accordance with the invention, one substituent $R^1$ of the group $Ar^1$ and one substituent $R^2$ of the adjacent 6-membered ring comprising the groups X as depicted in formula (1) may form an aliphatic or aromatic ring system together. The following formula (1-E) is an example of the case, where one substituent $R^1$ and one substituent $R^2$ form an aliphatic ring system with one another, corresponding to a divalent bridge E as follows:

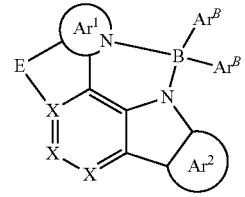

Formula (1-E)

where E is a divalent bridge and E stands for —B($R^0$)—, —C($R^0$)$_2$—, —Si($R^0$)$_2$—, —C(=O)—, —C(=NR$^0$)—, —C($R^0$)=C($R^0$)—, —C(=C($R^0$)$_2$)—, —O—, —S—, —S(=O)—, —SO$_2$—, —N($R^0$)—, —P($R^0$)— and —P((=O)$R^0$)—; and $R^0$ stands on each occurrence, identically or differently, for H, D, F, Cl, Br, I, CN, a straight-chain alkyl, alkoxy or thioalkyl groups having 1 to 40 C atoms or branched or a cyclic alkyl, alkoxy or thioalkyl groups having 3 to 40 C atoms, each of which may be substituted by one or more radicals $R^4$, where in each case one or more non-adjacent $CH_2$ groups may be replaced by $R^4C=CR^4$, C≡C, Si($R^4$)$_2$, Ge($R^4$)$_2$, Sn($R^4$)$_2$, C=O, C=S, C=Se, P(=O)($R^4$), SO, SO$_2$, O, S or CONR$^4$ and where one or more H atoms may be replaced by D, F, Cl, Br, I, CN or NO$_2$, an aromatic or heteroaromatic ring systems having 5 to 60 aromatic ring atoms, which may in each case be substituted by one or more radicals $R^4$, or an aryloxy groups having 5 to 60 aromatic ring atoms, which may be substituted by one or more radicals $R^4$, where two adjacent substituents $R^0$ may form an aliphatic or aromatic ring system together, which may be substituted by one or more radicals $R^4$.

Preferably, E stands for —C($R^0$)$_2$—, —C($R^0$)=C($R^0$)—, —O—, —S— or —N($R^0$)—. Very preferably, E stands for —C($R^0$)$_2$—, or —N($R^0$)—.

Preferably, $R^0$ stands on each occurrence, identically or differently, for H, D, F, a straight-chain alkyl group having 1 to 10 C atoms or branched or a cyclic alkyl group having 3 to 10 C atoms, each of which may be substituted by one or more radicals $R^4$, where one or more H atoms may be replaced by D or F, an aromatic or heteroaromatic ring systems having 5 to 18 aromatic ring atoms, which may in each case be substituted by one or more radicals $R^4$, where two adjacent substituents $R^0$ may form an aliphatic or aromatic ring system together, which may be substituted by one or more radicals $R^4$.

In accordance with a preferred embodiment of the invention, the group $Ar^1$ is a heteroaryl group having 5 to 18 aromatic ring atoms, selected from the groups of formulae (Ar1-1), (Ar1-2) or (Ar1-3),

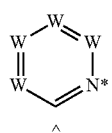

Formula (Ar1-1)

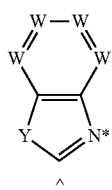

Formula (Ar1-2)

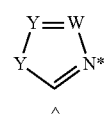

Formula (Ar1-3)

where the sign * indicates the position of the coordination to the Boron and the sign ^ indicates the bonds to the adjacent 6-membered ring as depicted in formula (1); and where Y stands on each occurrence, identically or differently, for O, S, $C(R^1)_2$ or $NR^1$;

W stands, on each occurrence, identically or differently, for $CR^1$ or N; or two adjacent groups W stand for a group of formula (W-1) or (W-2),

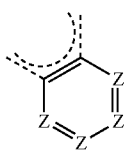

Formula (W-1)

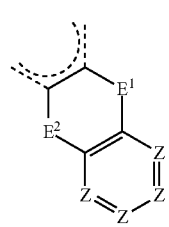

Formula (W-2)

where the dashed bonds in formulae (W-1) and (W-2) indicate the bonding to the groups of formula (Ar1-1) or (Ar1-2);

Z is on each occurrence, identically or differently, $CR^1$ or N;

$E^1$, $E^2$ are, on each occurrence, identically or differently, selected from a single bond, $B(R^0)$, $C(R^0)_2$, $Si(R^0)_2$, C=O, C=$NR^0$, C=$C(R^0)_2$, O, S, S=O, $SO_2$, $N(R^0)$, $P(R^0)$ and $P(=O)R^0$, where at least one of the groups $E^1$ and $E^2$, present in the same ring, is not a single bond; and $R^1$ and $R^0$ have the same meaning as above.

Preferably, $E^1$, $E^2$ are, on each occurrence, identically or differently, selected from a single bond, $C(R^0)_2$, C=O, O, S, S=O, $SO_2$ and $N(R^0)$, where at least one of the groups $E^1$ and $E^2$, present in the same ring, is not a single bond. Very preferably, one of the groups $E^1$ and $E^2$ is a single bond and the other group is $C(R^0)_2$, C=O, O, S, S=O, $SO_2$ or $N(R^0)$. Particularly preferably, one of the groups $E^1$ and $E^2$ is a single bond and the other one is $C(R^0)_2$, O, S, or $N(R^0)$.

In accordance with a preferred embodiment, the compound of formula (1) is selected from the compounds of formulae (2) to (5) as listed below:

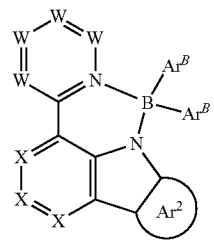

Formula (2)

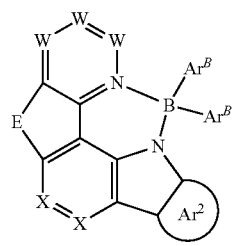

Formula (3)

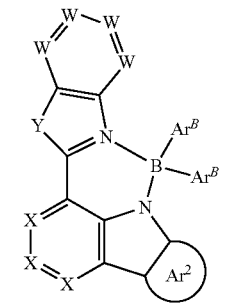

Formula (4)

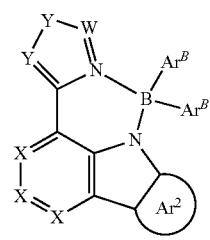

Formula (5)

where the symbols E, $Ar^2$, $Ar^B$, X, W and Y have the same meaning as above.
In accordance with a preferred embodiment, the compound of formula (1) is selected from the compounds of formulae (1-1) to (3-9) as listed below,
Formula (1-1)
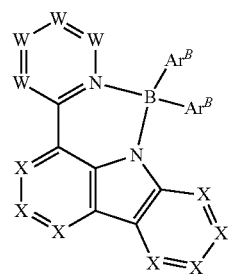
Formula (1-2)
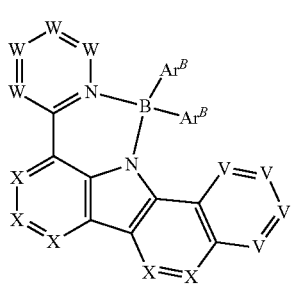
Formula (1-3)
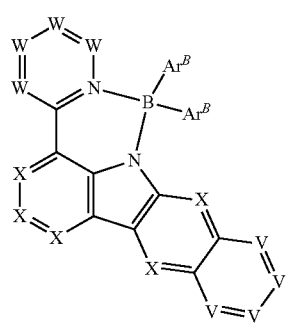
Formula (1-4)
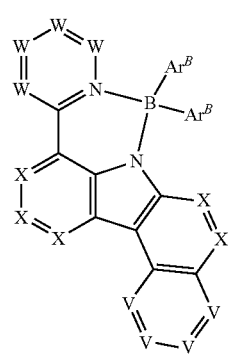
Formula (1-5)
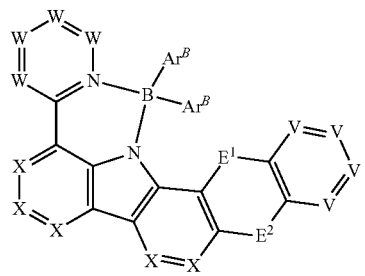
Formula (1-6)
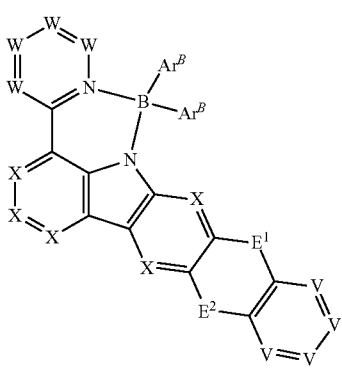
Formula (1-7)
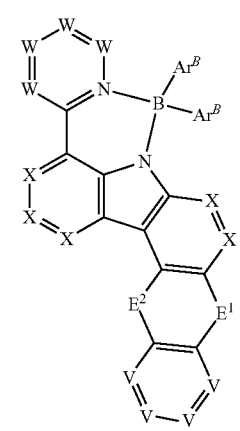
Formula (1-8)
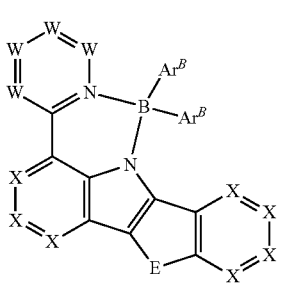

-continued
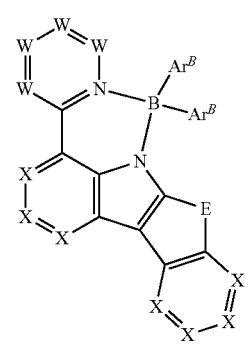
Formula (1-9)
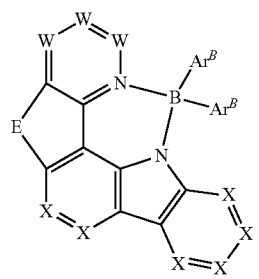
Formula (1-10)
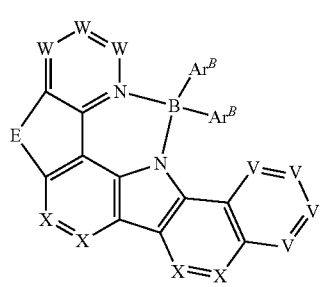
Formula (1-11)
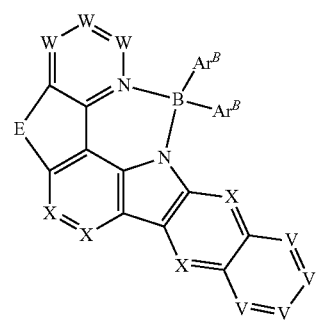
Formula (1-12)
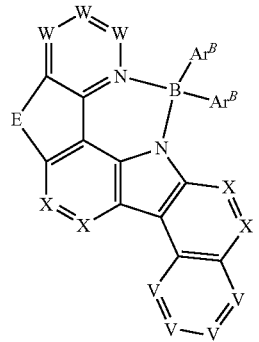
Formula (1-13)
-continued
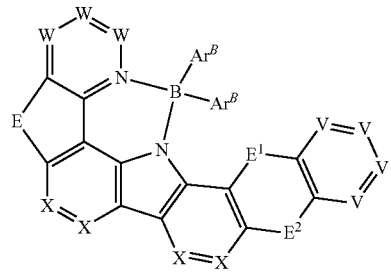
Formula (1-14)
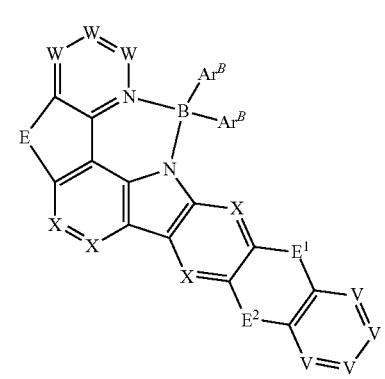
Formula (1-15)
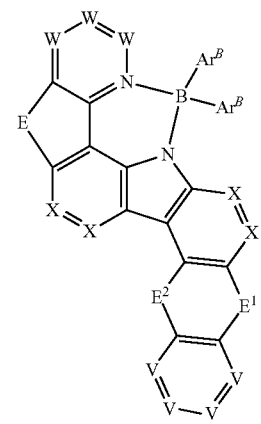
Formula (1-16)
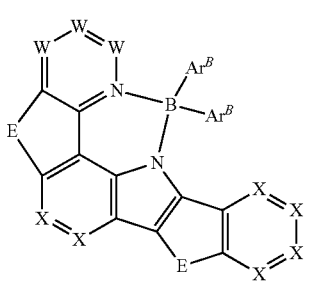
Formula (1-17)

Formula (1-18)
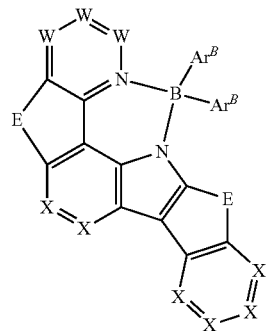
Formula (2-1)
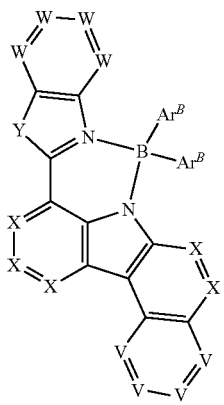
Formula (2-2)
Formula (2-3)
Formula (2-4)
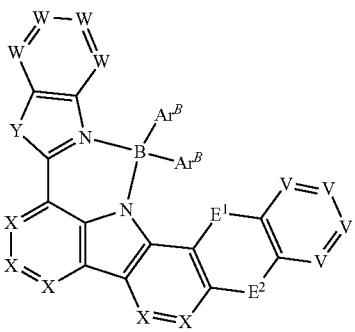
Formula (2-5)
Formula (2-6)
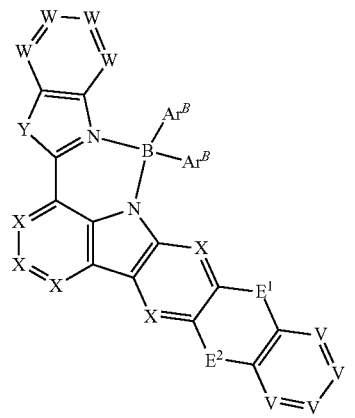
Formula (2-7)
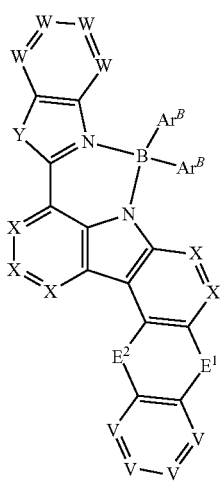

Formula (2-8)
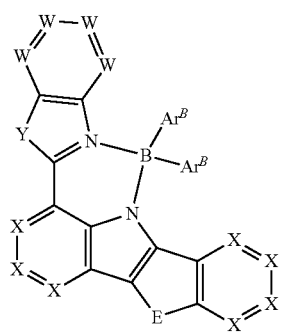
Formula (2-9)
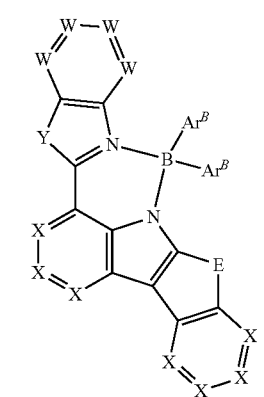
Formula (3-1)
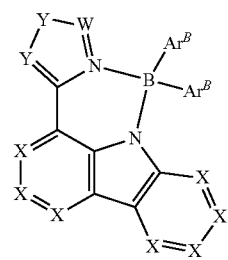
Formula (3-2)
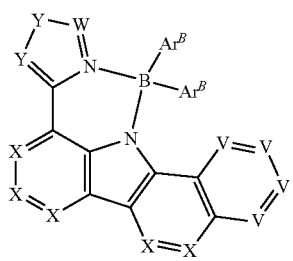
Formula (3-3)
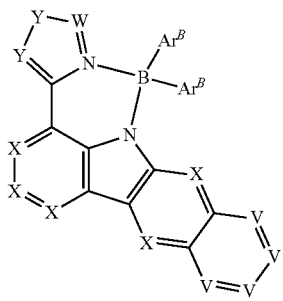
Formula (3-4)
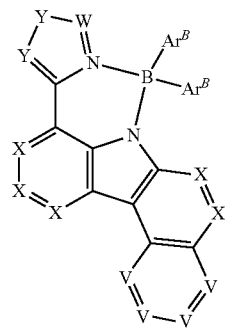
Formula (3-5)
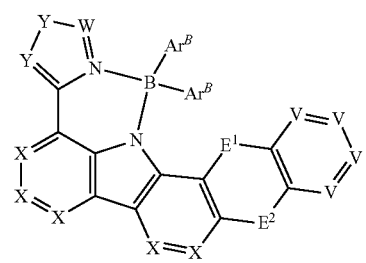
Formula (3-6)
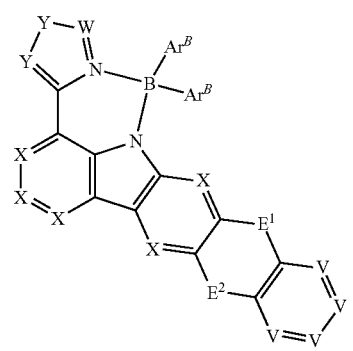
Formula (3-7)
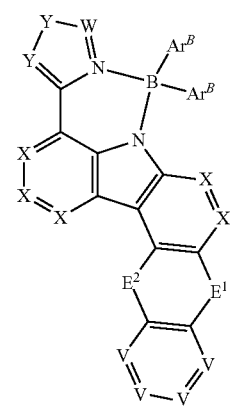
Formula (3-8)
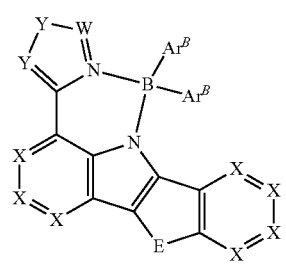

Formula (3-9)

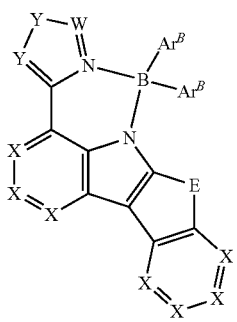

where the symbols Ar$^B$, E, W, Y and X have the same meaning as above.

Preferably, there are maximum two groups X per 6-membered ring, which stand for N, there are maximum two groups W per 6-membered ring, which stand for N, there are maximum two groups V per 6-membered ring, which stand for N and there are maximum two groups Z per 6-membered ring, which stand for N.

In accordance with a preferred embodiment, the compounds of formula (1) and (1-1) to (3-9) are selected from the compounds of formulae (1-1a) to (3-9a), Formula (1-1a)

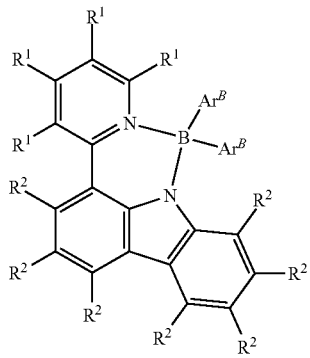

Formula (1-2a)

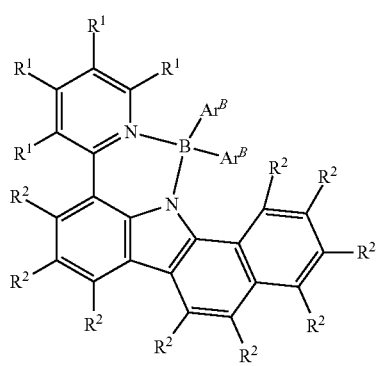

Formula (1-3a)

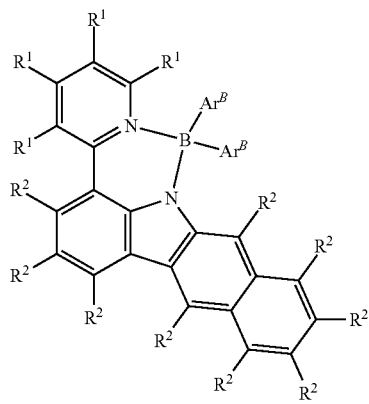

Formula (1-4a)

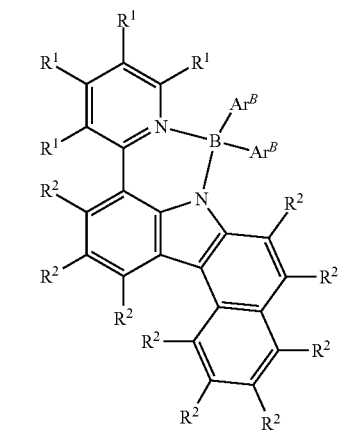

Formula (1-5a)

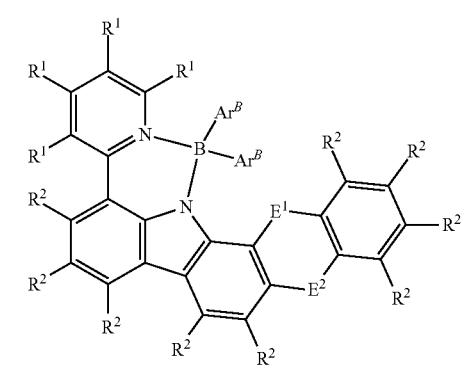

Formula (1-6a)
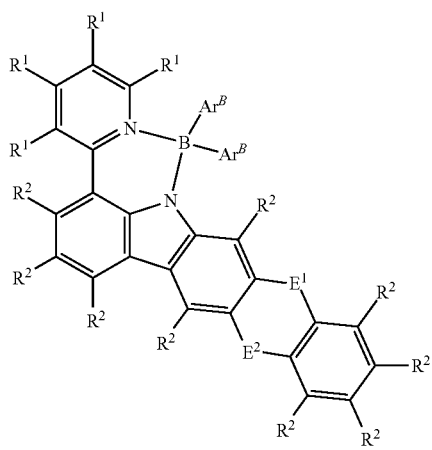
Formula (1-7a)
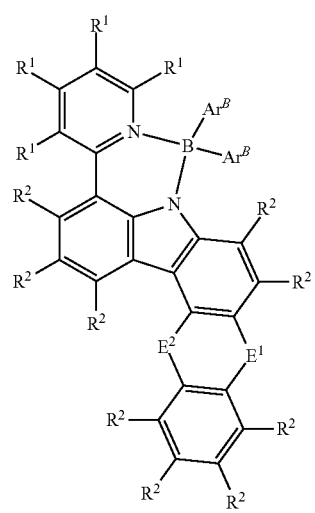
Formula (1-8a)
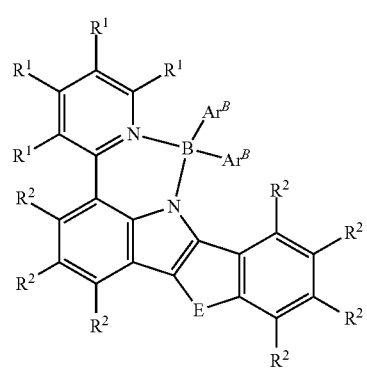
Formula (1-9a)
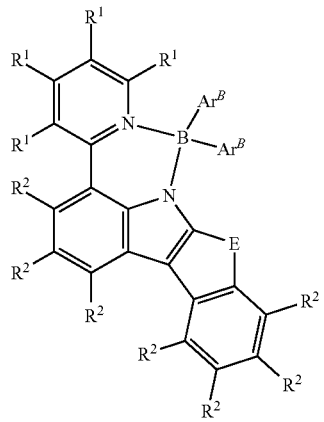
Formula (1-10a)
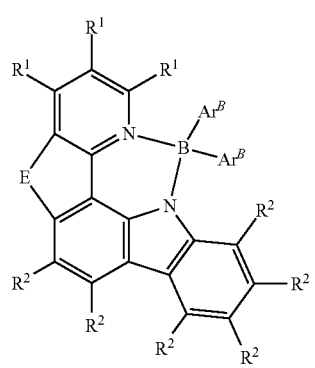
Formula (1-11a)
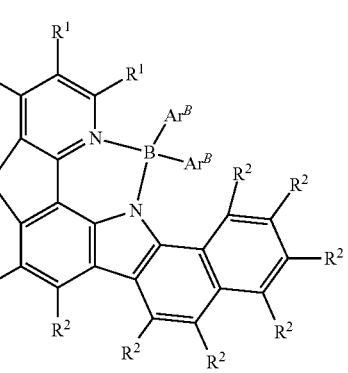
Formula (1-12a)
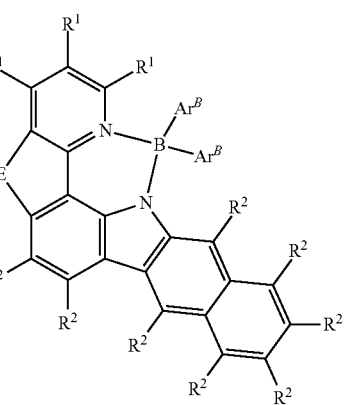

Formula (1-13a)
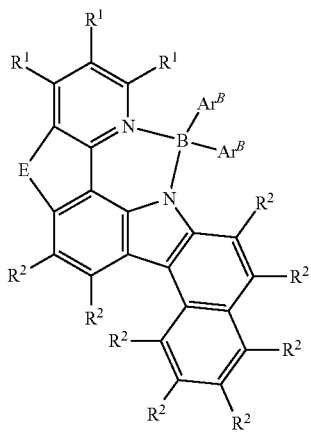
Formula (1-14a)
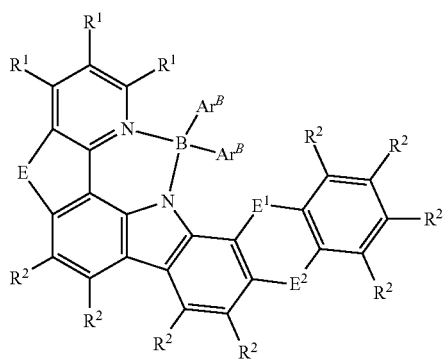
Formula (1-15a)
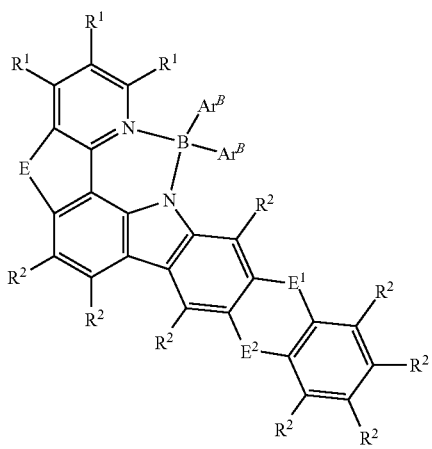
Formula (1-16a)
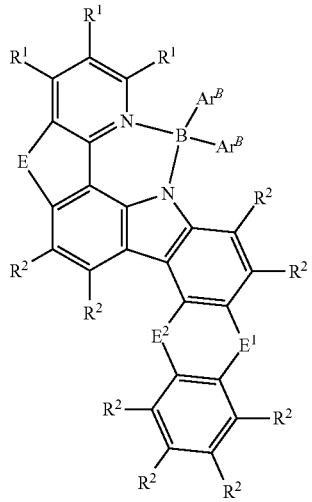
Formula (1-17a)
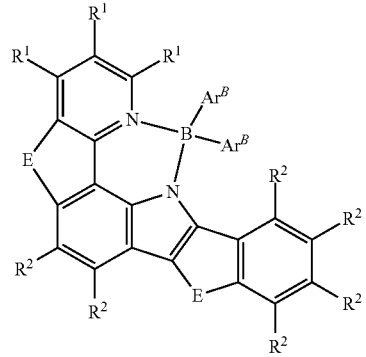
Formula (1-18a)
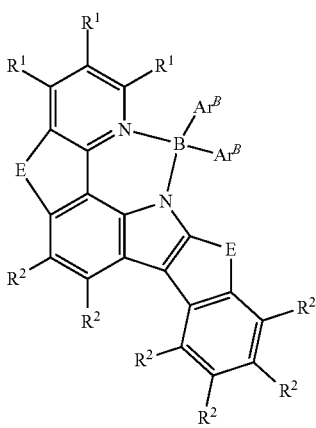

Formula (2-1a)
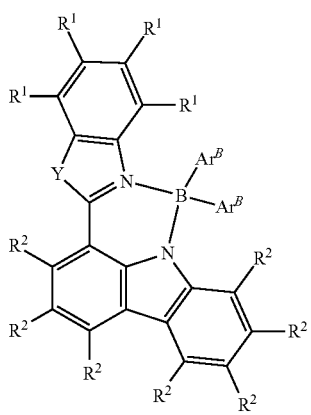
Formula (2-2a)
Formula (2-3a)
Formula (2-4a)
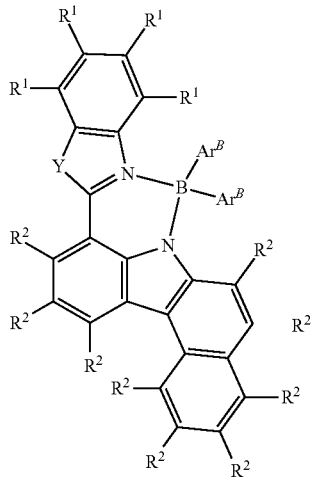
Formula (2-5a)
Formula (2-6a)
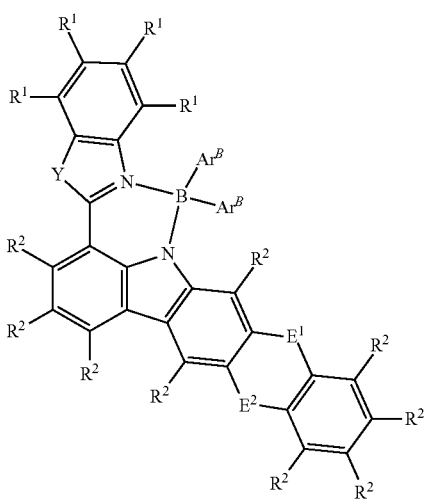

Formula (2-7a)
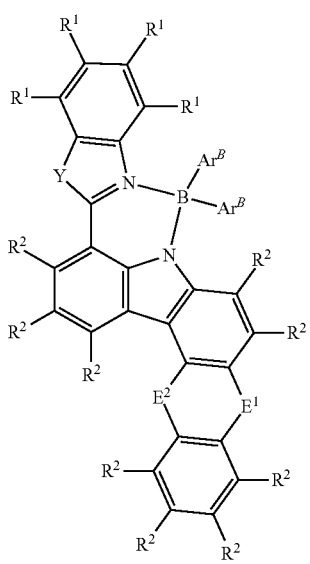
Formula (2-8a)
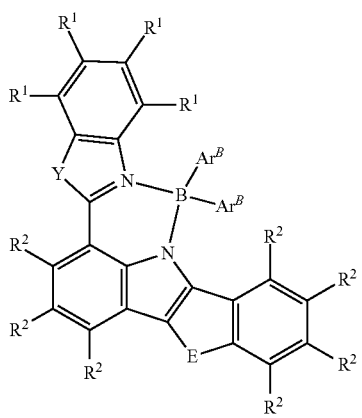
Formula (2-9a)
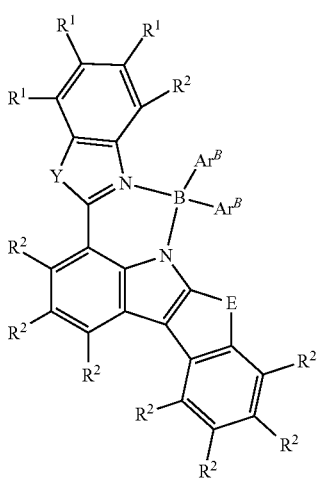
Formula (3-1a)
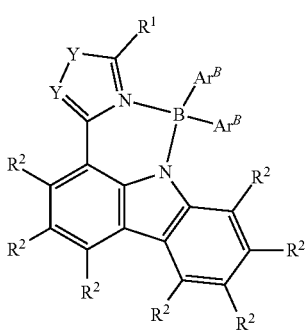
Formula (3-2a)
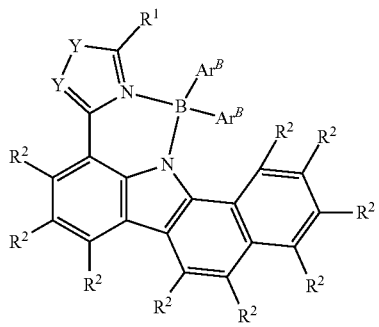
Formula (3-3a)
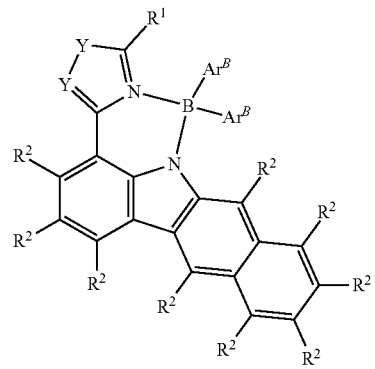
Formula (3-4a)
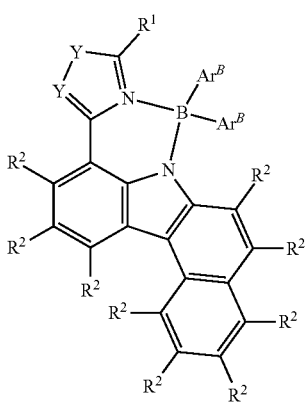

Formula (3-5a)

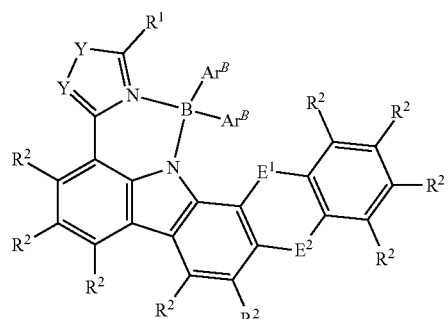

Formula (3-6a)

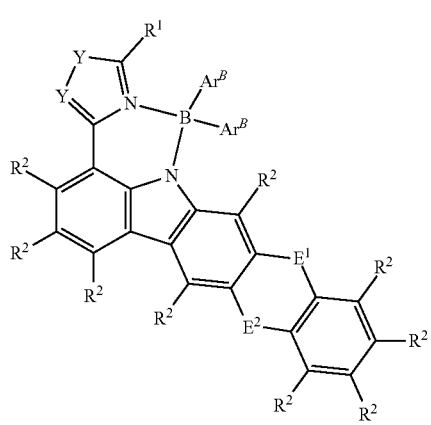

Formula (3-7a)

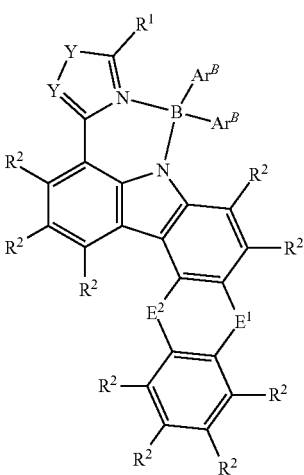

Formula (3-8a)

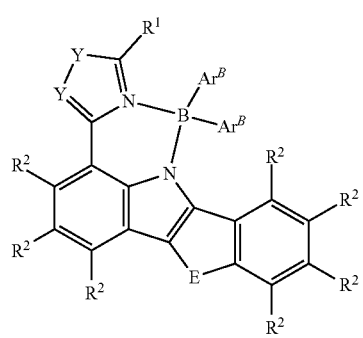

Formula (3-9a)

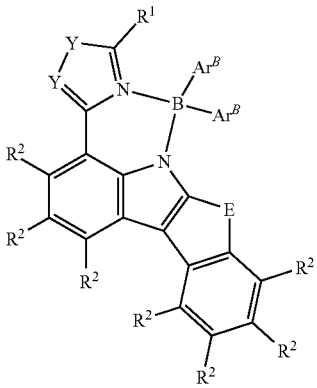

where the symbols $R^1$, $R^2$, $Ar^B$, E, $E^1$, $E^2$ and Y have the same meaning as above.

In accordance with a preferred embodiment, the group $Ar^B$ is, on each occurrence, identically or differently, an aromatic or heteroaromatic ring system having 5 to 30 aromatic ring atoms, more preferably 5 to 18 aromatic ring atoms, which may be substituted by one or more radicals $R^3$. It is very preferably that $Ar^B$ is, on each occurrence, identically or differently, an aromatic ring system having 6 to 18 aromatic ring atoms, more preferably 6 to 12 aromatic ring atoms, which may be substituted by one or more radicals $R^3$. Examples of very suitable groups for $Ar^B$ are phenyl, biphenyl and naphthyl groups, which may be substituted by one or more radicals $R^3$.

Preferably, $R^1$, $R^2$ stand on each occurrence, identically or differently, for H, D, F, CN, $N(Ar^3)_2$, a straight-chain alkyl group having 1 to 20 C atoms or branched or a cyclic alkyl group having 3 to 20 C atoms, each of which may be substituted by one or more radicals $R^4$, where in each case one or more non-adjacent $CH_2$ groups may be replaced by $R^4C=CR^4$, C=O, O or S and where one or more H atoms may be replaced by D or F, an aromatic or heteroaromatic ring systems having 5 to 40 aromatic ring atoms, preferably 5 to 25 aromatic ring atoms, which may in each case be substituted by one or more radicals $R^4$; where two adjacent substituents $R^1$ and/or two adjacent substituents $R^2$ may form an aliphatic or aromatic ring system together, which may be substituted by one or more radicals $R^4$.

Preferably, $R^3$ stands on each occurrence, identically or differently, for H, D, F, CN, $N(Ar^3)_2$, a straight-chain alkyl group having 1 to 20 C atoms or branched or a cyclic alkyl group having 3 to 20 C atoms, each of which may be substituted by one or more radicals $R^4$, where in each case one or more non-adjacent $CH_2$ groups may be replaced by $R^4C=CR^4$, C=O, O or S and where one or more H atoms may be replaced by D or F, an aromatic or heteroaromatic ring systems having 5 to 40 aromatic ring atoms, preferably 5 to 25 aromatic ring atoms, which may in each case be substituted by one or more radicals $R^4$; where two adjacent substituents $R^3$ may form an aliphatic or aromatic ring system together, which may be substituted by one or more radicals $R^4$. Very preferably, $R^3$ stands on each occurrence, identically or differently, for H, D, F, a straight-chain alkyl group having 1 to 10 C atoms or branched or a cyclic alkyl group having 3 to 10 C atoms, each of which may be substituted by one or more radicals $R^4$, where one or more H atoms may be replaced by D or F, an aromatic or heteroaromatic ring systems having 5 to 40 aromatic ring atoms, preferably 5 to 25 aromatic ring atoms, very preferably 5 to 18 aromatic ring atoms, which may in each case be substituted by one or more radicals $R^4$.

In accordance with a preferred embodiment, the compounds of formulae (1), (1-1) to (3-9) and (1-1a) to (3-9a) comprise at least one group $R^1$ or $R^2$ selected from aromatic or heteroaromatic ring systems having 5 to 60 aromatic ring atoms, preferably 5 to 40 aromatic rings atoms, more preferably 5 to 25 aromatic ring atoms, which may in each case be substituted by one or more radicals $R^4$.

More preferably, the compounds of formulae (1), (1-1) to (3-9), (1-1a) to (3-9a) comprise at least one group $R^1$ or $R^2$ selected from the groups of formulae (R-1) to (R-15), where:
the dashed bond indicates the bonding to the structure of formulae (1), (1-1) to (3-9) or (1-1a) to (3-9a) and the symbol V has the same meaning as above, with the proviso that V is a C atom when the dashed bond is bonded to V, and where:

$R^N$, $R^C$ are on each occurrence, identically or differently, H, D, F, Cl, Br, I, CHO, $N(Ar^3)_2$, $C(=O)Ar^3$, $P(=O)(Ar^3)_2$, $S(=O)Ar^3$, $S(=O)_2Ar^3$, $(R^4)C=C(R^4)Ar^3$, CN, $NO_2$, $Si(R^4)_3$, $B(OR^4)_2$, $B(R^4)_2$, $B(N(R^4)_2)_2$, $OSO_2R^4$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals R⁴, where one or more, preferably non-adjacent CH₂ groups may be replaced by (R⁴)C=C(R⁴), C≡C, Si(R⁴)₂, Ge(R⁴)₂, Sn(R⁴)₂, C=O, C=S, C=Se, P(=O)(R⁴), SO, SO₂, N(R⁴), O, S or CON(R⁴) and where one or more H atoms may be replaced by D, F, Cl, Br, I, CN or NO₂, or an aromatic or heteroaromatic ring system having 5 to 60 aromatic ring atoms, which may in each case be substituted by one or more radicals R⁴, or an aryloxy or heteroaryloxy group having 5 to 60 aromatic ring atoms, which may be substituted by one or more radicals R⁴, where optionally two adjacent substituents $R^C$ can form a mono- or polycyclic, aliphatic, aromatic or heteroaromatic ring system with one another; where Ar³ and R⁴ have the same definitions as above; and T stands, on each occurrence, identically or differently, for CR⁴ or N, with the proviso that T is a C atom when the dashed bond is bonded to T; or two adjacent groups T stand for a group of formula (T-1) or (T-2),

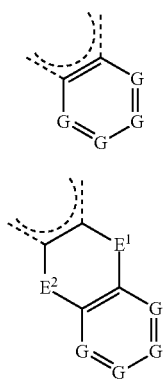

Formula (T-1)

Formula (T-2)

where the dashed bonds in formulae (T-1) and (T-2) indicate the bonding to the groups of formulae (R-1) to (R-5);

G is on each occurrence, identically or differently, CR⁴ or N; where R⁴ has the same meaning as above;

L is an aromatic or heteroaromatic ring system having 5 to 30 aromatic ring atoms, which may be substituted by one or more radicals R⁴;

n is 0 or 1, preferably 0.

L is preferably an aromatic or heteroaromatic ring system having 5 to 18 aromatic atoms, which may be substituted by one or more radicals R⁴. L is very preferably an aromatic ring system having 6 to 12 aromatic atoms, which may be substituted by one or more radicals R⁴. L is particularly preferably a phenyl group, which may be substituted by one or more radicals R⁴.

Examples of suitable groups R¹ or R² of formulae (R-1) to (R-15) are groups of formulae (R-16) to (R-129),

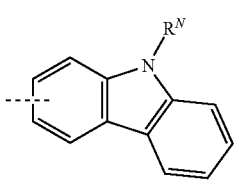
(R-16)

-continued

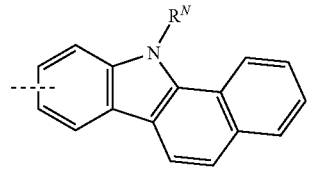
(R-17)

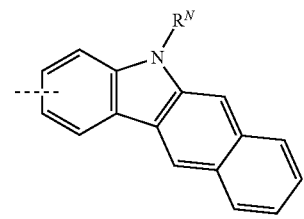
(R-18)

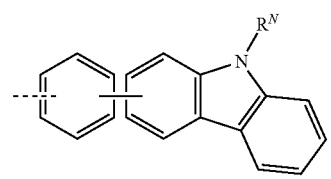
(R-19)

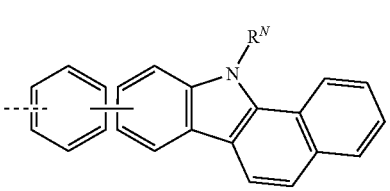
(R-20)

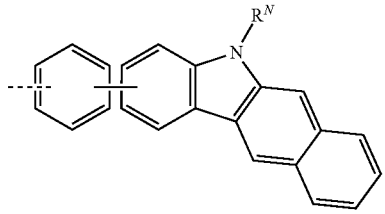
(R-21)

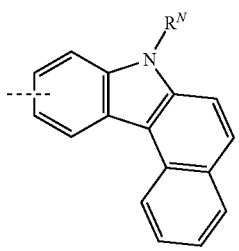
(R-22)

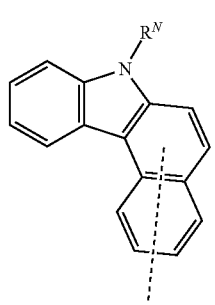
(R-23)

(R-24)
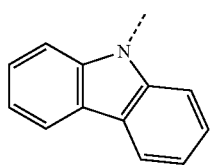
(R-25)
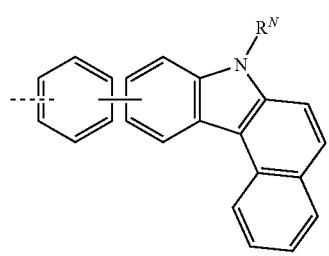
(R-26)
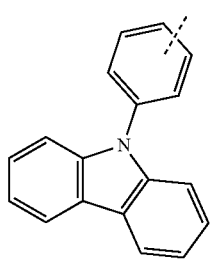
(R-27)
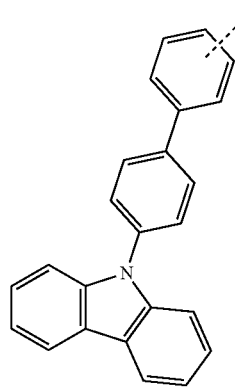
(R-28)
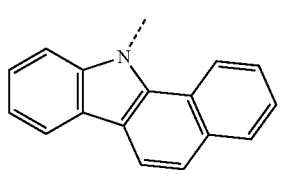
(R-29)
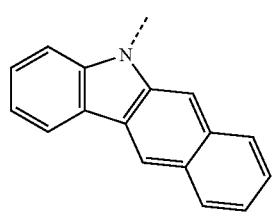
(R-30)
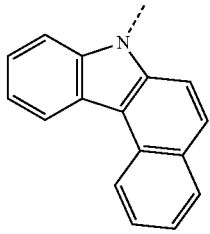
(R-31)
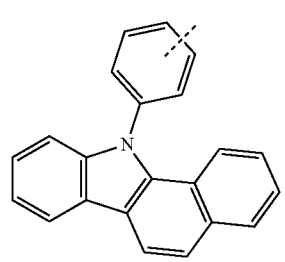
(R-32)
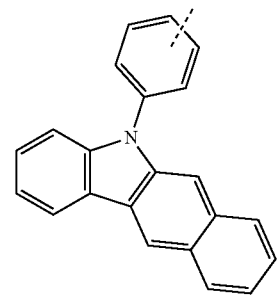
(R-33)
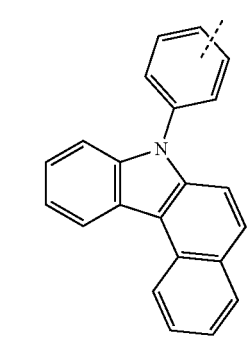
(R-34)
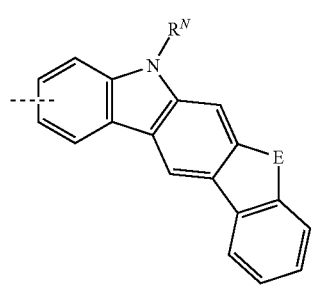
(R-35)
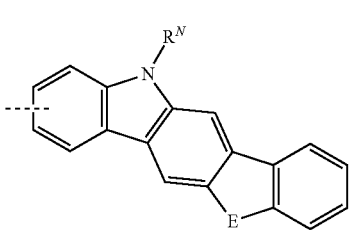

(R-36) 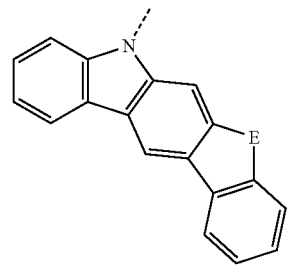
(R-37) 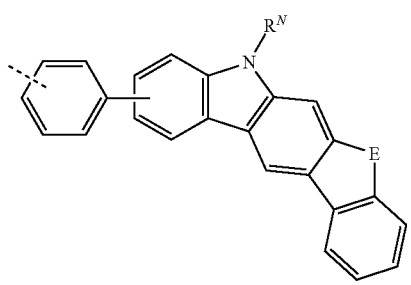
(R-38) 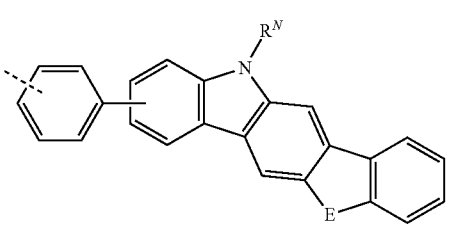
(R-39) 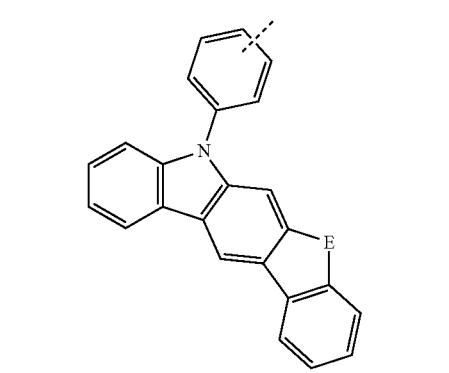
(R-40) 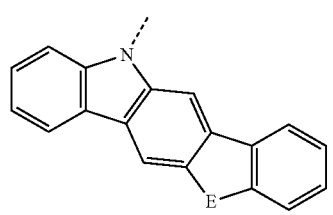
(R-41) 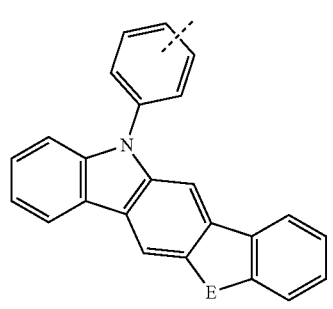
(R-42) 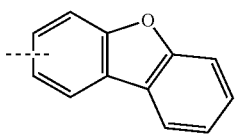
(R-43) 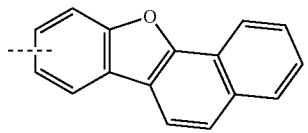
(R-44) 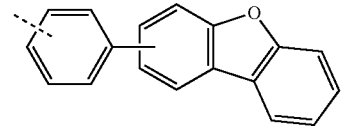
(R-45) 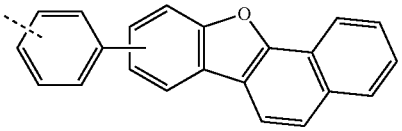
(R-46) 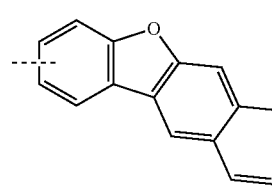
(R-47) 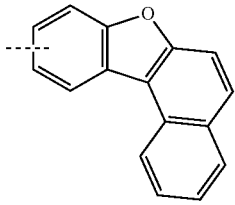
(R-48) 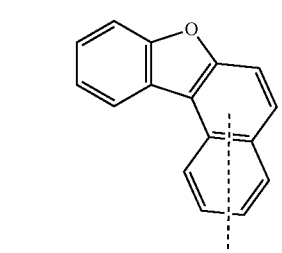
(R-49) 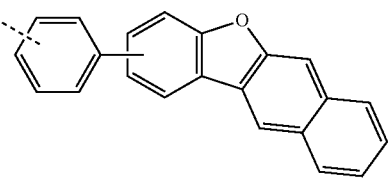
(R-50) 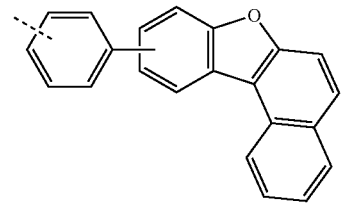

(R-51) 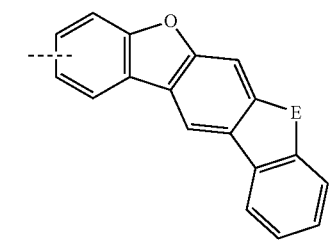
(R-52) 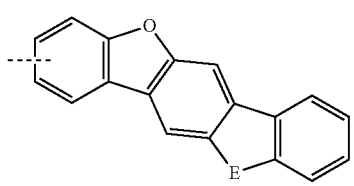
(R-53) 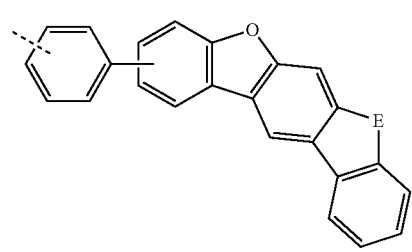
(R-54) 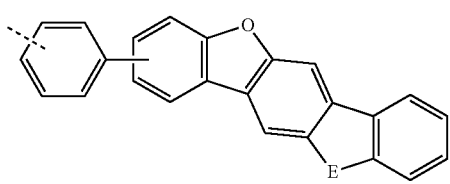
(R-55) 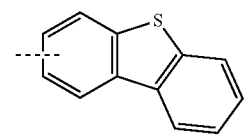
(R-56) 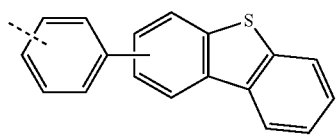
(R-57) 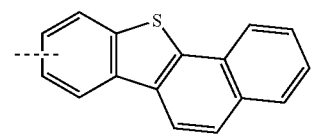
(R-58) 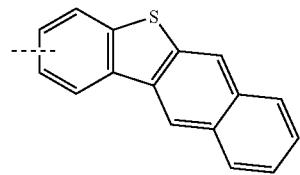
(R-59) 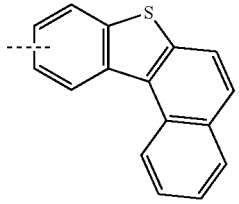
(R-60) 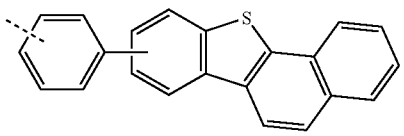
(R-61) 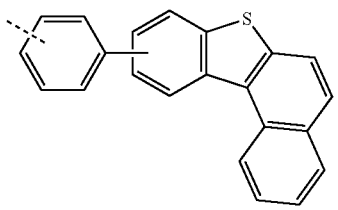
(R-62) 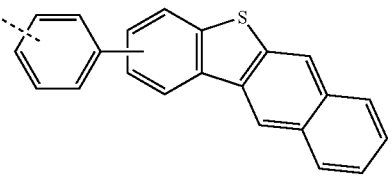
(R-63) 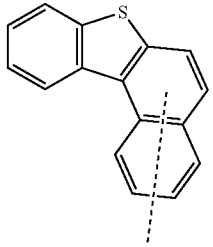
(R-64) 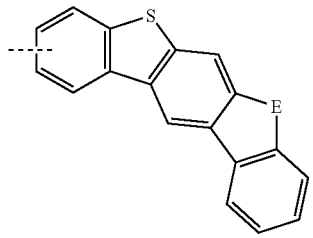
(R-65) 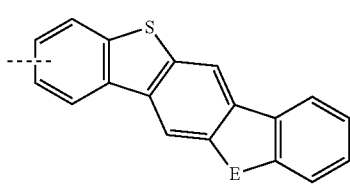

(R-66) 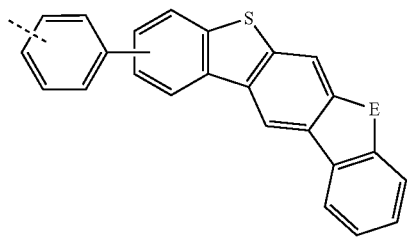
(R-67) 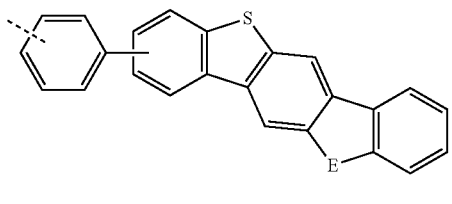
(R-68) 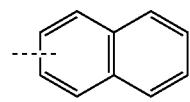
(R-69) 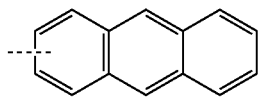
(R-70) 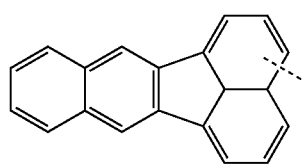
(R-71) 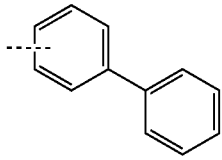
(R-72) 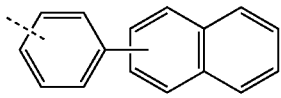
(R-73) 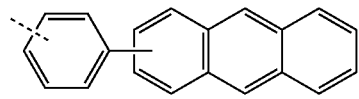
(R-74) 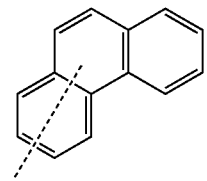
(R-75) 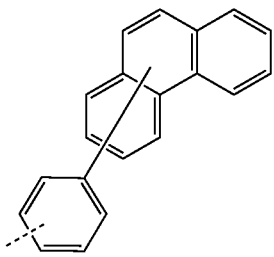
(R-76) 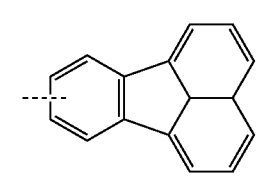
(R-77) 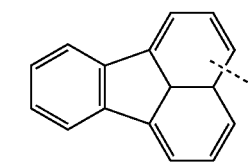
(R-78) 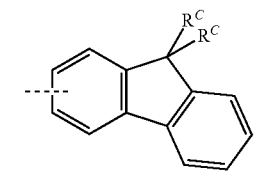
(R-79) 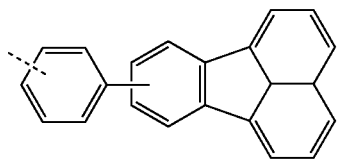
(R-80) 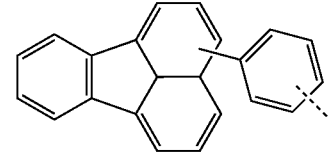
(R-81) 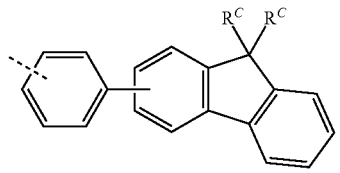
(R-82) 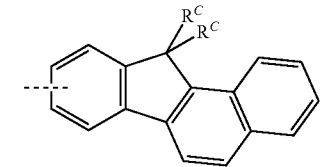

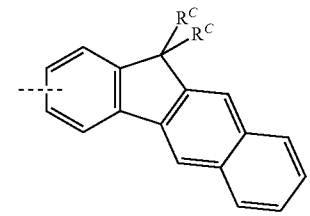
(R-83)
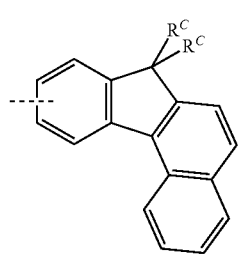
(R-84)
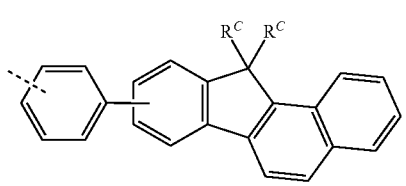
(R-85)
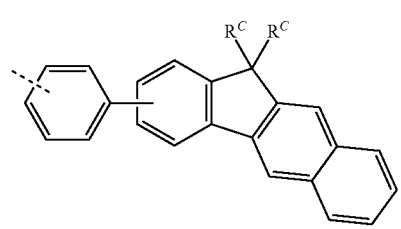
(R-86)
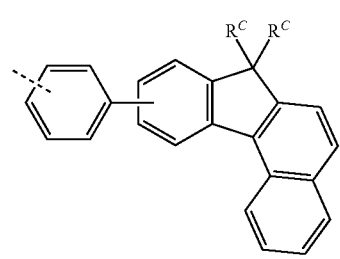
(R-87)
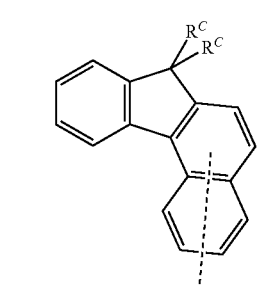
(R-88)
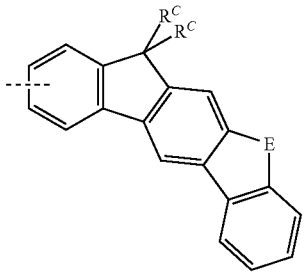
(R-89)
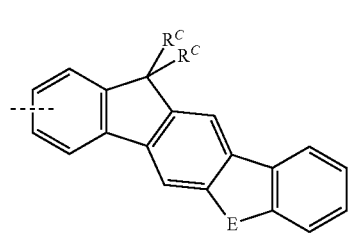
(R-90)
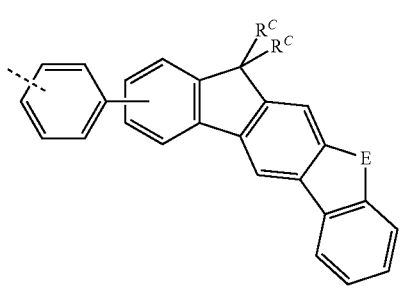
(R-91)
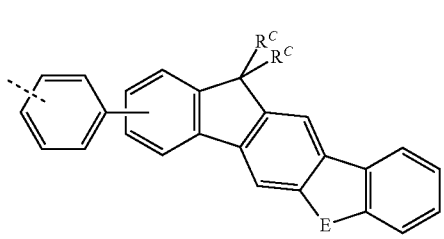
(R-92)
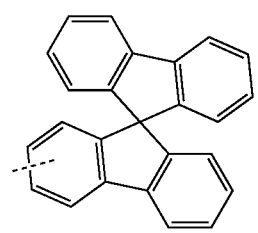
(R-93)
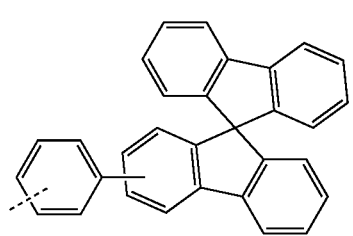
(R-94)

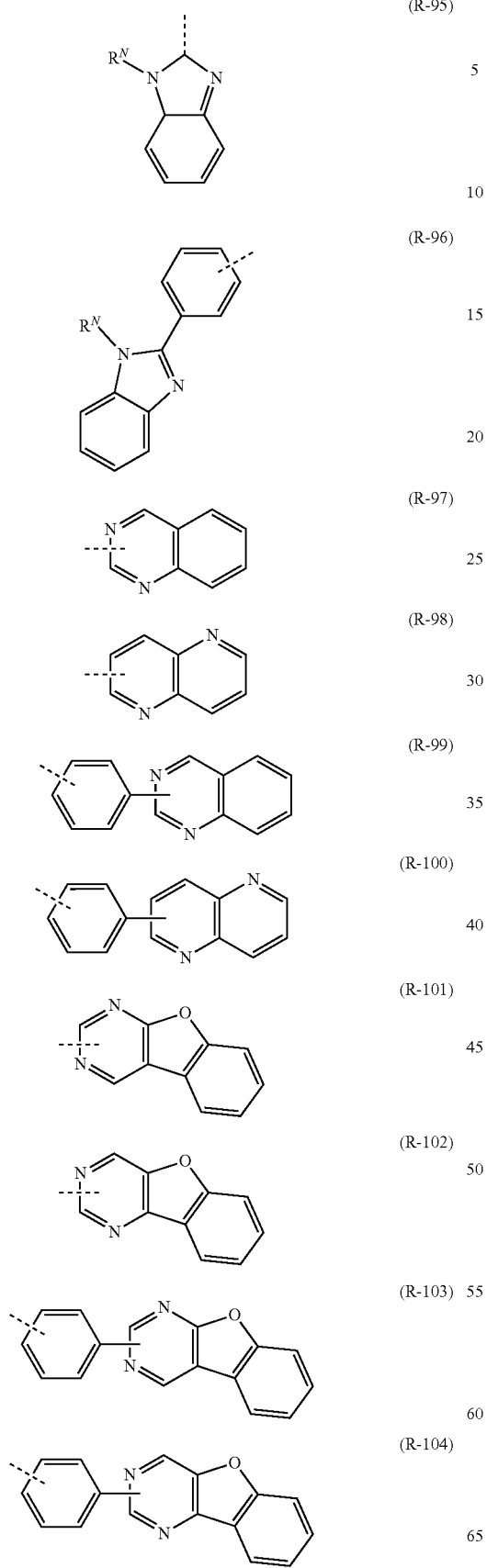
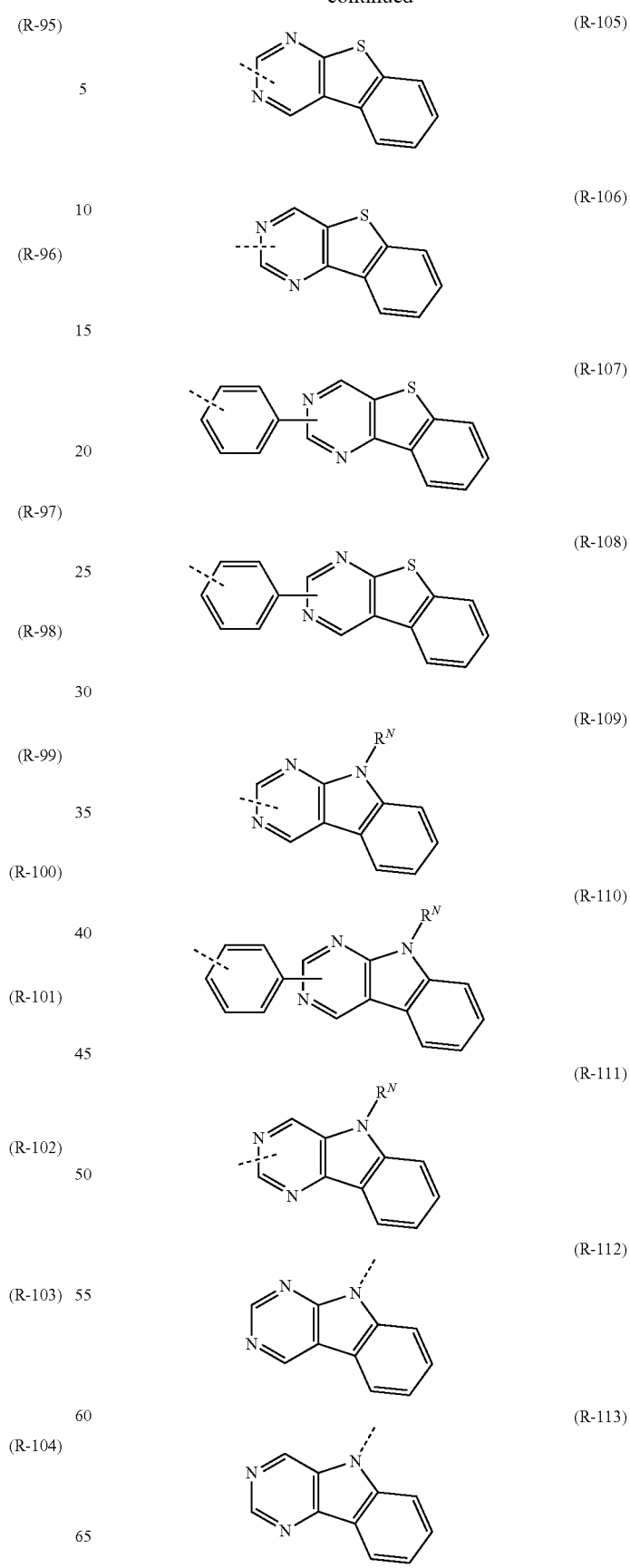

-continued
(R-114)
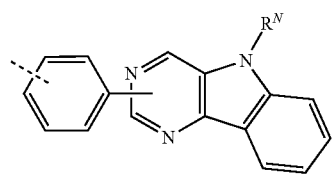
(R-115)
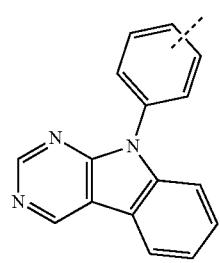
(R-116)
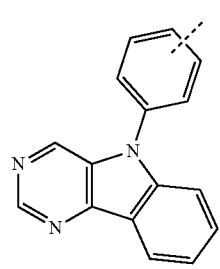
(R-117)
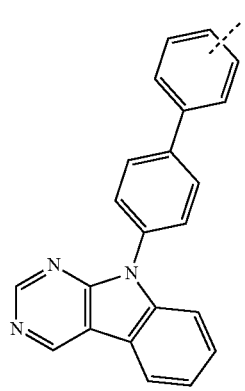
(R-118)
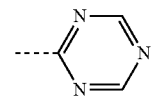
(R-119)
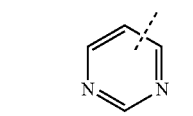
(R-120)
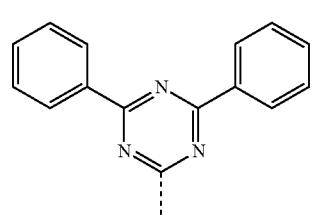
-continued
(R-121)
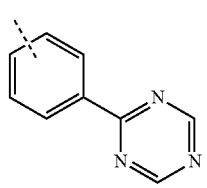
(R-122)
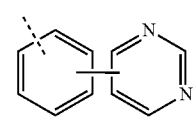
(R-123)
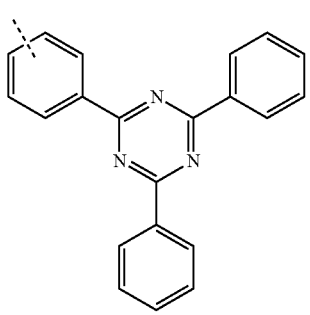
(R-124)
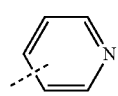
(R-125)
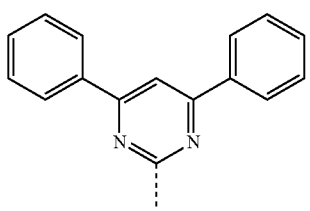
(R-126)
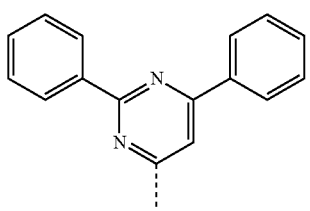
(R-127)
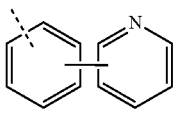
(R-128)
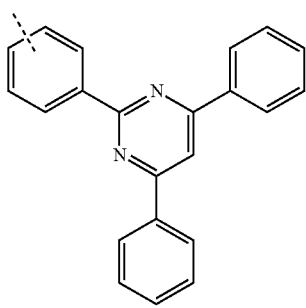

-continued

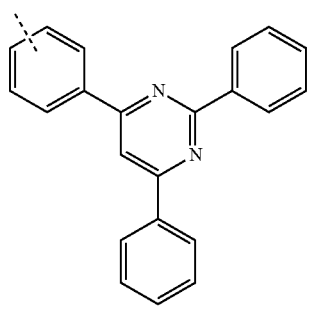
(R-129)

where
the dashed bond indicates the bonding to the group of formulae (1), (1-1) to (3-9) or (1-1a) to (3-9a);
E, $R^N$ and $R^C$ have the same meaning as above; and
the groups of formulae (R-16) to (R-129) are optionally substituted by one or more radicals $R^4$ at any free positions.

Among formulae (R-1) to (R-15), formulae (R-1), (R-2), (R-4), (R-5) and (R-8) to (R-12) are preferred.

Among formulae (R-16) to (R-129), formulae (R-16), (R-19), (R-22) to (R-33), (R-42), (R-44), (R-55), (R-56), (R-68), (R-71), (R-72), (R-76) to (R-78), (R-93), (R-94), (R-96), (R-101) to (R-108), (R-120), (R-123), (R-125), (R-126), (R-128) and (R-129) are preferred.

The group $R^C$ according to the present invention is preferably selected on each occurrence, identically or differently, from the group consisting of H, D, F, CN, $Si(R^4)_3$, a straight-chain alkyl group having 1 to 10 C atoms or a branched or cyclic alkyl group having 3 to 10 C atoms, each of which may be substituted by one or more radicals $R^4$, an aromatic or heteroaromatic group having 5 to 25 aromatic ring atoms, each of which may be substituted by one or more radicals $R^4$, where two adjacent substituents $R^C$ may optionally form a mono- or polycyclic, aliphatic ring system or aromatic ring system, each of which may be substituted by one or more radicals $R^4$. More preferably, $R^C$ is selected on each occurrence, identically or differently, from the group consisting of H, a straight-chain alkyl group having 1 to 5 C atoms or a branched or cyclic alkyl group having 3 to 5 C atoms, each of which may be substituted by one or more radicals $R^4$, an aryl or heteroaryl group having 5 to 18 aromatic ring atoms, each of which may be substituted by one or more radicals $R^4$.

The group $R^N$ according to the invention is preferably selected on each occurrence, identically or differently, from the group consisting of a straight-chain alkyl group having 1 to 10 C atoms or a branched or cyclic alkyl group having 3 to 10 C atoms, each of which may be substituted by one or more radicals $R^4$, an aromatic or heteroaromatic ring system having 5 to 25 aromatic ring atoms, each of which may be substituted by one or more radicals $R^4$. More preferably, $R^N$ is an aromatic or heteroaromatic ring system having 5 to 25 aromatic ring atoms, preferably 6 to 18 aromatic ring atoms, more preferably 6 to 13 aromatic ring atoms. The group $R^N$ is particularly preferably selected from the group consisting of phenyl, biphenyl, terphenyl, pyridine, quinoline, isoquinoline, pyridazine, benzopyridazine, pyrimidine, benzopyrimidine, benzimidazole, quinoxaline, pyrazine, 1,3,5-triazine, 1,2,4-triazine or 1,2,3-triazine, each of which may be substituted by one or more radicals $R^4$.

Examples of suitable compounds according to the invention are the structures shown in the table below:

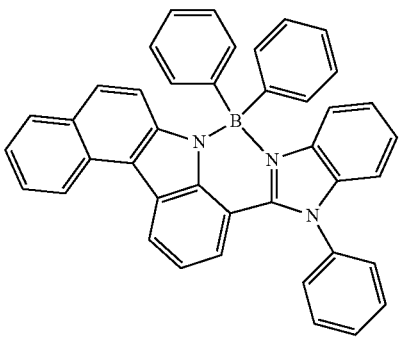

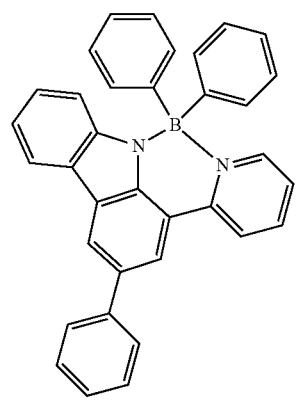

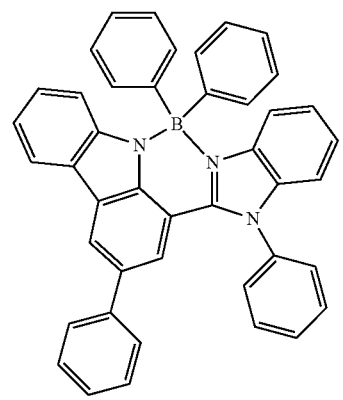

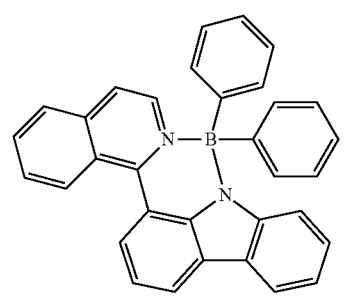

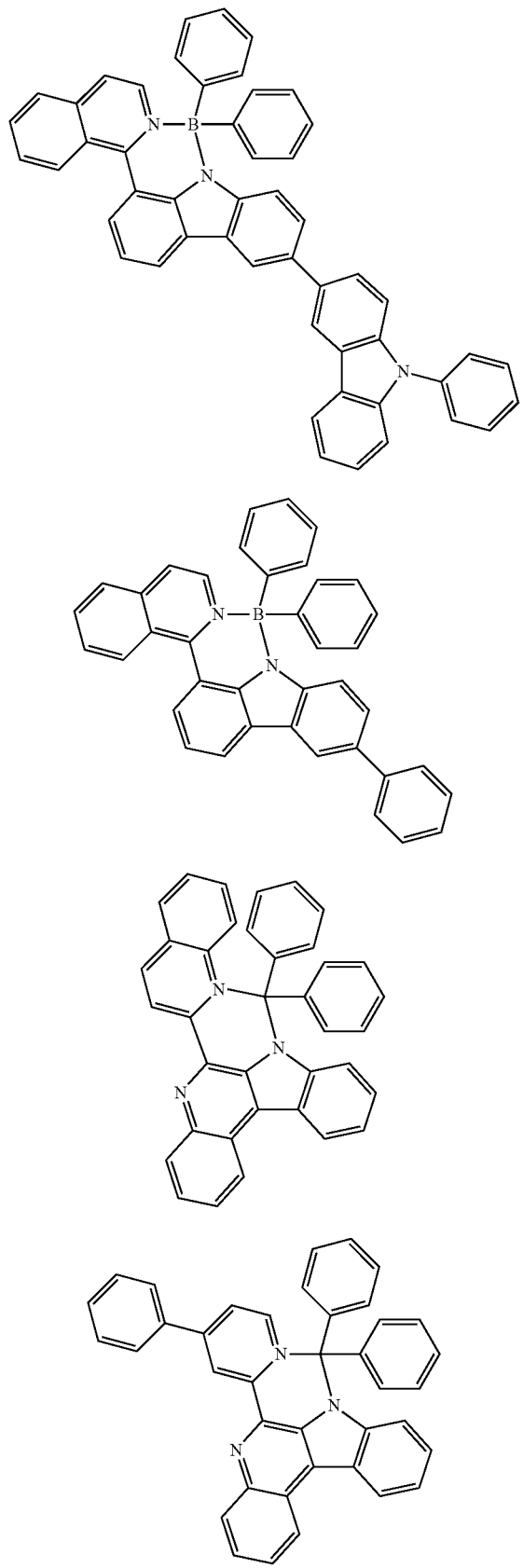
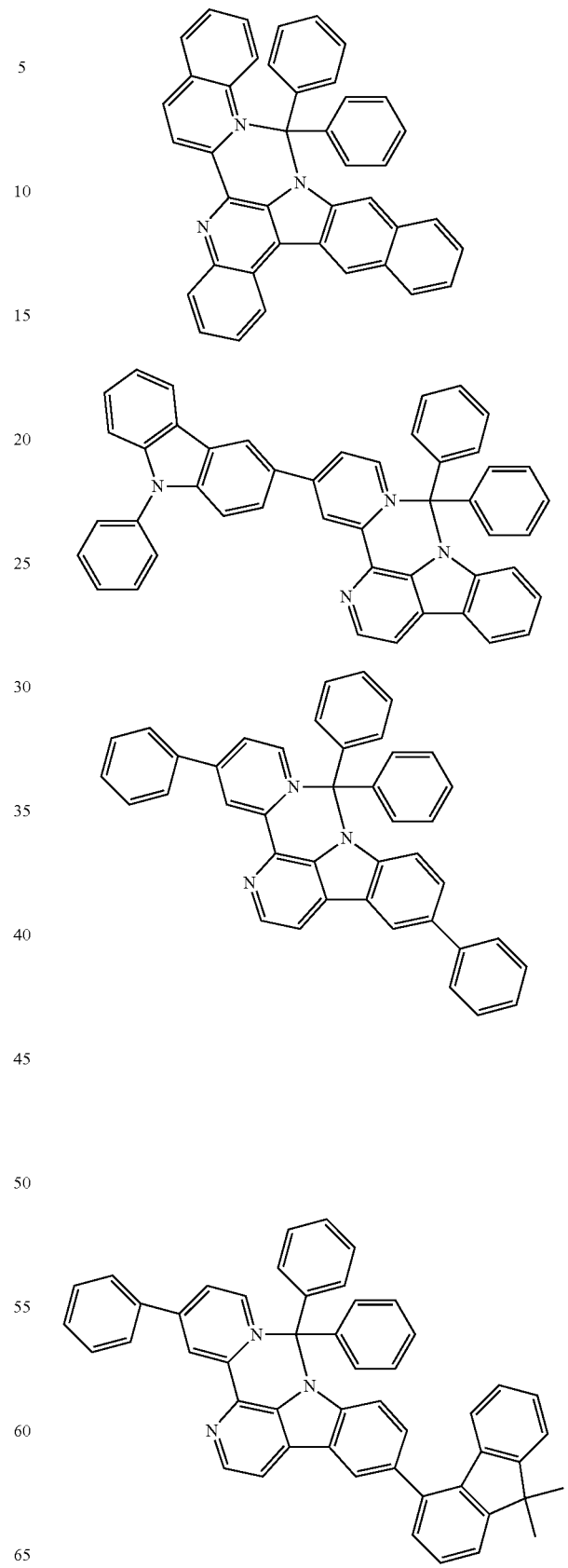

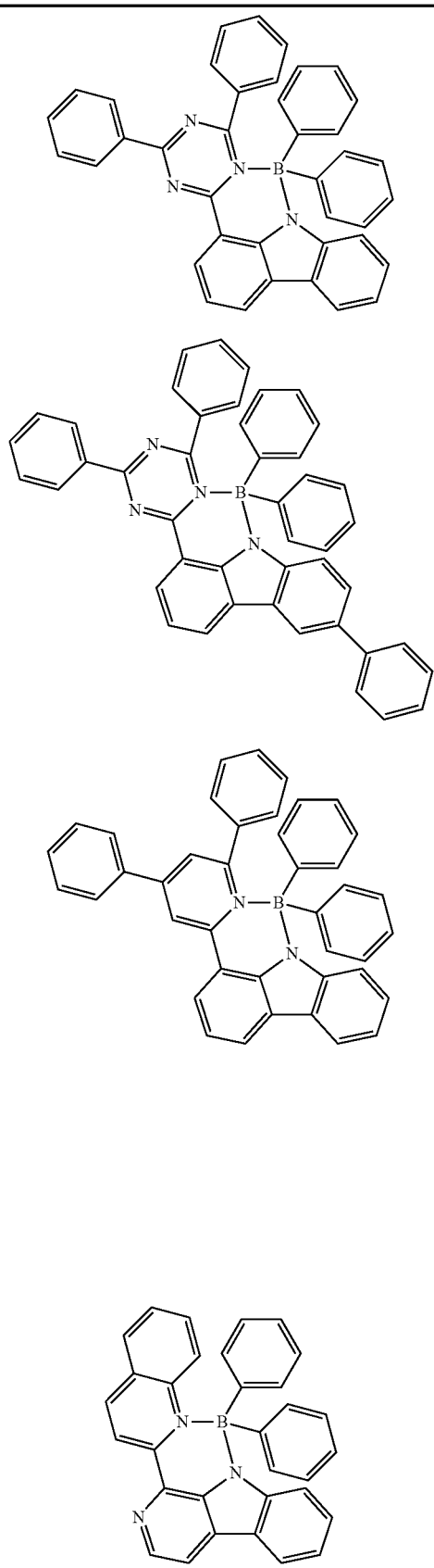
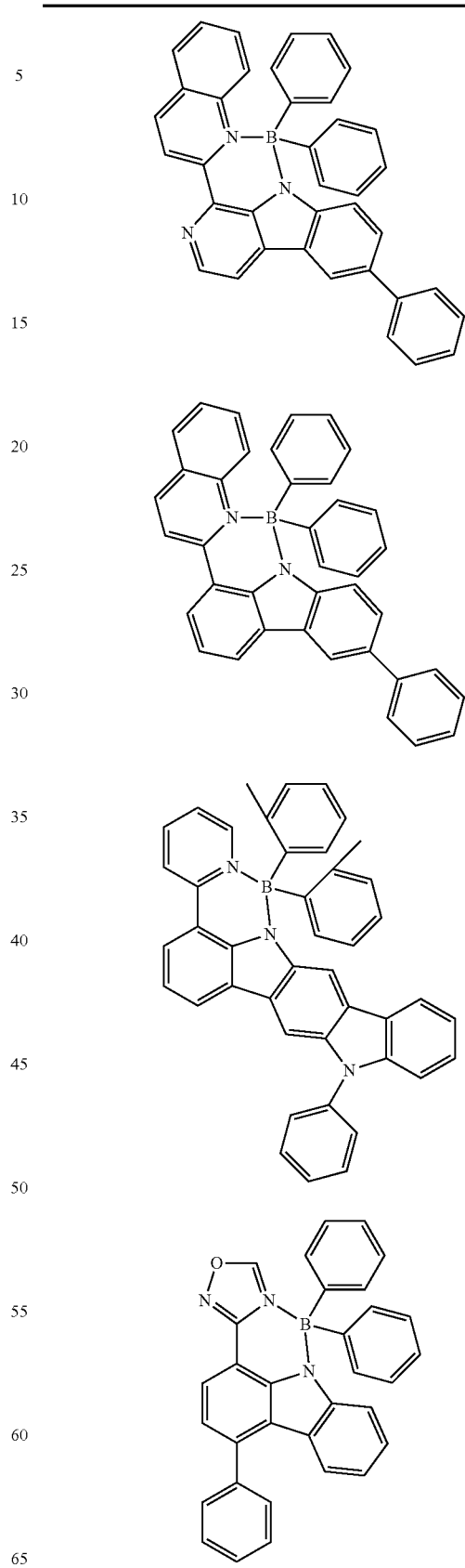

53
-continued
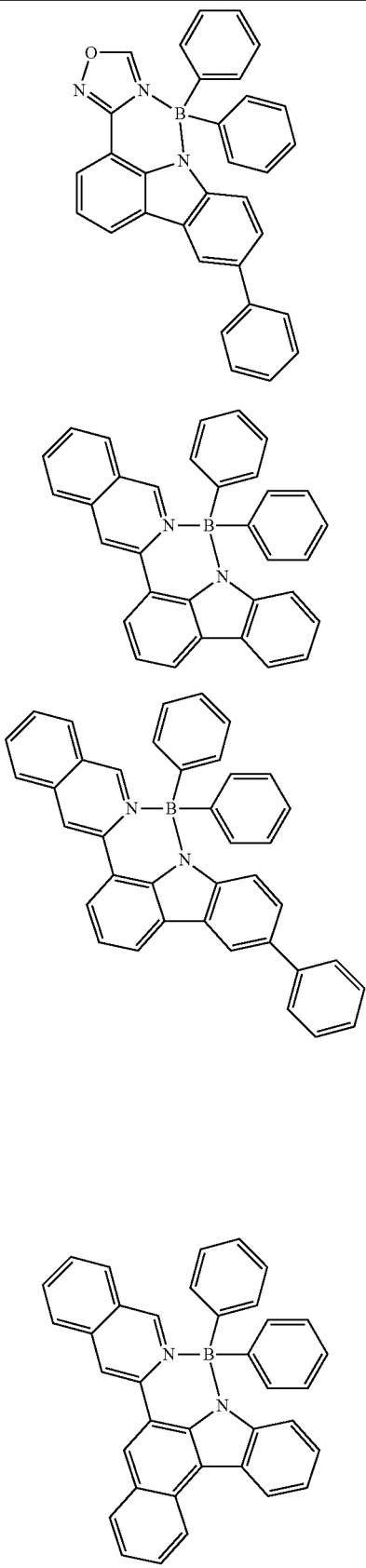
54
-continued
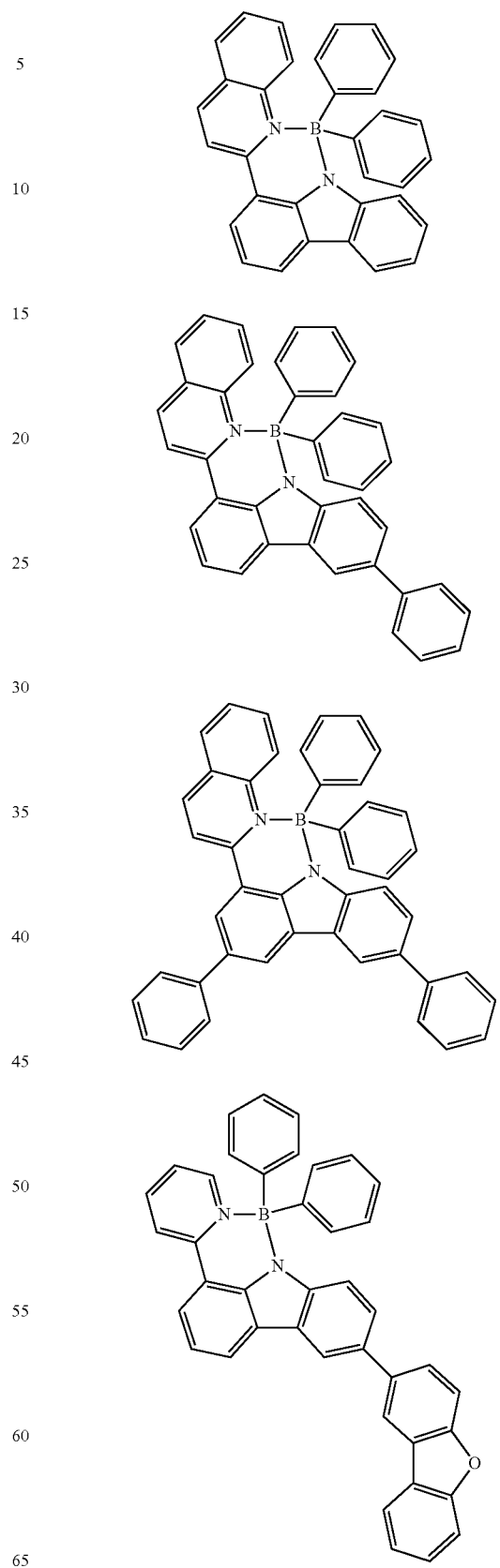

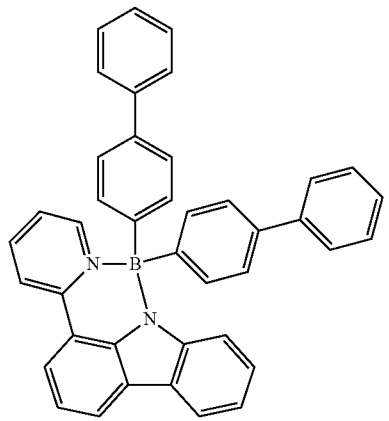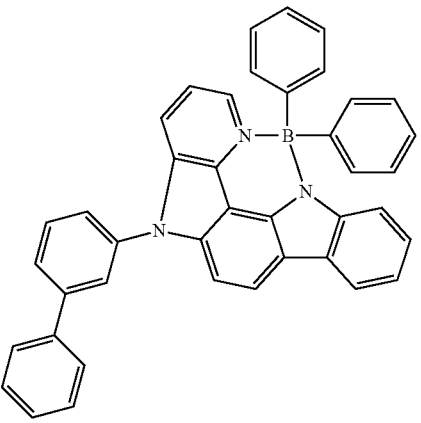

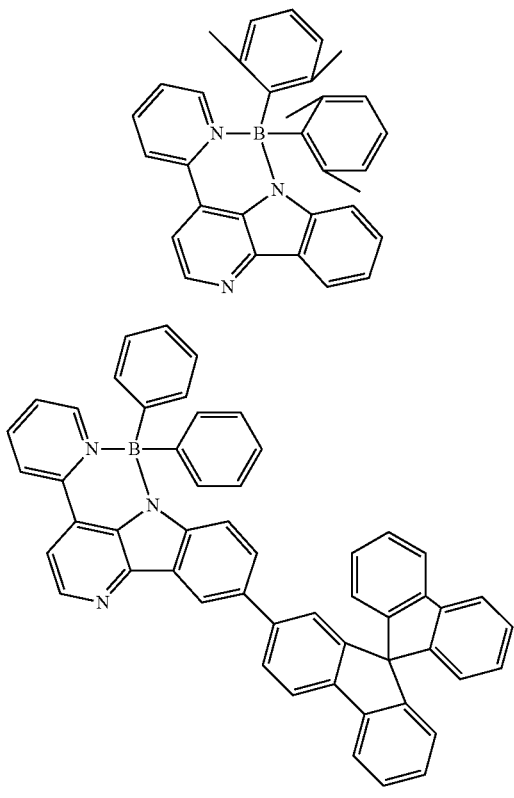
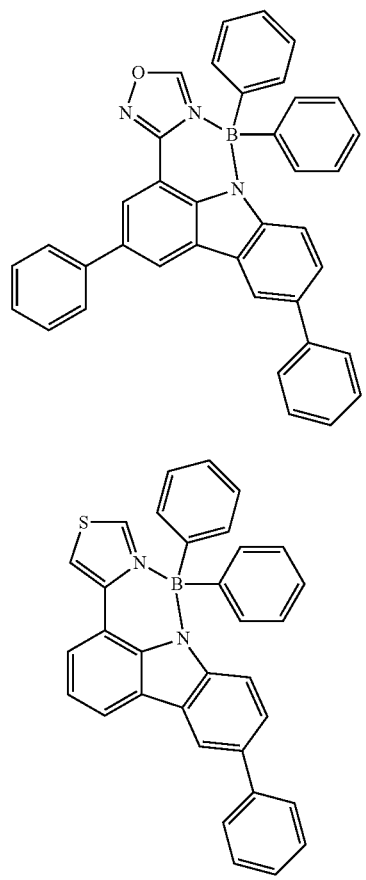
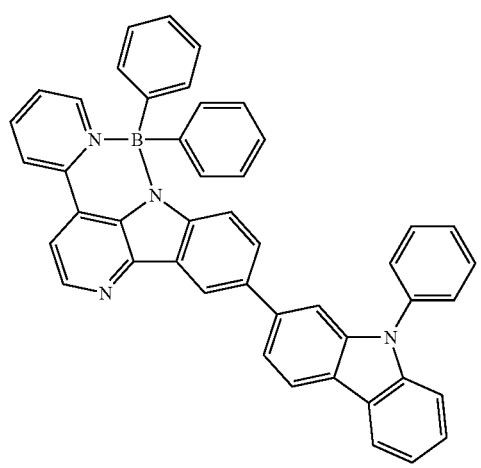
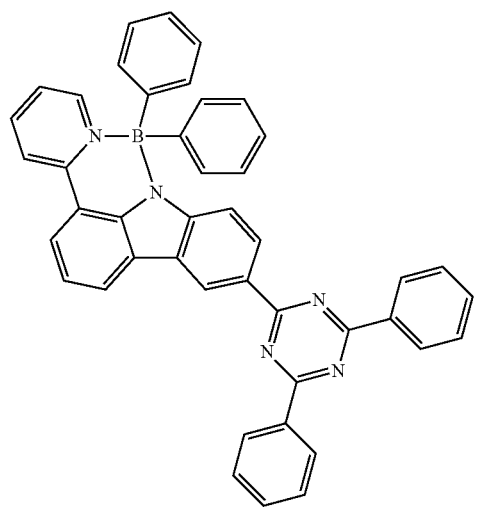

-continued
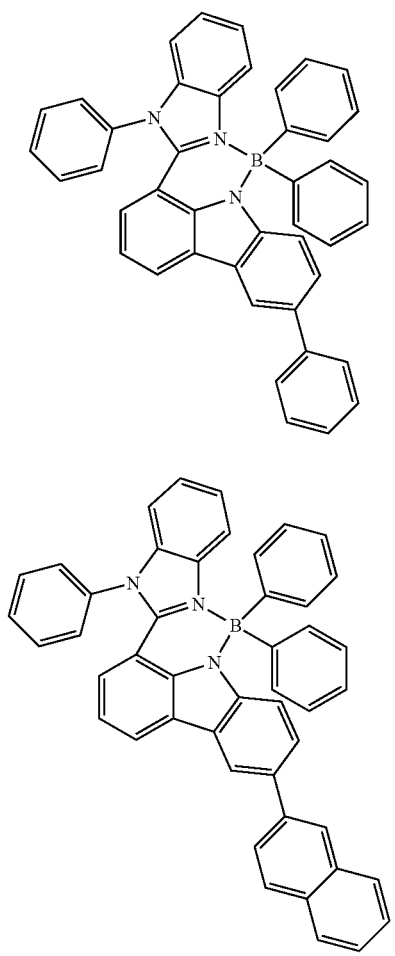
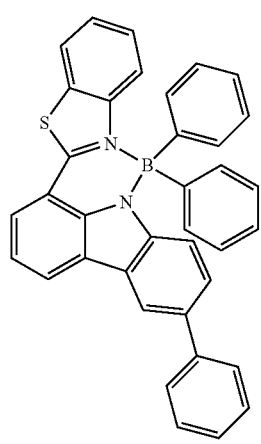
-continued
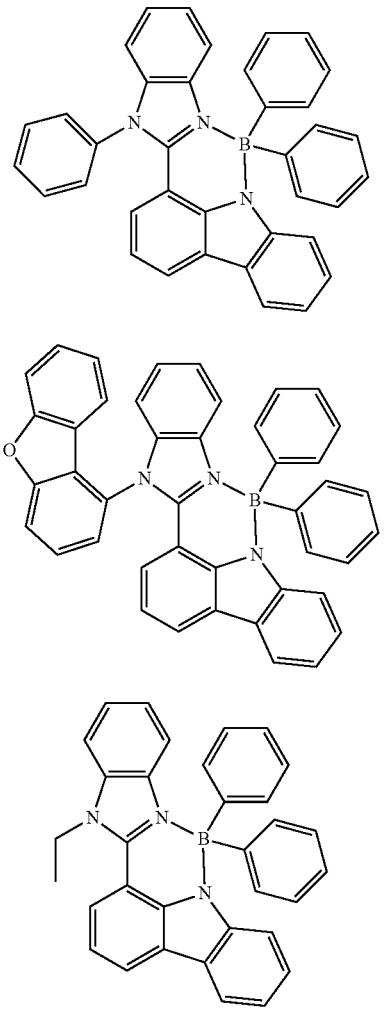
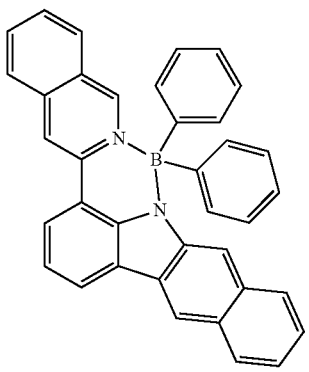

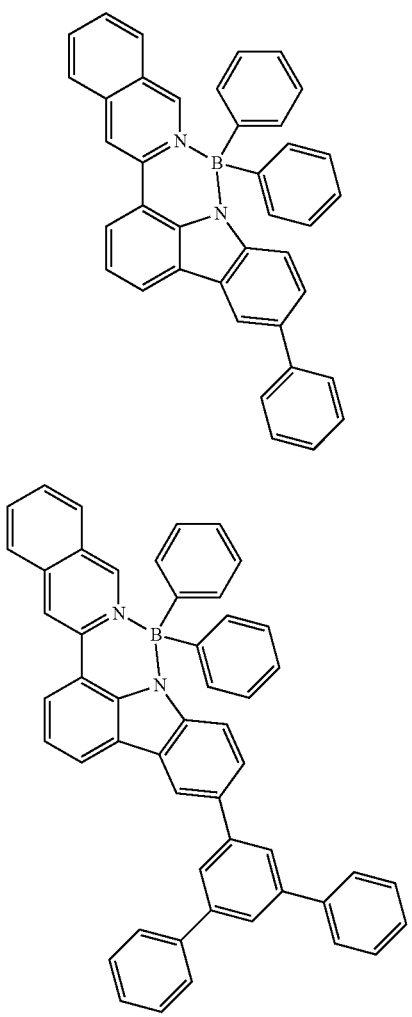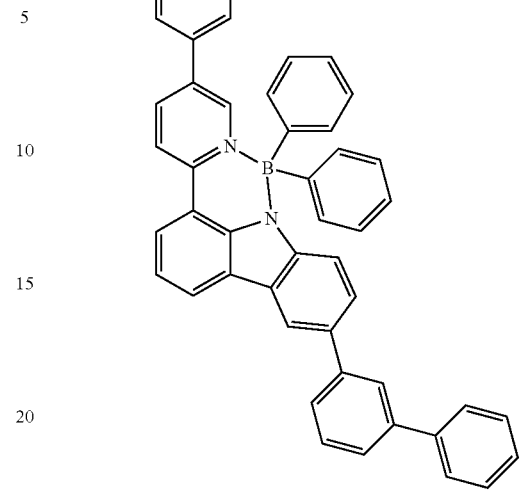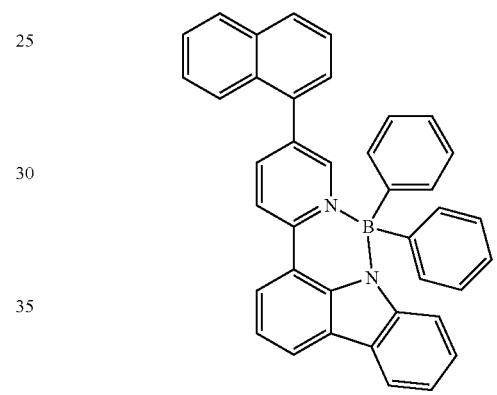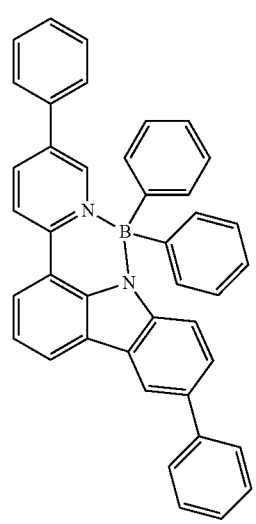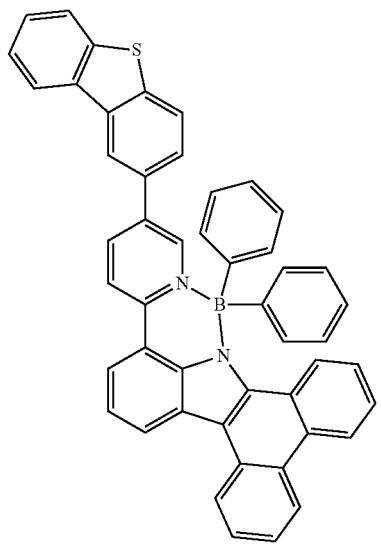

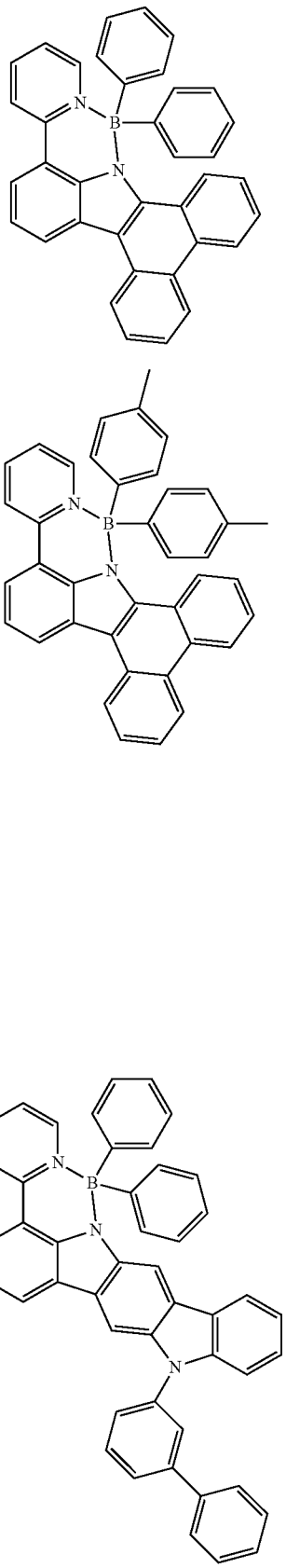
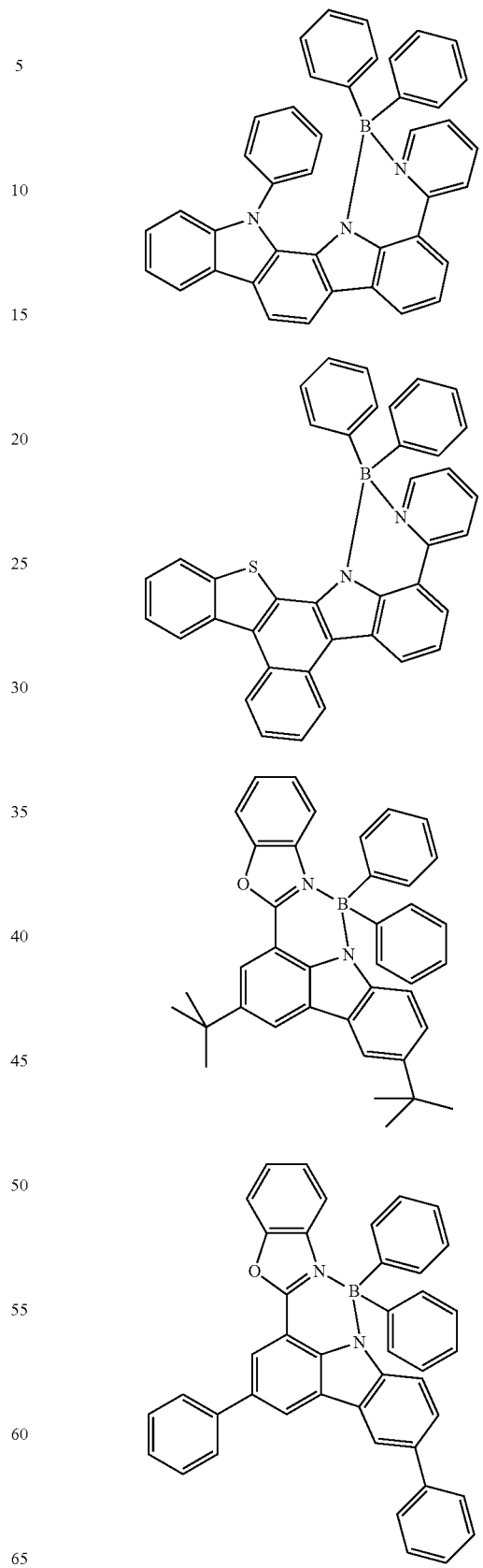

-continued
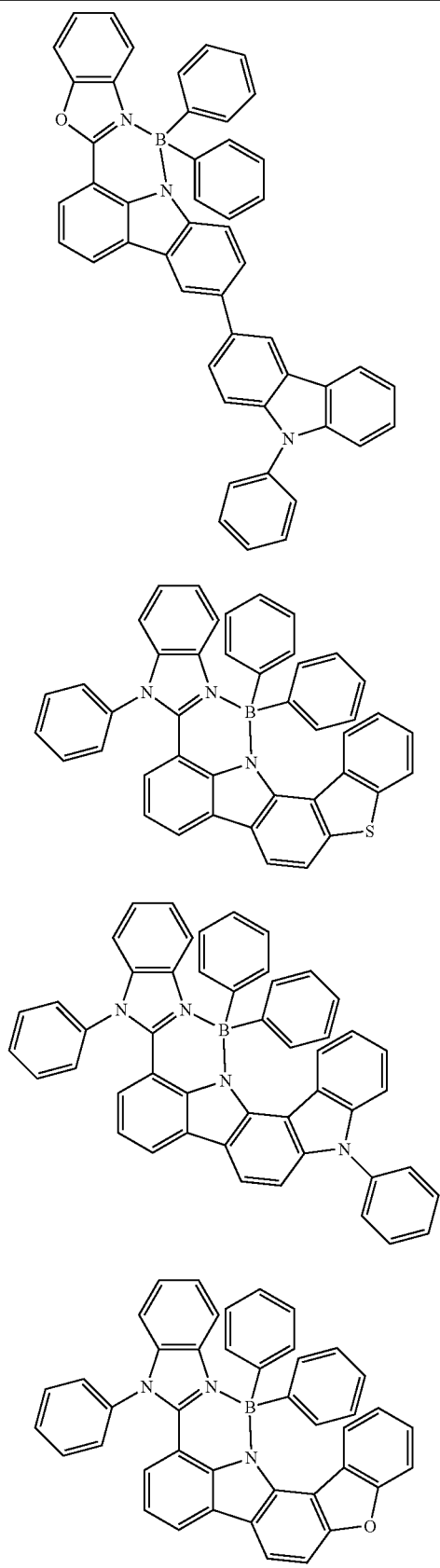
-continued
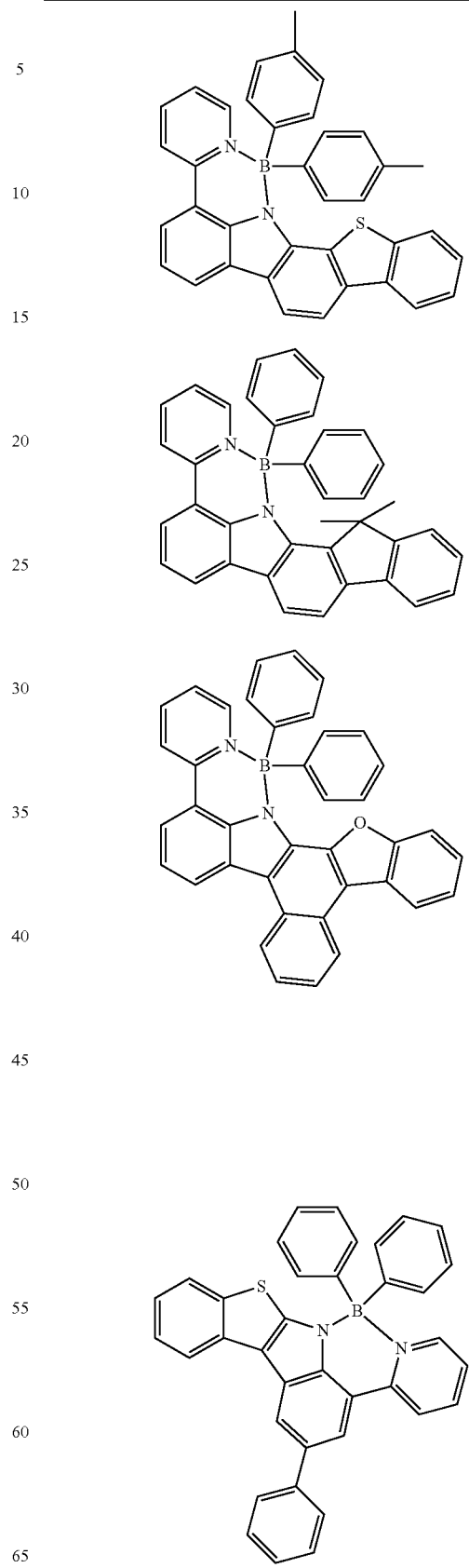

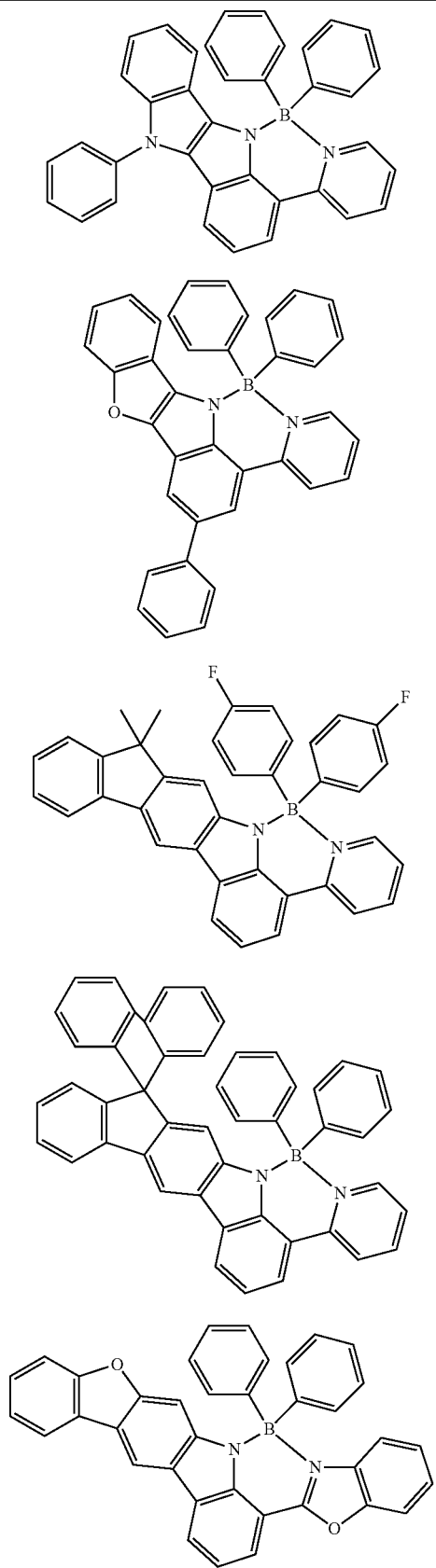
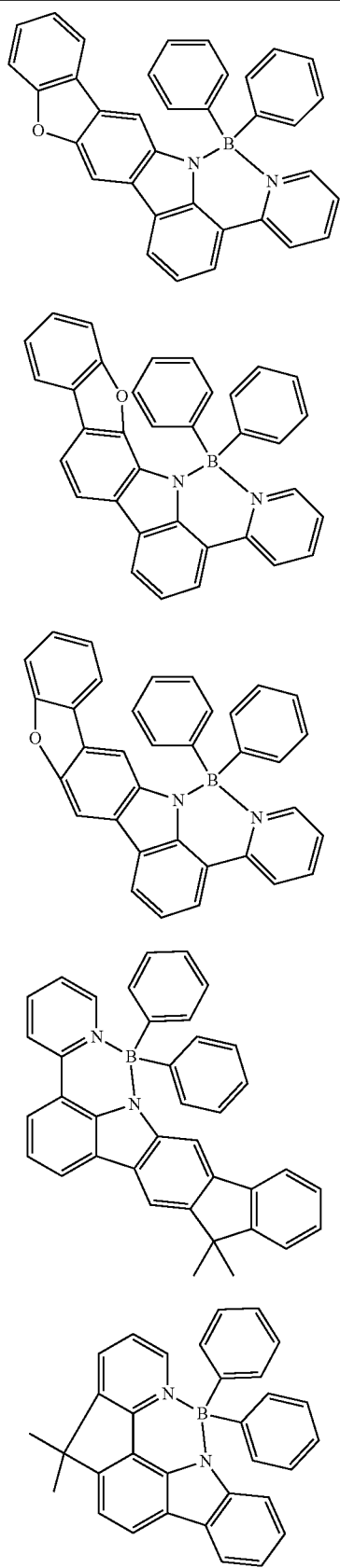

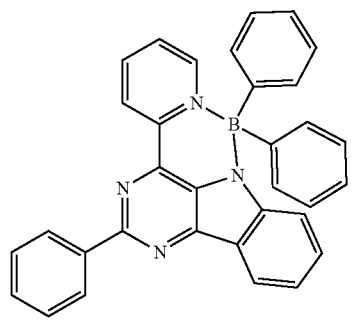
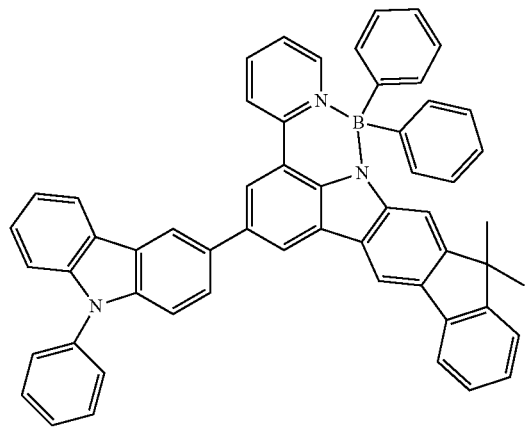
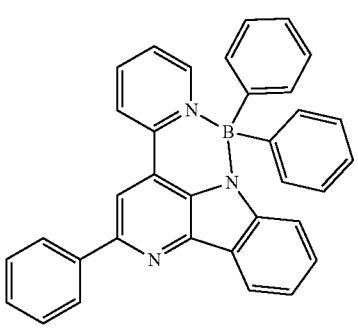
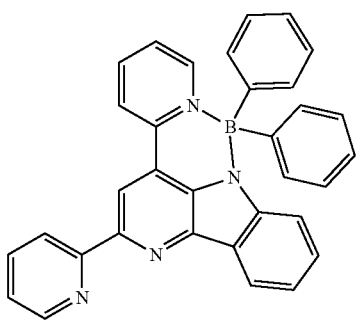
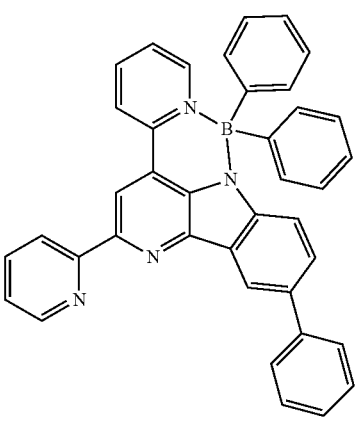
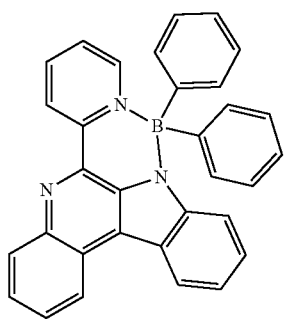
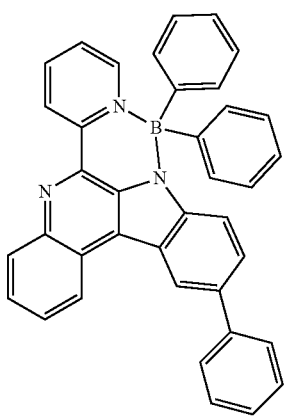
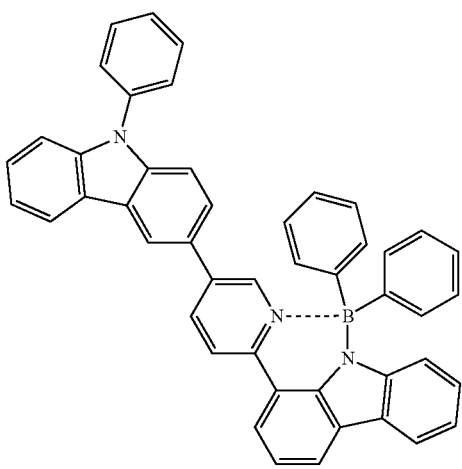

| 71 -continued | 72 -continued |
|---|---|
| 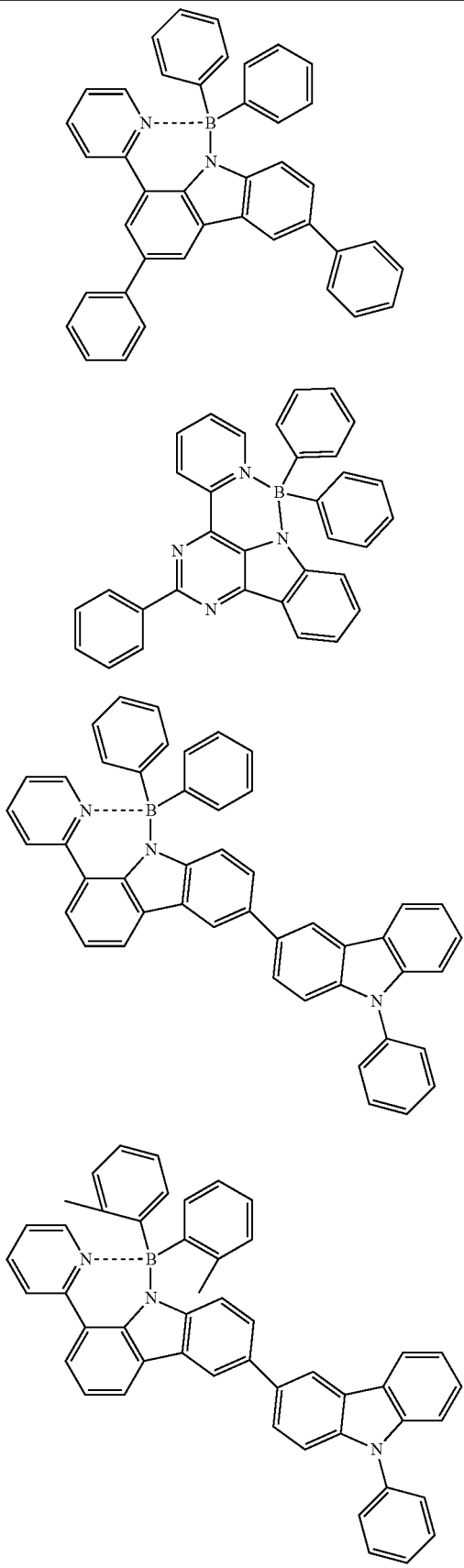 | 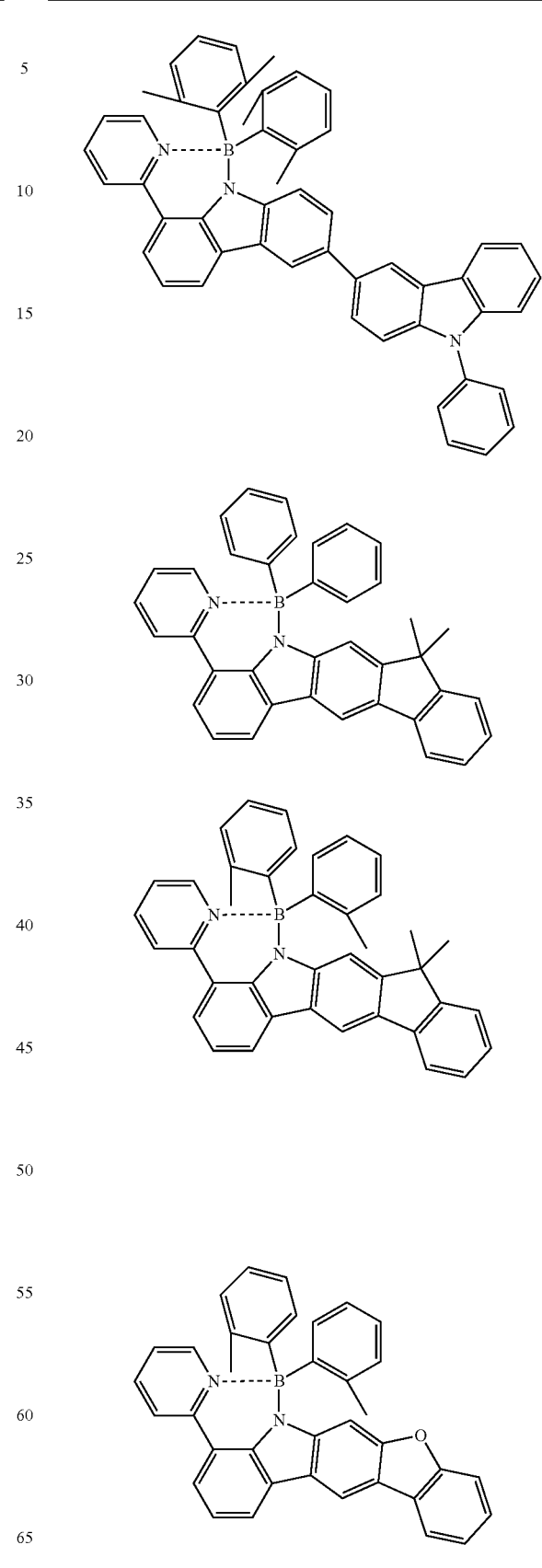 |

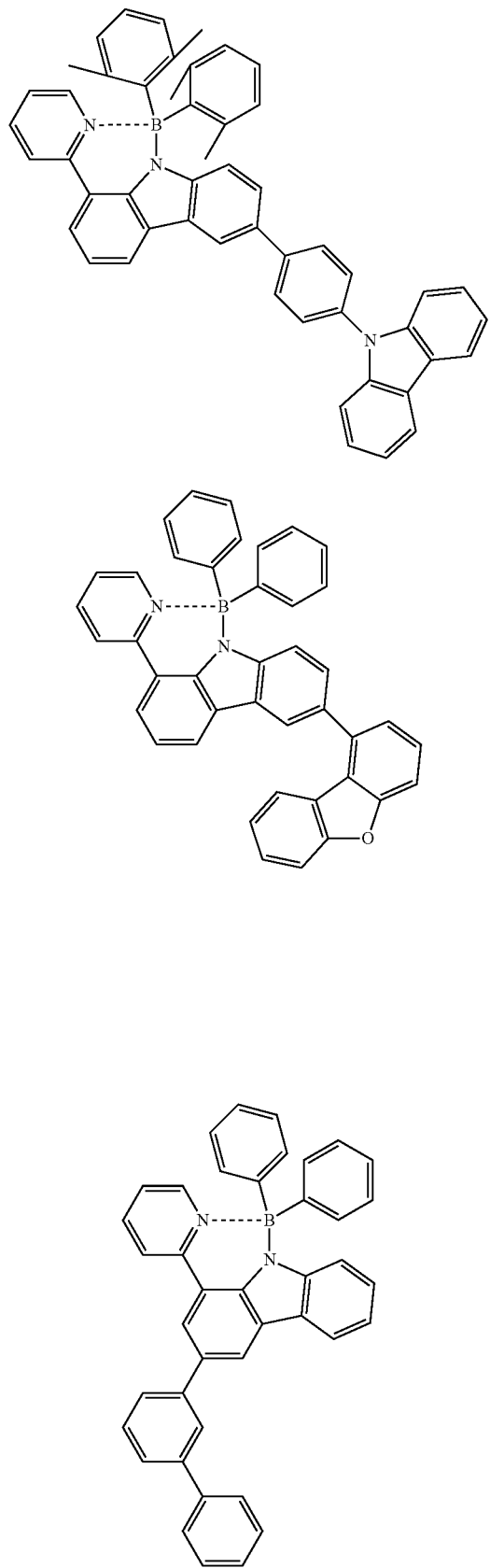
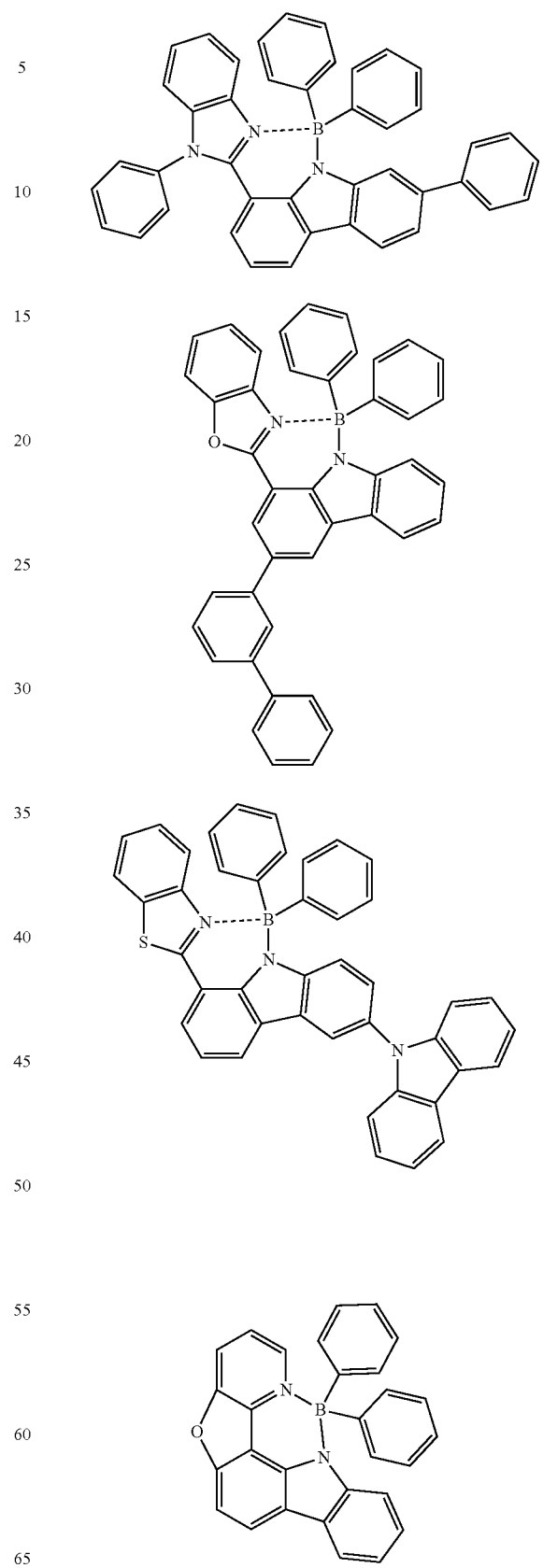

The compounds according to the invention can be prepared by synthesis steps known to the person skilled in the art, such as, for example, bromination, Suzuki coupling, Ullmann coupling, Hartwig-Buchwald coupling, etc. Suitable synthesis processes are depicted in general terms in Scheme 1 below.

Hal is a halogen or another leaving group
Ar is an aromatic or heteroaromatic group
R is H or a substituent The compounds of formula (1) may be synthesized as described above. In a first step, a heteroaromatic group $Ar^1$ comprising a nitrogen atom is bonded via a C—C coupling to a heterocycle comprising a pyrrole group (for example via a nucleophilic aromatic substitution). The obtained compound reacts then with a triarylborane compound in order to obtain the compounds of formula (1).

The present invention therefore furthermore relates to a process for the synthesis of the compounds according to the invention comprising the following steps:

a) A heteroaromatic group $Ar^1$ comprising at least one nitrogen is bonded to a heterocycle comprising a pyrrole moiety via a C—C coupling in order to obtain a compound of formula Int:

b) The compound of formula Int reacts with a triarylborane $B(Ar^B)_3$ so that a compound of formula (1) is obtained:

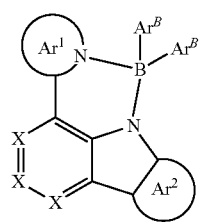

formula (1)

where the symbols Ar$^1$, Ar$^2$, Ar$^B$ and X have the same meaning as above.

Scheme 2 represents an alternative process for the synthesis of the compounds according to the invention.

2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol-monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The present invention therefore furthermore relates to a formulation comprising a compound according to the inven- Scheme 2

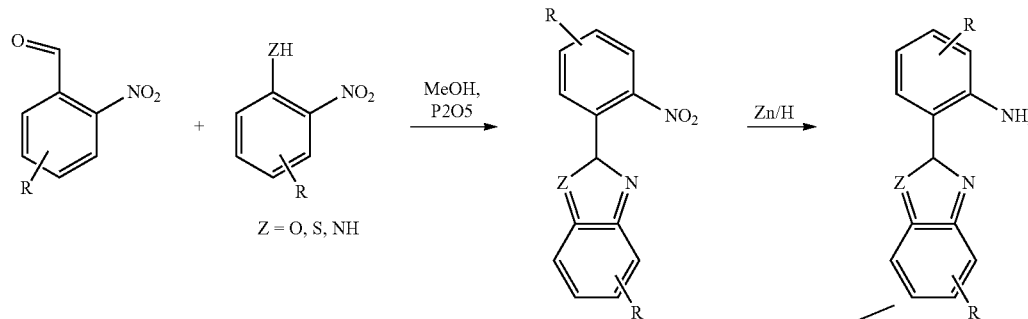

J. Org. Chem. 2016, 81, 3296-3302

WO 2010136109

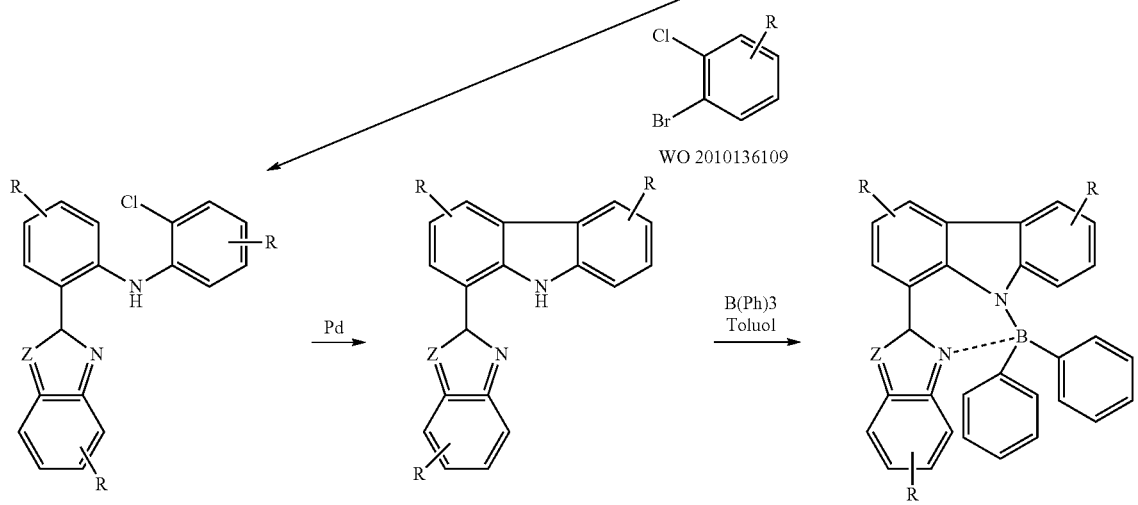

For the processing of the compounds according to the invention from the liquid phase, for example by spin coating or by printing processes, formulations of the compounds according to the invention are necessary. These formulations can be, for example, solutions, dispersions or emulsions. It may be preferred to use mixtures of two or more solvents for this purpose. Suitable and preferred solvents are, for example, toluene, anisole, o-, m- or p-xylene, methyl benzoate, mesitylene, tetralin, veratrol, THF, methyl-THF, THP, chlorobenzene, dioxane, phenoxytoluene, in particular 3-phenoxytoluene, (−)-fenchone, 1,2,3,5-tetramethylbenzene, 1,2,4,5-tetramethylbenzene, 1-methylnaphthalene, tion and at least one further compound. The further compound may be, for example, a solvent, in particular one of the above-mentioned solvents or a mixture of these solvents. However, the further compound may also be at least one further organic or inorganic compound which is likewise employed in the electronic device, for example an emitting compound, in particular a phosphorescent dopant, and/or a further matrix material. Suitable emitting compounds and further matrix materials are indicated below in connection with the organic electroluminescent device. This further compound may also be polymeric.

The compounds and mixtures according to the invention are suitable for use in an electronic device. An electronic device here is taken to mean a device which comprises at least one layer which comprises at least one organic compound. However, the component here may also comprise inorganic materials or also layers built up entirely from inorganic materials.

The present invention therefore furthermore relates to the use of the compounds or mixtures according to the invention in an electronic device, in particular in an organic electroluminescent device.

The present invention again furthermore relates to an electronic device comprising at least one of the compounds or mixtures according to the invention mentioned above. The preferences stated above for the compound also apply to the electronic devices.

The electronic device is preferably selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic dye-sensitised solar cells, organic optical detectors, organic photoreceptors, organic field-quench devices (O-FQDs), light-emitting electrochemical cells (LECs), organic laser diodes (O-lasers) and "organic plasmon emitting devices" (D. M. Koller et al., Nature Photonics 2008, 1-4), preferably organic electroluminescent devices (OLEDs, PLEDs), in particular phosphorescent OLEDs.

The organic electroluminescent device comprises a cathode, an anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers and/or charge-generation layers. It is likewise possible for interlayers, which have, for example, an exciton-blocking function, to be introduced between two emitting layers. However, it should be pointed out that each of these layers does not necessarily have to be present. The organic electroluminescent device here may comprise one emitting layer or a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to systems having three emitting layers, where the three layers exhibit blue, green and orange or red emission (for the basic structure see, for example, WO 2005/011013). These can be fluorescent or phosphorescent emission layers or hybrid systems, in which fluorescent and phosphorescent emission layers are combined with one another.

The compound according to the invention in accordance with the embodiments indicated above can be employed in various layers, depending on the precise structure. Preference is given to an organic electroluminescent device comprising a compound of the formula (1) or in accordance with the preferred embodiments as matrix material for fluorescent emitters, phosphorescent emitters or emitters showing TADF (Thermally Activated Delayed Fluorescence), in particular for phosphorescent emitters, and/or in an electron-transport layer and/or in an electron-blocking or exciton-blocking layer and/or in a hole-transport layer, depending on the precise substitution. The preferred embodiments indicated above also apply to the use of the materials in organic electronic devices.

In a preferred embodiment of the invention, the compound of the formula (1) or in accordance with the preferred embodiments is employed as matrix material for a fluorescent or phosphorescent compound, in particular for a phosphorescent compound, in an emitting layer. The organic electroluminescent device here may comprise one emitting layer or a plurality of emitting layers, where at least one emitting layer comprises at least one compound according to the invention as matrix material.

If the compound of the formula (1) or in accordance with the preferred embodiments is employed as matrix material for an emitting compound in an emitting layer, it is preferably employed in combination with one or more phosphorescent materials (triplet emitters). Phosphorescence in the sense of this invention is taken to mean the luminescence from an excited state having spin multiplicity >1, in particular from an excited triplet state. For the purposes of this application, all luminescent transition-metal complexes and luminescent lanthanide complexes, in particular all iridium, platinum and copper complexes, are to be regarded as phosphorescent compounds.

Preferably, when the compounds of the formula (1) or in accordance with the preferred embodiments are employed as matrix materials for an emitting compound in an emitting layer, they are preferably employed in combination with one or more phosphorescent material (triplet emitters), where the phosphorescent material has an emission wavelength comprised between 550 nm to 680 nm, which corresponds to the red emission field.

The mixture comprising the compound of the formula (1) or in accordance with the preferred embodiments and the emitting compound comprises between 99 and 1% by vol., preferably between 98 and 10% by vol., particularly preferably between 97 and 60% by vol., in particular between 95 and 80% by vol., of the compound of the formula (1) or in accordance with the preferred embodiments, based on the entire mixture comprising emitter and matrix material. Correspondingly, the mixture comprises between 1 and 99% by vol., preferably between 2 and 90% by vol., particularly preferably between 3 and 40% by vol., in particular between 5 and 20% by vol., of the emitter, based on the entire mixture comprising emitter and matrix material.

A further preferred embodiment of the present invention is the use of the compound of the formula (1) or in accordance with the preferred embodiments as matrix material for a phosphorescent emitter in combination with a further matrix material. Particularly suitable matrix materials which can be employed in combination with the compounds of the formula (1) or in accordance with the preferred embodiments are aromatic ketones, aromatic phosphine oxides or aromatic sulfoxides or sulfones, for example in accordance with WO 2004/013080, WO 2004/093207, WO 2006/005627 or WO 2010/006680, triarylamines, carbazole derivatives, for example CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example in accordance with WO 2007/063754 or WO 2008/056746, indenocarbazole derivatives, for example in accordance with WO 2010/136109 and WO 2011/000455, azacarbazole derivatives, for example in accordance with EP 1617710, EP 1617711, EP 1731584, JP 2005/347160, bipolar matrix materials, for example in accordance with WO 2007/137725, silanes, for example in accordance with WO 005/111172, azaboroles or boronic esters, for example in accordance with WO 2006/117052, triazine derivatives, for example in accordance with WO 2010/015306, WO 2007/063754 or WO 2008/056746, zinc complexes, for example in accordance with EP 652273 or WO 2009/062578, diazasilole or tetraazasilole derivatives, for example in accordance with WO 2010/054729, diazaphosphole derivatives, for example in accordance with WO 2010/054730, bridged carbazole derivatives, for example in accordance with US 2009/0136779, WO 2010/050778, WO 2011/042107, WO 2011/088877 or in accordance with EP 11003232.3, triphenylene derivatives, for example in accordance with WO 2012/048781, or lactams, for example in accordance with WO 2011/116865 or WO 2011/137951. A further phosphorescent emitter which emits at shorter wavelength than the actual emitter may likewise be present in the mixture as co-host.

Preferred co-host materials are triarylamine derivatives, in particular monoamines, lactams, carbazole derivatives and indenocarbazole derivatives.

Suitable phosphorescent compounds (=triplet emitters) are, in particular, compounds which emit light, preferably in the visible region, on suitable excitation and in addition contain at least one atom having an atomic number greater than 20, preferably greater than 38 and less than 84, particularly preferably greater than 56 and less than 80, in particular a metal having this atomic number. The phosphorescent emitters used are preferably compounds which contain copper, molybdenum, tungsten, rhenium, ruthenium, osmium, rhodium, iridium, palladium, platinum, silver, gold or europium, in particular compounds which contain iridium or platinum. For the purposes of the present invention, all luminescent compounds which contain the above-mentioned metals are regarded as phosphorescent compounds.

Examples of the emitters described above are revealed by the applications WO 00/70655, WO 2001/41512, WO 2002/02714, WO 2002/15645, EP 1191613, EP 1191612, EP 1191614, WO 05/033244, WO 05/019373, US 2005/0258742, WO 2009/146770, WO 2010/015307, WO 2010/031485, WO 2010/054731, WO 2010/054728, WO 2010/086089, WO 2010/099852, WO 2010/102709, WO 2011/032626, WO 2011/066898, WO 2011/157339, WO 2012/007086, WO 2014/008982, WO 2014/023377, WO 2014/094962, WO 2014/094961, WO 2014/094960 or WO 2016/124304. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without inventive step.

Suitable phosphorescent materials (=triplet emitters) that can be advantageously combined with the compounds of formula (1) are, as mentioned above, compounds which emit a red light on suitable excitation, which means phosphorescent materials having an excited triplet state level (T1) comprised between 550 and 680 nm.

In a further embodiment of the invention, the organic electroluminescent device according to the invention does not comprise a separate hole-injection layer and/or hole-transport layer and/or hole-blocking layer and/or electron-transport layer, i.e. the emitting layer is directly adjacent to the hole-injection layer or the anode, and/or the emitting layer is directly adjacent to the electron-transport layer or the electron-injection layer or the cathode, as described, for example, in WO 2005/053051. It is furthermore possible to use a metal complex which is identical or similar to the metal complex in the emitting layer as hole-transport or hole-injection material directly adjacent to the emitting layer, as described, for example, in WO 2009/030981.

It is furthermore possible to employ the compounds according to the invention in a hole-blocking or electron-transport layer. This applies, in particular, to compounds according to the invention which do not have a carbazole structure. These may preferably also be substituted by one or more further electron-transporting groups, for example benzimidazole groups.

In the further layers of the organic electroluminescent device according to the invention, it is possible to use all materials as usually employed in accordance with the prior art. The person skilled in the art will therefore be able, without inventive step, to employ all materials known for organic electroluminescent devices in combination with the compounds of the formula (1) or in accordance with the preferred embodiments.

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it is also possible for the initial pressure to be even lower or higher, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, ink-jet printing, LITI (light induced thermal imaging, thermal transfer printing), screen printing, flexographic printing, offset printing or nozzle printing. Soluble compounds, which are obtained, for example, by suitable substitution, are necessary for this purpose.

Also possible are hybrid processes, in which, for example, one or more layers are applied from solution and one or more further layers are applied by vapour deposition. Thus, it is possible, for example, to apply the emitting layer from solution and to apply the electron-transport layer by vapour deposition.

These processes are generally known to the person skilled in the art and can be applied by him without inventive step to organic electroluminescent devices comprising the compounds according to the invention.

The compounds according to the invention generally have very good properties on use in organic electroluminescent devices. In particular, the lifetime on use of the compounds according to the invention in organic electroluminescent devices is significantly better compared with similar compounds in accordance with the prior art. The other properties of the organic electroluminescent device, in particular the efficiency and the voltage, are likewise better or at least comparable. Furthermore, the compounds have a high glass transition temperature and high thermal stability.

The invention will now be explained in greater detail by the following examples, without wishing to restrict it thereby.

A) SYNTHESES EXAMPLES

The following syntheses are carried out, unless indicated otherwise, under a protective-gas atmosphere in dried solvents. The solvents and reagents can be purchased, for example, from Sigma-ALDRICH or ABCR. The corresponding CAS numbers are also indicated in each case from the compounds known from the literature.

a) 1-(pyridine-2-yl)-9H-carbazole

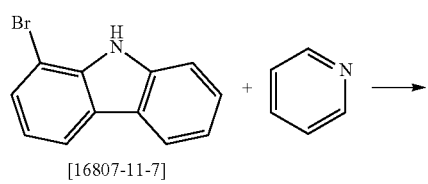

[16807-11-7]

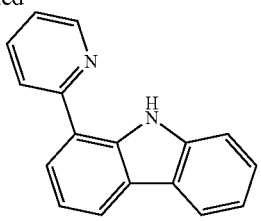

15 g (61 mmol) of 1-bromo-9H-carbazole are dissolved in 1000 ml of anhydrous THF under a nitrogen atmosphere and cooled to −78° C. After the addition of 130 mL (240 mmol) of a solution of t-butyllithium (1.9 M) in pentane, the solution is stirred for about 2 hours until it reaches −20° C. Then, 5.7 g (73 mmol) of pyrimidine are injected in the reaction mixture, which is further stirred for about 2 hours, until room temperature is reached. After addition of 300 ml of water, the extraction is carried out three times using 300 ml of ethyl acetate each time. The combined organic phases are dried over sodium sulfate, the solvent is removed under vacuum and the residue is purified by silica gel column chromatography using dichloromethane/petroleum ether/TEA 5:5:1.

The following compounds are prepared analogously:

| | Educt 1 | Educt 2 | Product | Yield |
|---|---|---|---|---|
| a1 | (1-bromo-9H-carbazole) | (pyrimidine) | (1-(pyrimidin-4-yl)-9H-carbazole) | 40% |
| a2 | [1843212-74-7] | (pyridine) | | 34% |
| a3 | [1628067-03-7] | (pyridine) | | 40% |

-continued

| | Educt 1 | Educt 2 | Product | Yield |
|---|---|---|---|---|
| a4 | [1686100-42-4] | pyridine | | 41% |
| a5 | [1686099-79-5] | pyridine | | 43% |
| a6 | [1628066-98-7] | pyridine | | 39% |
| a7 | [1609088-66-5] | pyridine | | 38% | b) 1-(1-phenyl-1H-benzoimidazol-2-yl)-9H-carbazole

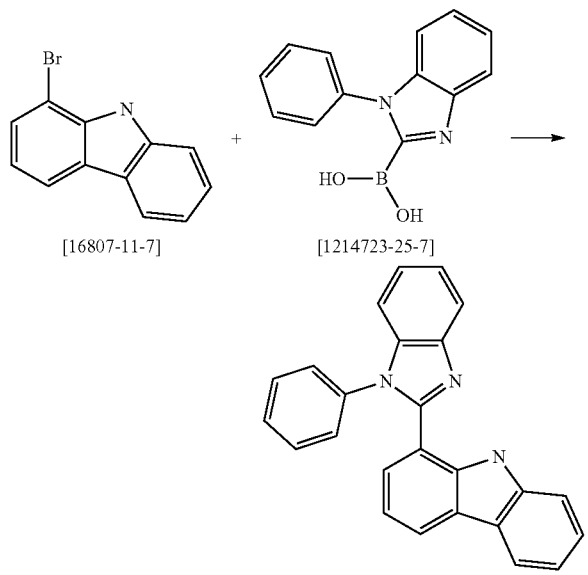

[16807-11-7]   [1214723-25-7]

First, 37.3 g (152 mmol) of 1-bromo-carbazole, 42.8 g (180 mmol) of B-(1-phenyl-1H-benzimidazol-2-yl)-boronic acid and 36 g (340 mmol) of sodium carbonate are suspended in 1000 mL of ethylene glycol dimethyl ether and 280 mL of water.

1.8 g (1.5 mmol) of tetrakies(triphenylphosphin)-palladium(0) are added to this suspension, and the reaction mixture is heated under refluxed for 16 h. After cooling, the organic phase is separated off, filtered over silica gel, washed three times with 200 mL of water and then concentrated to dryness. The product is purified by means of column chromatography on silica gel with toluene/heptane (1:2).

The yield is 36 g (100 mmol), corresponding to 68% of the theory.

The following compounds are prepared analogously:

| | Educt 1 | Educt 2 |
|---|---|---|
| b1 | 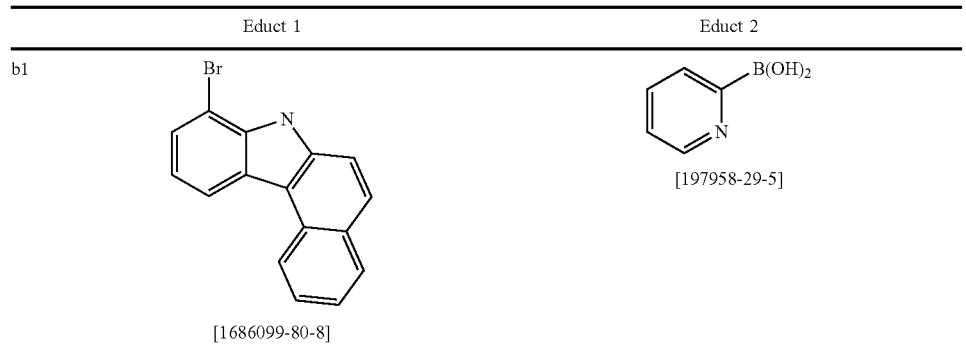 [1686099-80-8] | [197958-29-5] |
| b2 | 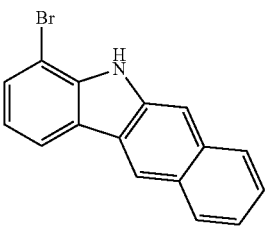 [1686100-43-5] | 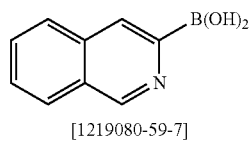 [SMILES: OB(O)c1cc2ccccc2cn1] [1219080-59-7] |

-continued
| | | | |
|---|---|---|---|
| b3 | 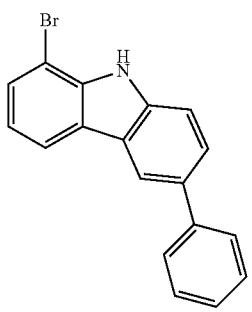 [1686099-79-5] | | 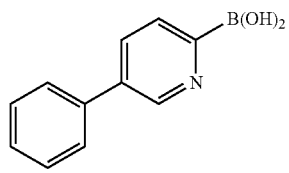 [1257879-76-7] |
| b4 | 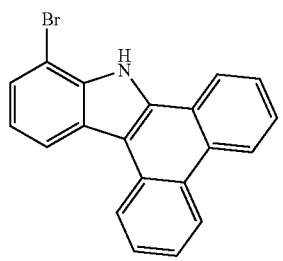 [1686100-44-6] | | 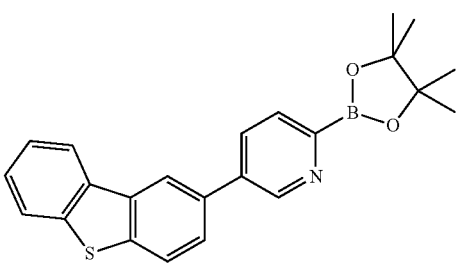 [1613551-59-9] |
| b5 | 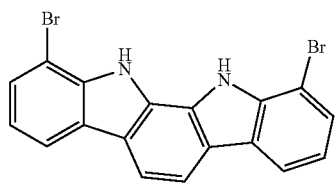 [845619-92-3] | | 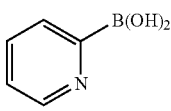 [197958-29-5] |
| b6 | 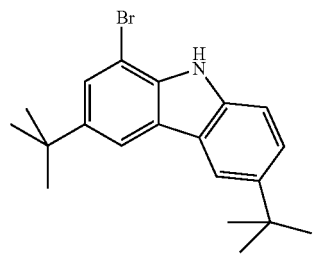 [1357359-52-4] | | 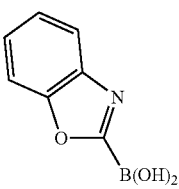 [401895-71-4] |
| b7 | 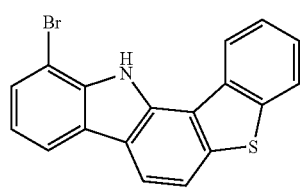 [1628067-07-1] | | 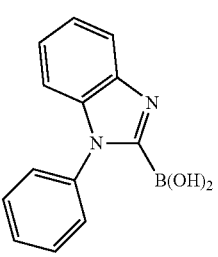 [1214723-25-7] |

US 11,731,990 B2
91                                                                92
-continued
| b8 | 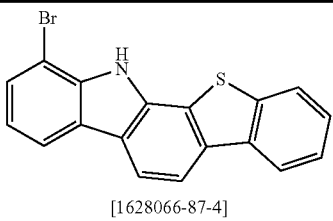 [1628066-87-4] | 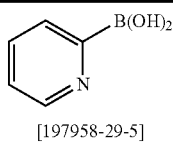 [197958-29-5] |
|---|---|---|
| b9 | 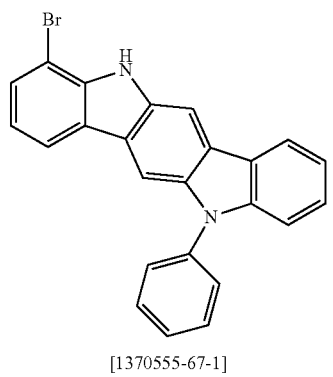 [SMILES: Brc1cccc2c1[nH]c1cc3c4ccccc4n(-c4ccccc4)c3cc12] [1370555-67-1] | 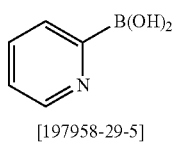 [197958-29-5] |
| b10 | 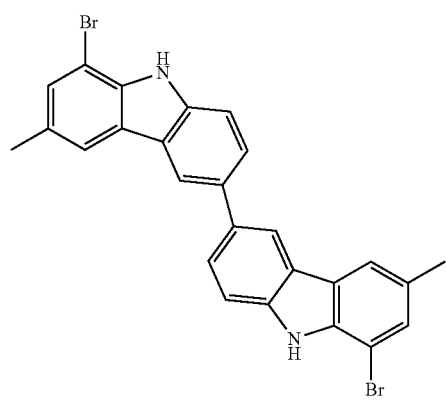 [387819-83-2] | 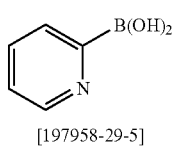 [197958-29-5] |
| b11 | 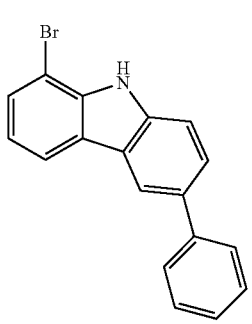 [1686099-79-5] | 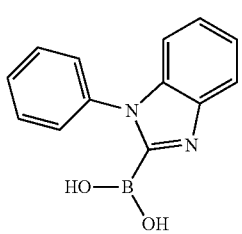 [SMILES: OB(O)c1nc2ccccc2n1-c1ccccc1] |
| b12 | 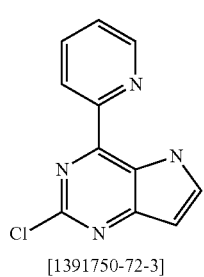 [SMILES: Clc1nc(-c2ccccn2)c2[nH]ccc2n1] [1391750-72-3] | 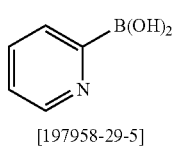 [197958-29-5] |

| | | | |
|---|---|---|---|
| b13 | 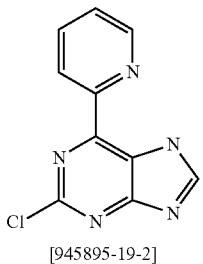 [SMILES: Clc1nc(-c2ccccn2)c2[nH]cnc2n1]<br>[945895-19-2] | 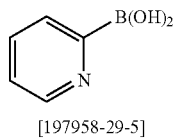<br>[197958-29-5] | |
| 14b | 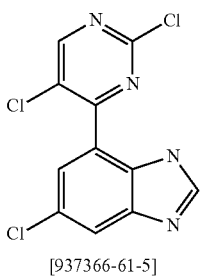 [SMILES: Clc1cc(-c2nc(Cl)ncc2Cl)c2[nH]cnc2c1]<br>[937366-61-5] | 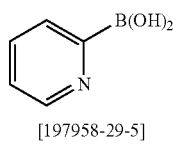<br>[197958-29-5] | |
| Product | Yield |
|---|---|
| b1 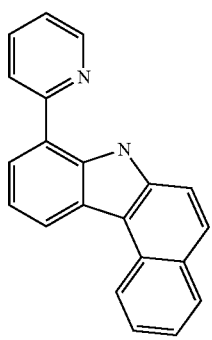 [SMILES: c1ccc(-c2cccc3c2[nH]c2ccc4ccccc4c23)nc1] | 77% |
| b2 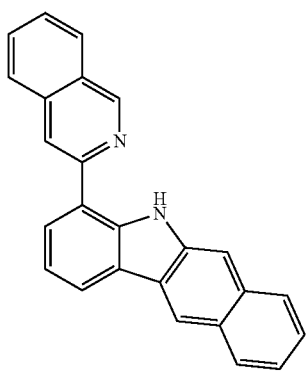 [SMILES: c1ccc2cc(-c3cccc4c3[nH]c3cc5ccccc5cc34)ncc2c1] | 76% |

| | | -continued | |
|---|---|---|---|
| b3 | 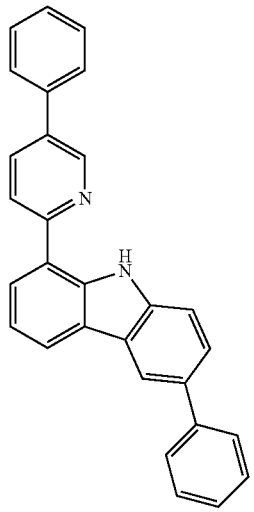 [SMILES: c1ccc(-c2ccc(-c3cccc4c3[nH]c3ccc(-c5ccccc5)cc34)nc2)cc1] | | 74% |
| b4 | 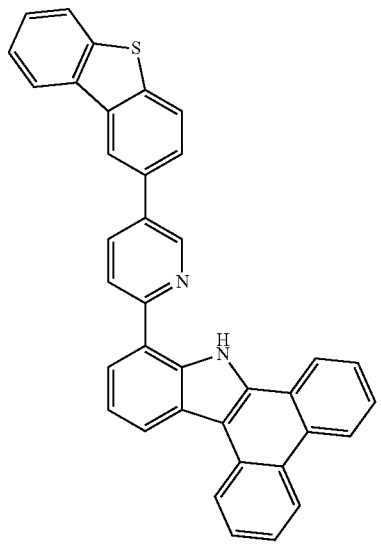 [SMILES: c1ccc2c(c1)sc1ccc(-c3ccc(-c4cccc5c4[nH]c4c6ccccc6c6ccccc6c54)nc3)cc12] | | 69% |
| b5 | 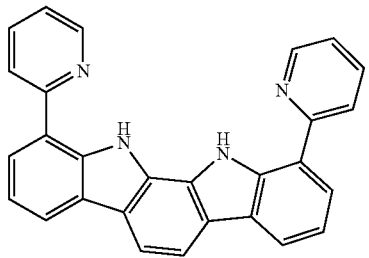 [SMILES: c1ccc(-c2cccc3c2[nH]c2c3ccc3c4cccc(-c5ccccn5)c4[nH]c32)nc1] | | 72% |

| | | -continued | |
|---|---|---|---|
| b6 | 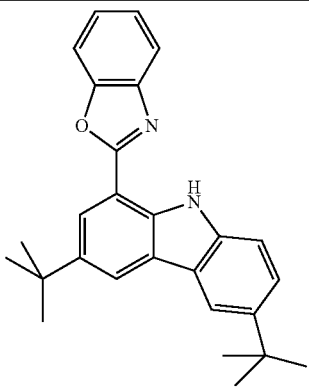 | | 79% |
| b7 | 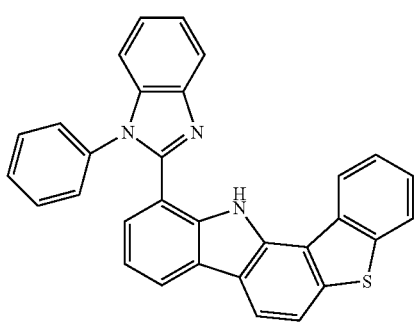 [SMILES: c1ccc(-n2c(-c3cccc4c3[nH]c3c4ccc4sc5ccccc5c43)nc3ccccc32)cc1] | | 68% |
| b8 | 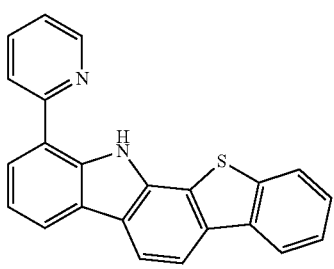 [SMILES: c1ccc(-c2cccc3c2[nH]c2c3ccc3c4ccccc4sc32)nc1] | | 82% |
| b9 | 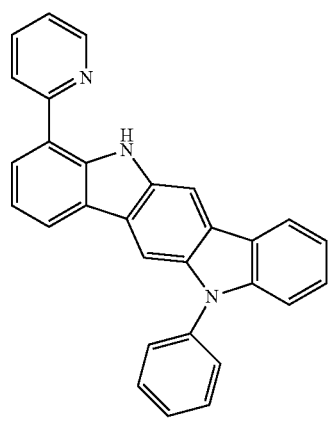 [SMILES: c1ccc(-n2c3ccccc3c3cc4[nH]c5c(-c6ccccn6)cccc5c4cc32)cc1] | | 67% |

| | | |
|---|---|---|
| b10 | 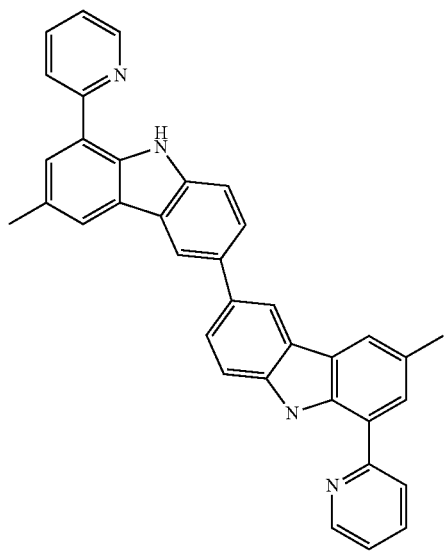 | 75% |
| b11 | 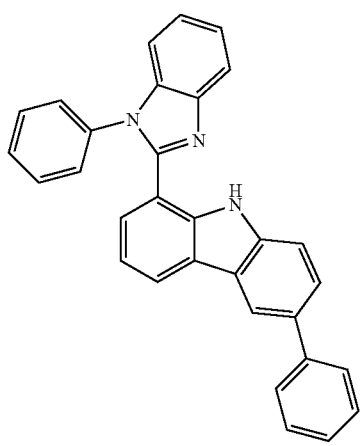 [SMILES: c1ccc(-c2ccc3[nH]c4c(-c5nc6ccccc6n5-c5ccccc5)cccc4c3c2)cc1] | 68% |
| b12 | 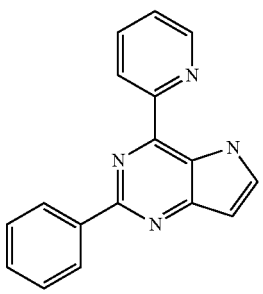 [SMILES: c1ccc(-c2nc(-c3ccccn3)c3[nH]ccc3n2)cc1] | 56% |

| | | |
|---|---|---|
| b13 | 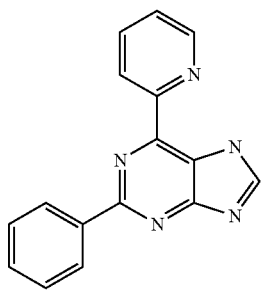 [SMILES: c1ccc(-c2nc(-c3ccccn3)c3[nH]cnc3n2)cc1] | 61% |
| 14b | 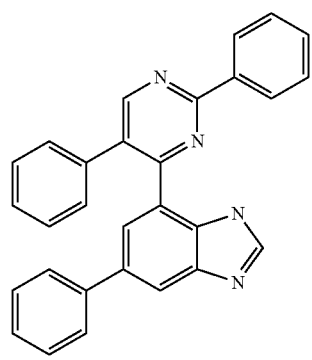 [SMILES: c1ccc(-c2cc(-c3nc(-c4ccccc4)ncc3-c3ccccc3)c3[nH]cnc3c2)cc1] | 48% | c) 1-[4-(9-phenyl-9H-carbazol-3-yl)-pyridin-2-yl]-9H-beta-carboline

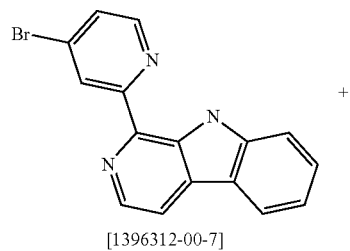

[1396312-00-7]

+

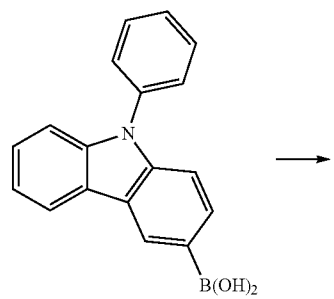

→

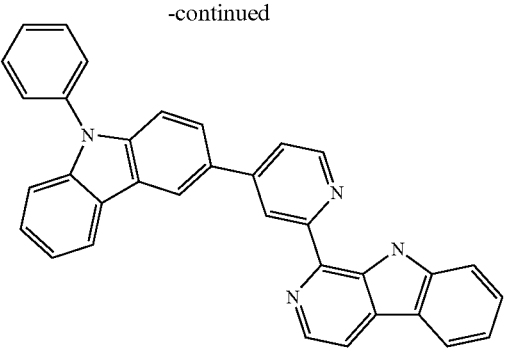

50 g (155 mmol) of 1-(4-bromo-pyridin-2-yl)-9H-beta-carboline, 50 g (172 mmol) of N-phenyl-carbazole-3-boronic acid and 36 g (340 mmol) of sodium carbonate are suspended in 1000 mL of ethylene glycol dimethyl ether r and 280 mL of water.

1.8 g (1.5 mmol) of tetrakies(triphenylphosphin)-palladium(0) are added to this suspension, and the reaction mixture is heated under refluxed for 16 h. After cooling, the organic phase is separated off, filtered over silica gel, washed three times with 200 mL of water and then concentrated to dryness. The product is purified by means of column chromatography on silica gel with toluene/heptane (1:2).

The yield is 53 g (100 mmol), corresponding to 71% of theory.

The following compound is prepared analogously:

| Educt 1 | Educt 2 |
|---|---|
| c1 (4-bromo-pyridin-2-yl substituted β-carboline) [1396312-00-7] | (bis-N-phenylcarbazole pinacol boronate) [1572537-61-1] |

| Product | Yield |
|---|---|
| c1 (coupled product) | 61% | d) 9-diphenylboranyl-1-pyridin-2-yl-9H-carbazole

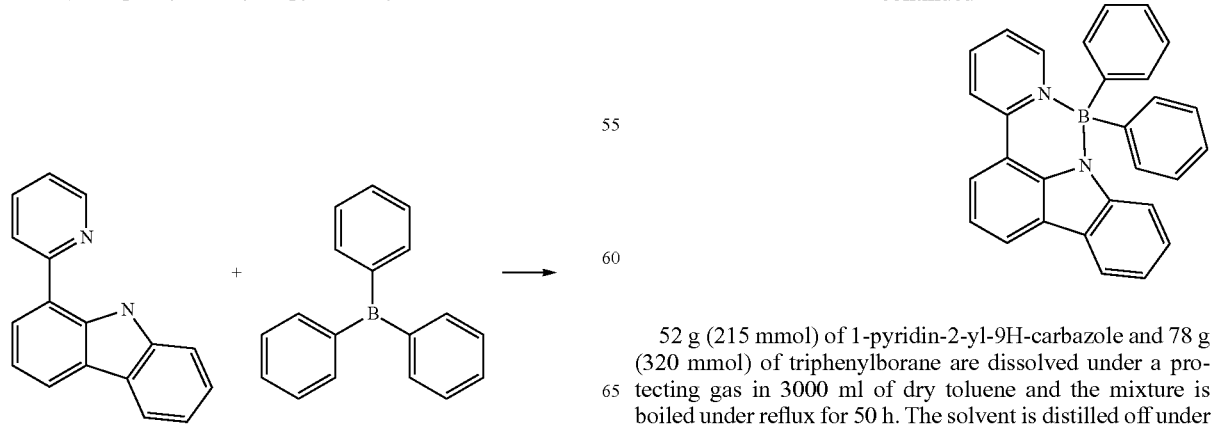

52 g (215 mmol) of 1-pyridin-2-yl-9H-carbazole and 78 g (320 mmol) of triphenylborane are dissolved under a protecting gas in 3000 ml of dry toluene and the mixture is boiled under reflux for 50 h. The solvent is distilled off under vacuum, the product is purified by chromatography (EA/ hexane, 1:5) and finally sublimed (purity 99.9%) in high vacuum ($p=5\times10^{-7}$ mbar). The yield is 51 g (124 mmol), 59% of the theory.

The following compounds are prepared analogously:

| | Educt 1 | Educt 2 | Product | Yield |
|---|---|---|---|---|
| d1 | [446284-54-4] | [960-71-4] | | 60% |
| d2 | [1809533-90-1] | [7297-95-2] | | 67% |
| d3 | [1809533-90-1] | [960-71-4] | | 61% |

-continued
| | Educt 1 | Educt 2 | Product | Yield |
|---|---|---|---|---|
| d4 | 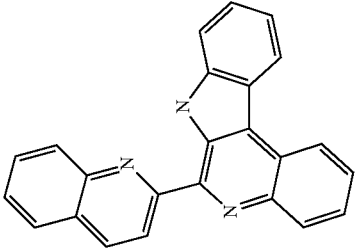 [1770916-68-1] | 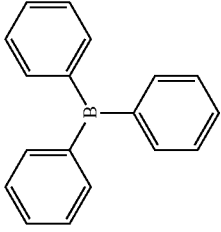 [960-71-4] | 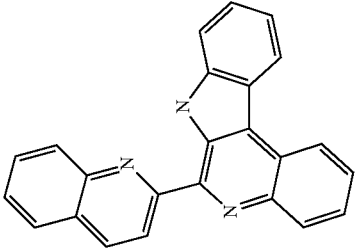 | 44% |
| d5 | 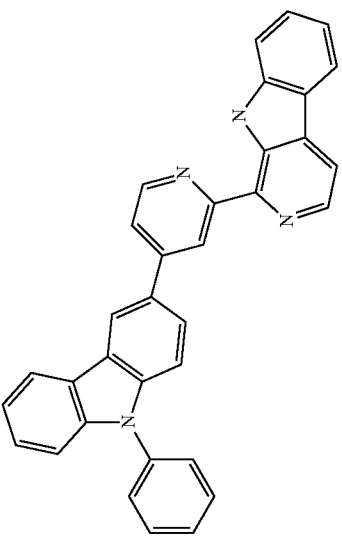 | 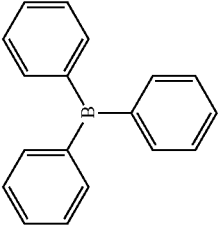 [960-71-4] | 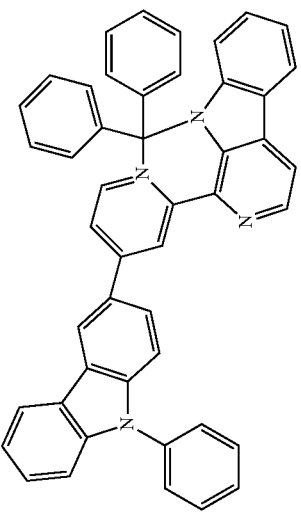 | 58% |

-continued

| | Educt 1 | Educt 2 | Product | Yield |
|---|---|---|---|---|
| d6 | | [960-71-4] | | 54% |
| d7 | [95360-17-1] | [960-71-4] | | 51% |
| d8 | [389628-57-3] | [47196-74-7] | | 56% |

| | Educt 1 | Educt 2 | Product | Yield |
|---|---|---|---|---|
| d9 | 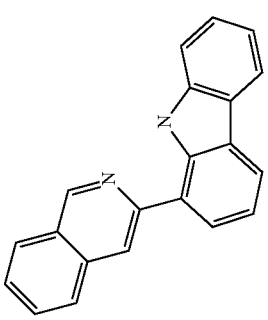 [1809533-91-2] | 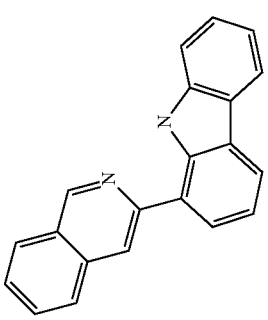 [960-71-4] | 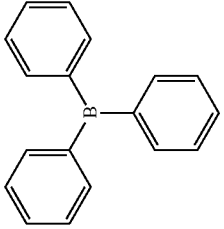 | 52% |
| d10 | 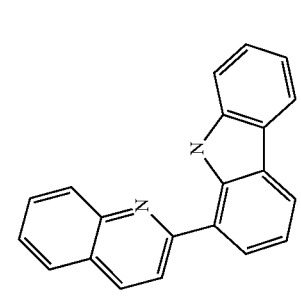 [18909533-92-3] | 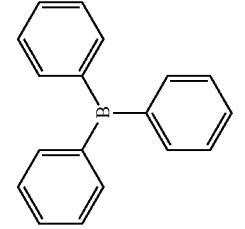 [960-71-4] | 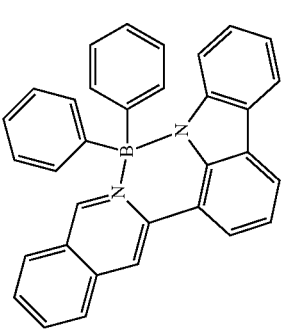 | 54% |
| d11 | 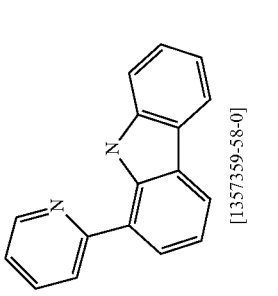 [1357359-58-0] | 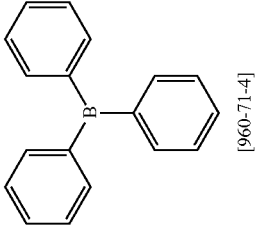 [960-71-4] | 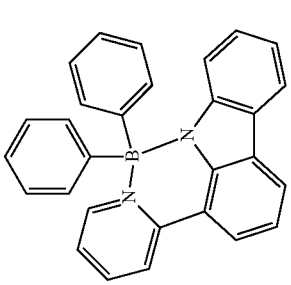 | 59% |

| | Educt 1 | Educt 2 | Product | Yield |
|---|---|---|---|---|
| d12 | 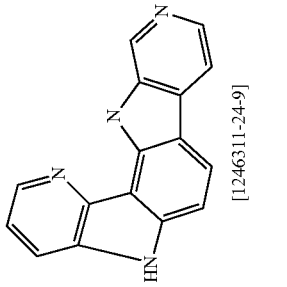 [1246311-24-9] | 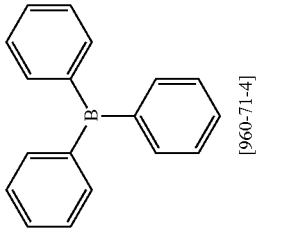 [960-71-4] | 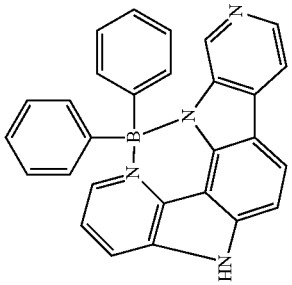 | 50% |
| d13 | 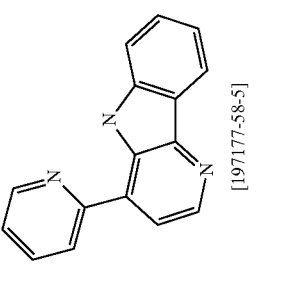 [197177-58-5] | 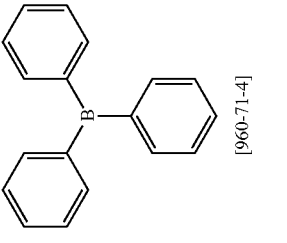 [960-71-4] | 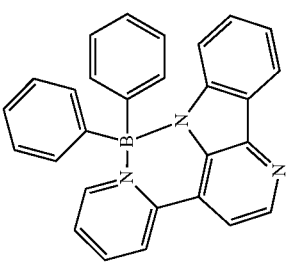 | 56% |
| d14 | 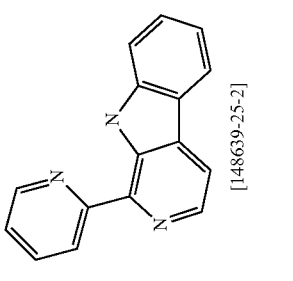 [148639-25-2] | 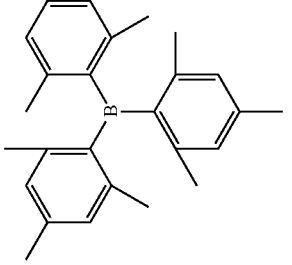 [7297-95-2] | 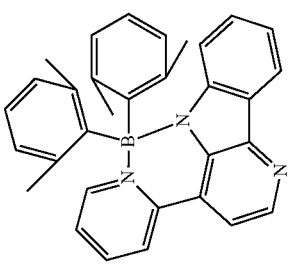 | 60% |

| | Educt 1 | Educt 2 | Product | Yield |
|---|---|---|---|---|
| d15 |  [389628-57-3] | B(Ph)₃ [960-71-4] | | 62% |
| d16 | | B(Ph)₃ [960-71-4] | | 62% |

| | Educt 1 | Educt 2 | Product | Yield |
|---|---|---|---|---|
| d17 | 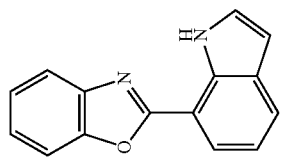 [1159516-18-3] | 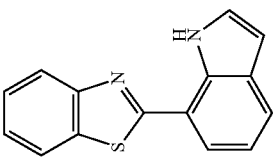 [7297-95-2] | 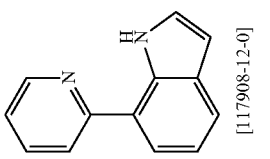 | 60% |
| d19 | 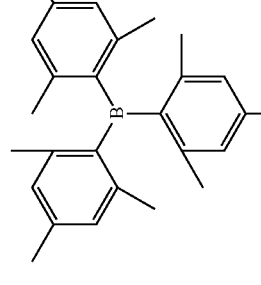 [1188425-42-6] | 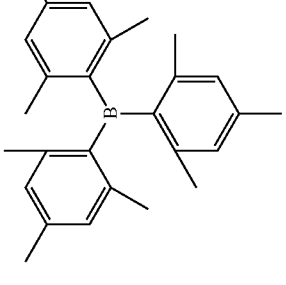 [7297-95-2] | 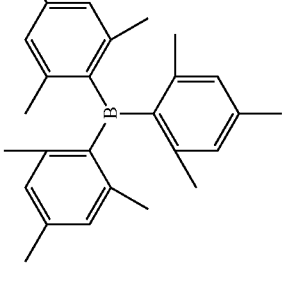 | 63% |
| d20 | 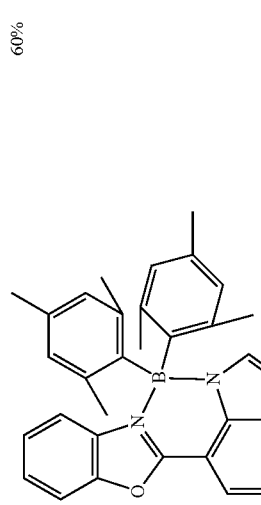 [117908-12-0] | 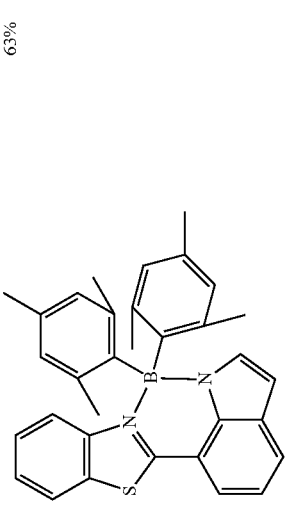 [7297-95-2] | 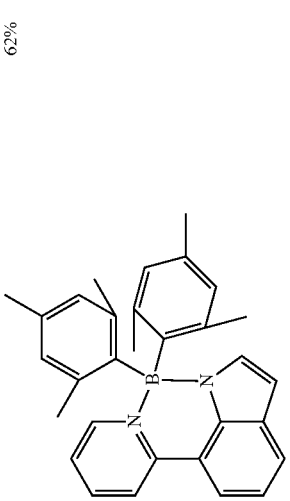 | 62% |

-continued
| | Educt 1 | Educt 2 | Product | Yield |
|---|---|---|---|---|
| d21 | 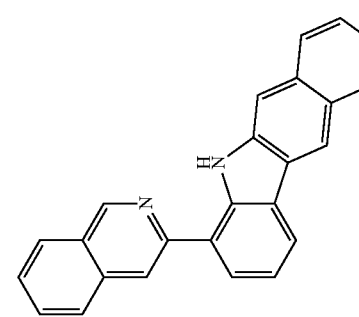 | 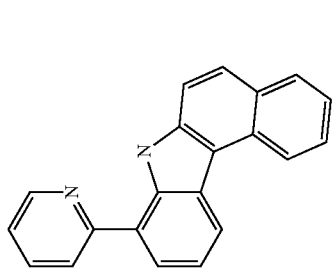 [960-71-4] | 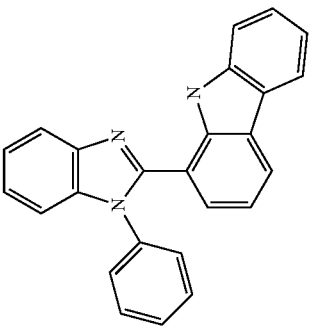 | 57% |
| d22 | 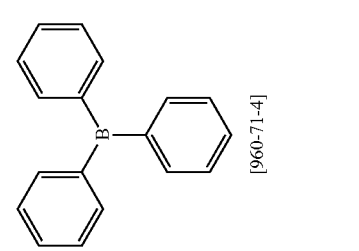 | 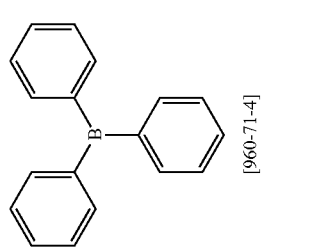 [960-71-4] | 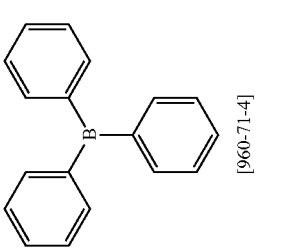 | 56% |
| d23 | 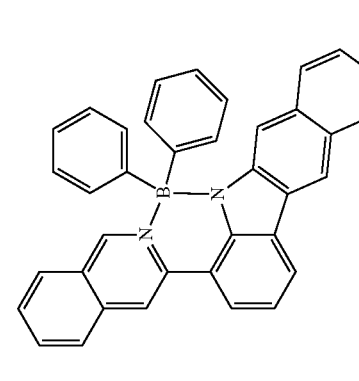 | 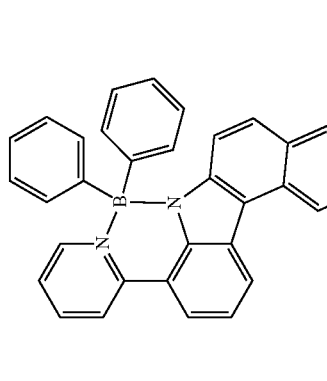 [960-71-4] | 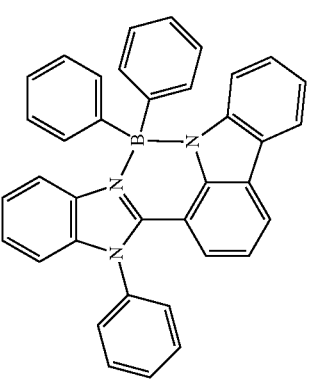 | 56% |

| Educt 1 | Educt 2 | Product | Yield |
|---|---|---|---|
| d24 | [960-71-4] | | 58% |
| d25 | [960-71-4] | | 48% |

-continued
| | Educt 1 | Educt 2 | Product | Yield |
|---|---|---|---|---|
| d26 | 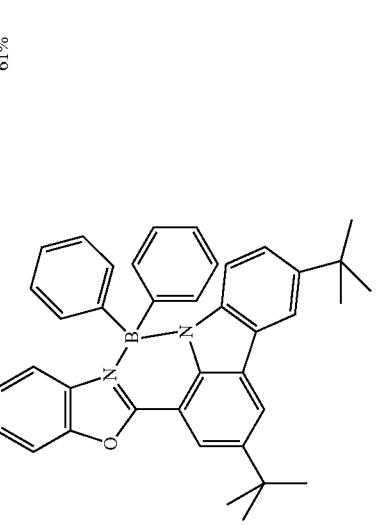 | 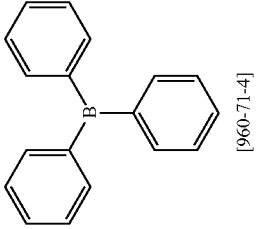 [960-71-4] | 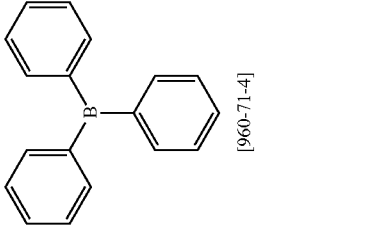 | 42% |
| d27 | 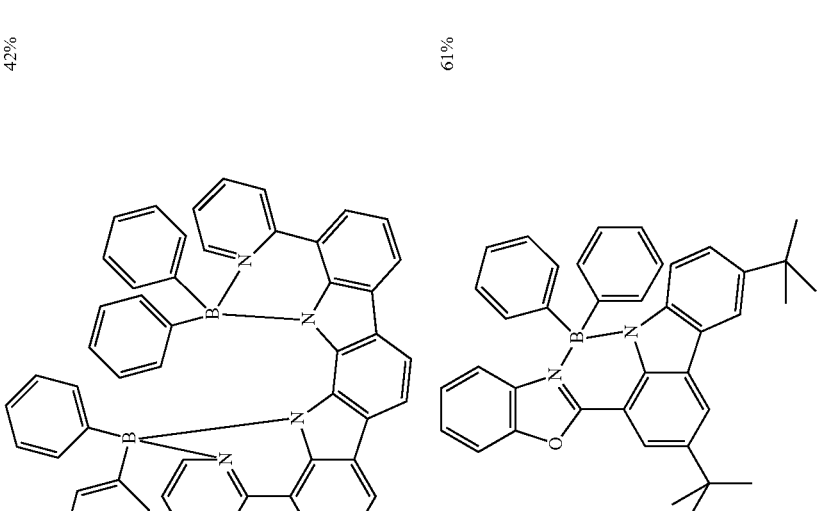 | 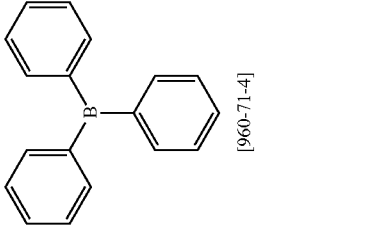 [960-71-4] | 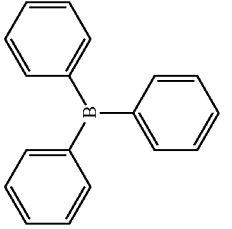 | 61% |

| | Educt 1 | Educt 2 | Product | Yield |
|---|---|---|---|---|
| d28 | | | | 53% |
| d29 | | | | 57% |
| d30 | | | | 59% |

| | Educt 1 | Educt 2 | Product | Yield |
|---|---|---|---|---|
| d31 | [387819-83-2] | [960-71-4] | | 45% |
| d32 | [1798310-73-2] | [960-71-4] | | 53% |

| | Educt 1 | Educt 2 | Product | Yield |
|---|---|---|---|---|
| d33 | [1627954-73-7] | [960-71-4] | | 51% |
| d34 | [1554335-31-7] | [960-71-4] | | 45% |

| | Educt 1 | Educt 2 | Product | Yield |
|---|---|---|---|---|
| d35 | | [960-71-4] | | 47% |
| d36 | [1838224-12-6] | [960-71-4] | | 52% |
| d37 | | [960-71-4] | | 50% |

| | Educt 1 | Educt 2 | Product | Yield |
|---|---|---|---|---|
| d38 | | [960-71-4] | | 41% |
| d40 | | [960-71-4] | | 43% |
| d41 | | [960-71-4] | | 56% |

| | Educt 1 | Educt 2 | Product | Yield |
|---|---|---|---|---|
| d42 | | [960-71-4] | | 49% |
| d43 | | [960-71-4] | | 55% |
| d44 | | [960-71-4] | | 65% |

-continued

| | Educt 1 | Educt 2 | Product | Yield |
|---|---|---|---|---|
| d45 | | [960-71-4] | | 41% |
| d46 | | [960-71-4] | | 43% |

| | Educt 1 | Educt 2 | Product | Yield |
|---|---|---|---|---|
| d47 | 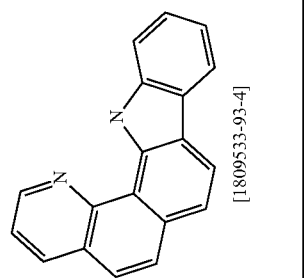 [1809533-93-4] | 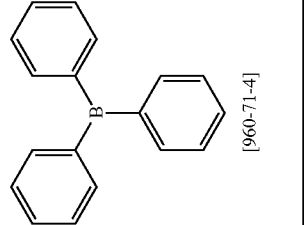 [960-71-4] | 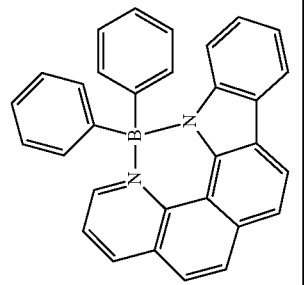 | 55% |

B) FABRICATION OF OLEDS

The following examples E1 to E6 (see Table 1) show data of various OLEDs.

Substrate pre-treatment of examples E1-E6: Glass plates with structured ITO (50 nm, indium tin oxide) form the substrates on which the OLEDs are processed. Before evaporation of the OLED materials, the substrates are pre-baked for 15 minutes at 250° C., followed by an $O_2$ and subsequent Argon plasma treatment.

The OLEDs have in principle the following layer structure: substrate/hole-transport layer (HTL)/optional interlayer (IL)/electron-blocking layer (EBL)/emission layer (EML)/optional hole-blocking layer (HBL)/electron-transport layer (ETL)/optional electron-injection layer (EIL) and finally a cathode. The cathode is formed by an aluminium layer with a thickness of 100 nm. The exact layer structure is denoted in Table 1. The materials used for the OLED fabrication are presented in Table 2.

All materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation. An expression such as IC1:M1:TEG1 (55%:35%:10%) here means that material IC1 is present in the layer in a proportion by volume of 55%, M1 is present in the layer in a proportion of 35% and TEG1 is present in the layer in a proportion of 10%. Analogously, the electron-transport layer may also consist of a mixture of two materials.

The OLEDs are characterised by standard methods. The electroluminescence (EL) spectra are recorded at a luminous density of 1000 cd/m² and the CIE 1931 x an y coordinates are then calculated from the EL spectrum.

TABLE 1

OLED layer structure

| Bsp. | HIL Dicke | HTL Dicke | EBL Dicke | EML Dicke | ETL Dicke |
|---|---|---|---|---|---|
| E1 | HATCN 5 nm | SpMA1 125 nm | SpMA3 10 nm | IC5:EG1:TER5 (45%:40%:5%) 40 nm | ST2:LiQ (50%:50%) 35 nm |
| E2 | HATCN 5 nm | SpMA1 125 nm | SpMA3 10 nm | IC5:EG2:TER5 (45%:40%:5%) 40 nm | ST2:LiQ (50%:50%) 35 nm |
| E3 | HATCN 5 nm | SpMA1 125 nm | SpMA3 10 nm | IC5:EG3:TER5 (45%:40%:5%) 40 nm | ST2:LiQ (50%:50%) 35 nm |
| E4 | HATCN 5 nm | SpMA1 125 nm | SpMA3 10 nm | IC5:EG4:TER5 (45%:40%:5%) 40 nm | ST2:LiQ (50%:50%) 35 nm |
| E5 | HATCN 5 nm | SpMA1 125 nm | SpMA3 10 nm | IC5:EG5:TER5 (45%:40%:5%) 40 nm | ST2:LiQ (50%:50%) 35 nm |
| E6 | HATCN 5 nm | SpMA1 125 nm | SpMA3 10 nm | IC5:EG6:TER5 (45%:40%:5%) 40 nm | ST2:LiQ (50%:50%) 35 nm |

TABLE 2

Chemical structures of the OLED materials

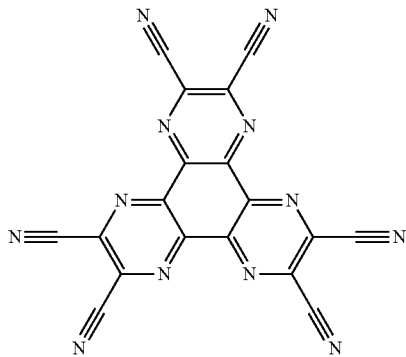 [SMILES: N#Cc1nc2c3nc(C#N)c(C#N)nc3c3nc(C#N)c(C#N)nc3c2nc1C#N]

HATCN

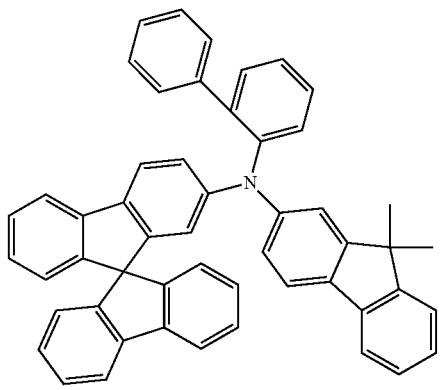 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

SpMA1

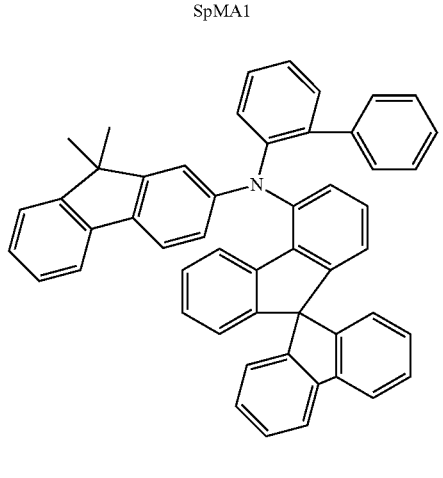

SpMA3

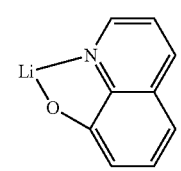

LiQ

TABLE 2-continued
Chemical structures of the OLED materials
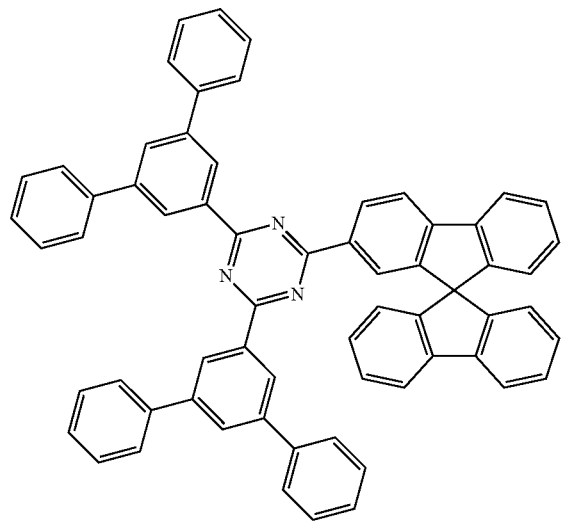 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2
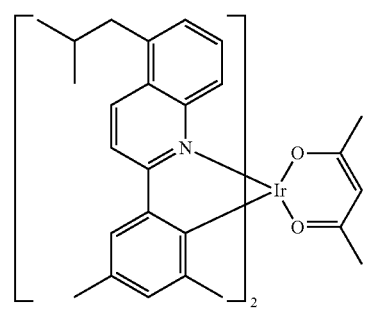
TER5
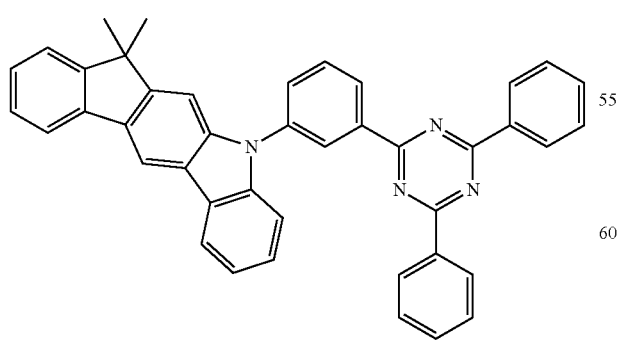
IC5
TABLE 2-continued
Chemical structures of the OLED materials
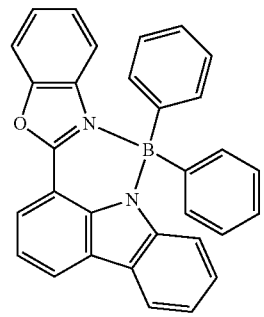
EG1
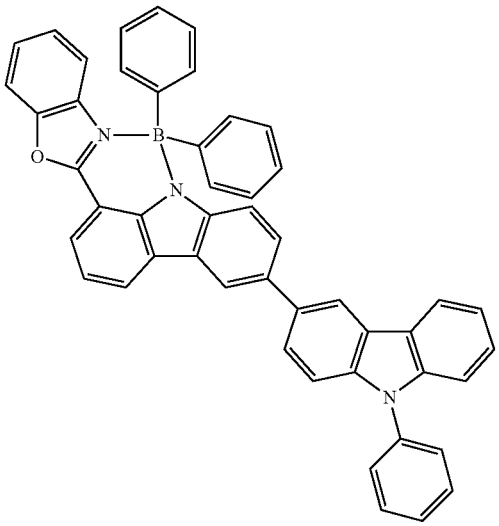
EG2

TABLE 2-continued

Chemical structures of the OLED materials

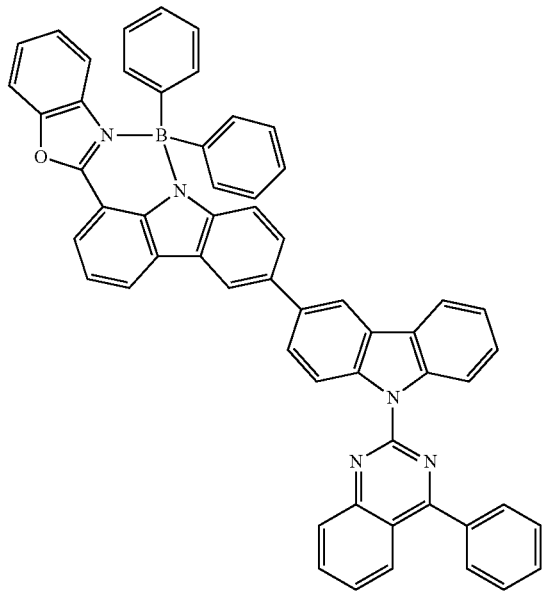

EG3

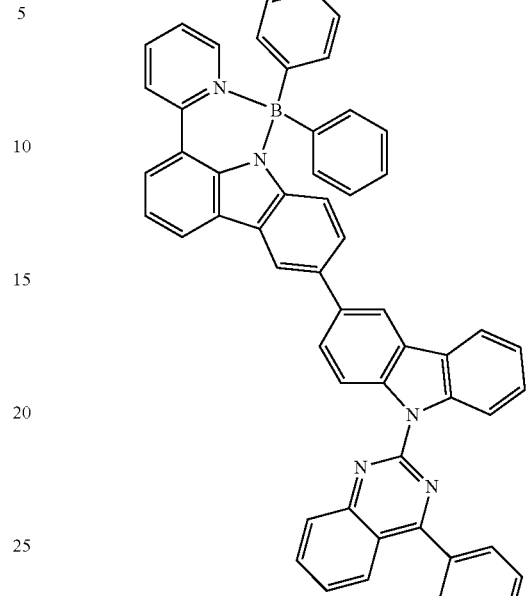

EG5

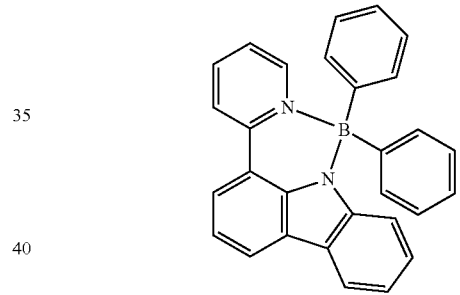

EG6

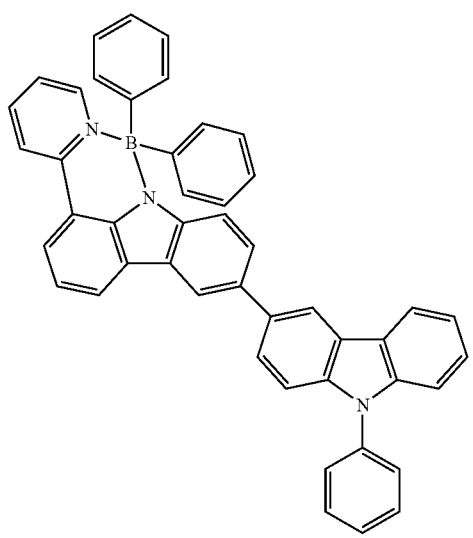

EG4

The examples E1-E6 show data of inventive OLEDs.
Use of Inventive Compounds as Host Material in Phosphorescent OLEDs The use of the inventive materials EG1 to EG6 as host material in phosphorescent red OLEDs (experiments E1 to E6) results in an electroluminescent emission with the color coordinates CIEx=0.67 and CIEy=0.33. This shows that the inventive materials are suitable for the use in OLEDs.

The invention claimed is:
1. A compound of the formula (1),

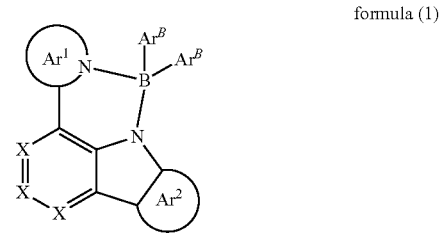

formula (1)

where the following applies to the symbols and indices used:

Ar$^1$ is a heteroaryl group comprising at least one nitrogen which is represented in formula (1), having 5 to 30 aromatic ring atoms, which may be substituted by one or more radicals R$^1$;

Ar$^2$ stands for an aryl or heteroaryl group having 5 to 30 aromatic ring atoms, which may be substituted by one or more radicals R$^1$;

Ar$^B$ is, on each occurrence, identically or differently, an aromatic or heteroaromatic ring system having 5 to 60 aromatic ring atoms, which may be substituted by one or more radicals R$^3$;

X stands, on each occurrence, identically or differently, for CR$^2$ or N; or two adjacent groups X stand for a group of formula (X-1),

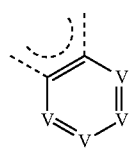

Formula (X-1)

where the dashed bonds in formula (X-1) indicate the bonding of the corresponding adjacent groups X to the structure;

V is on each occurrence, identically or differently, CR$^2$ or N;

R$^1$, R$^2$, R$^3$ stand on each occurrence, identically or differently, for H, D, F, Cl, Br, I, CHO, CN, C(=O)Ar$^3$, P(=O)(Ar$^3$)$_2$, S(=O)Ar$^3$, S(=O)$_2$Ar$^3$, N(Ar$^3$)$_2$, NO$_2$, Si(R$^4$)$_3$, B(OR$^4$)$_2$, OSO$_2$R$^4$, a straight-chain alkyl, alkoxy or thioalkyl groups having 1 to 40 C atoms or branched or a cyclic alkyl, alkoxy or thioalkyl groups having 3 to 40 C atoms, each of which may be substituted by one or more radicals R$^4$, where in each case one or more non-adjacent CH$_2$ groups may be replaced by R$^4$C=CR$^4$, C≡C, Si(R$^4$)$_2$, Ge(R$^4$)$_2$, Sn(R$^4$)$_2$, C=O, C=S, C=Se, P(=O)(R$^4$), SO, SO$_2$, O, S or CONR$^4$ and where one or more H atoms may be replaced by D, F, Cl, Br, I, CN or NO$_2$, an aromatic or heteroaromatic ring systems having 5 to 60 aromatic ring atoms, which may in each case be substituted by one or more radicals R$^4$, or an aryloxy groups having 5 to 60 aromatic ring atoms, which may be substituted by one or more radicals R$^4$; where two adjacent substituents R$^1$, two adjacent substituents R$^2$ and/or two adjacent substituents R$^3$ may form an aliphatic or aromatic ring system together, which may be substituted by one or more radicals R$^4$; and where one substituent R$^1$ of the group Ar$^1$ and one substituent R$^2$ of the adjacent 6-membered ring comprising the groups X may form an aliphatic or aromatic ring system together;

Ar$^3$ is, on each occurrence, identically or differently, an aromatic or heteroaromatic ring system having 5 to 60 aromatic ring atoms, which may in each case also be substituted by one or more radicals R$^4$; and R$^4$ stands on each occurrence, identically or differently, for H, D, F, Cl, Br, I, CN, a straight-chain alkyl, alkoxy or thioalkyl groups having 1 to 20 C atoms or branched or cyclic alkyl, alkoxy or thioalkyl groups having 3 to 20 C atoms, where in each case one or more non-adjacent CH$_2$ groups may be replaced by SO, SO$_2$, O, S and where one or more H atoms may be replaced by D, F, Cl, Br or I, or an aromatic or heteroaromatic ring system having 5 to 24 C atoms.

2. The compound according to claim 1, characterized in that the group Ar$^1$ is a heteroaryl group having 5 to 18 aromatic ring atoms, selected from the groups of formulae (Ar1-1), (Ar1-2) or (Ar1-3),

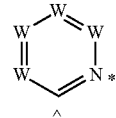

Formula (Ar1-1)

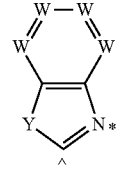

Formula (Ar1-2)

Formula (Ar1-3)

where the sign * indicates the position of the coordination to the Boron and the sign ^ indicates the bonds to the adjacent 6-membered ring as depicted in formula (1); and where Y stands on each occurrence, identically or differently, for O, S, C(R$^1$)$_2$ or NR$^1$;

W stands, on each occurrence, identically or differently, for CR$^1$ or N; or two adjacent groups W stand for a group of formula (W-1) or (W-2),

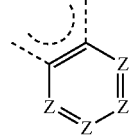

Formula (W-1)

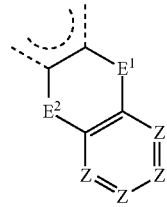

Formula (W-2)

where the dashed bonds in formulae (W-1) and (W-2) indicate the bonding to the groups of formula (Ar1-1) or (Ar1-2);

Z is on each occurrence, identically or differently, CR' or N;

E$^1$, E$^2$ are, on each occurrence, identically or differently, selected from a single bond, and B(R$^0$), C(R$^0$)$_2$, Si(R$^0$)$_2$, C=O, C=NR$^0$, C=C(R$^0$)$_2$, O, S, S=O, SO$_2$, N(R$^0$), P(R$^0$) and (P(=O)R$^0$, where at least one of the groups E$^1$ and E$^2$, present in the same ring, is not a single bond;

R$^0$ stands on each occurrence, identically or differently, for H, D, F, Cl, Br, I, CN, a straight-chain alkyl, alkoxy or thioalkyl groups having 1 to 40 C atoms or branched or a cyclic alkyl, alkoxy or thioalkyl groups having 3 to 40 C atoms, each of which may be substituted by one or more radicals $R^4$, where in each case one or more non-adjacent $CH_2$ groups may be replaced by $R^4C=CR^4$, $Si(R^4)_2$, $Ge(R^4)_2$, $Sn(R^4)_2$, C=O, C=S, C=Se, P(=O)($R^4$), SO, $SO_2$, O, S or $CONR^4$ and where one or more H atoms may be replaced by D, F, Cl, Br, I, CN or $NO_2$, an aromatic or heteroaromatic ring systems having 5 to 60 aromatic ring atoms, which may in each case be substituted by one or more radicals $R^4$, or an aryloxy groups having 5 to 60 aromatic ring atoms, which may be substituted by one or more radicals $R^4$, where two adjacent substituents $R^0$ may form an aliphatic or aromatic ring system together, which may be substituted by one or more radicals $R^4$; and $R^1$ has the same meaning as in claim 1.

3. The compound according to claim 2, characterized in that the compound is selected from the compounds of formulae (2) to (5) as listed below:

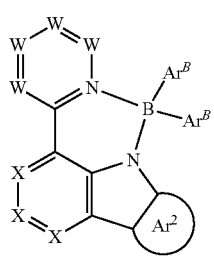

Formula (2)

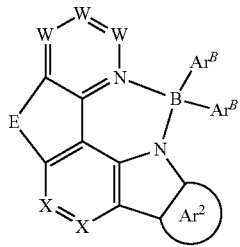

Formula (3)

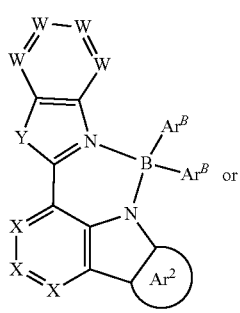

Formula (4)

or

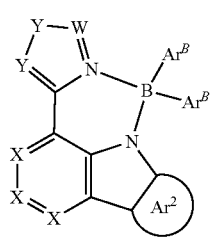

Formula (5)

where the symbols
$Ar^2$ stands for an aryl or heteroaryl group having 5 to 30 aromatic ring atoms, which may be substituted by one or more radicals $R^2$;
$Ar^B$ is, on each occurrence, identically or differently, an aromatic or heteroaromatic ring system having 5 to 60 aromatic ring atoms, which may be substituted by one or more radicals $R^3$;
X stands, on each occurrence, identically or differently for $CR^2$ or N; or two adjacent groups X stand for a group of formula (X-1),

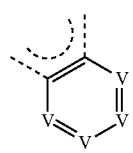

Formula (X-1)

where the dashed bonds in formula (X-1) indicate the bonding of the corresponding adjacent groups X to the structure;
and the symbols W and Y have the same meaning as in claim 2; and
where
E stands for —B($R^0$)—, —C($R^0$)$_2$—, —Si($R^0$)$_2$—, —C(=O)—, C(=N$R^0$)—, —C($R^0$)=C($R^0$)—, —C(=C($R^0$)$_2$)—, —O—, —S—, S(=O)—, $SO_2$—, —N($R^0$)—, —P($R^0$)— or —P((=O)$R^0$)—, where $R^0$ has the same meaning as in claim 2.

4. The compound according to claim 1, characterized in that the group $Ar^B$ is selected from aromatic or heteroaromatic ring systems having 5 to 18 C atoms, each of which may be substituted by one or more radicals $R^3$.

5. The compound according to claim 1, characterized in that the compound comprises at least one group $R^1$ or $R^2$ selected from aromatic or heteroaromatic ring systems having 5 to 60 aromatic ring atoms, which may in each case be substituted by one or more radicals $R^4$.

6. A formulation comprising at least one compound according to claim 1 and at least one solvent.

7. A process for the preparation of the compound of formula (1) according to claim 1, characterized in that it comprises the following steps:
a) A heteroaromatic group AO comprising at least one nitrogen is bonded to a heterocycle comprising a pyrrole moiety via a C—C coupling in order to obtain a compound of formula Int:

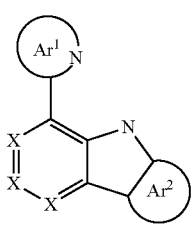

formula Int b) The compound of formula Int reacts with a triarylborane B($Ar^B$)$_3$ so that a compound of formula (1) is obtained:

formula (1)

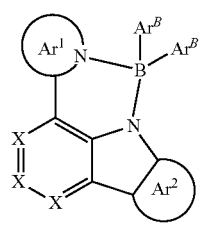

where the symbols, $Ar^1$, $Ar^2$, $Ar^B$ and X have the same meaning as in claim 1.

8. An electronic device comprising at least one compound according to claim 1.

9. The electronic device according to claim 8, characterized in that it is selected from the group consisting of organic electroluminescent devices, organic integrated circuits, organic field-effect transistors, organic thin-film transistors, organic light-emitting transistors, organic solar cells, dye-sensitised organic solar cells, organic optical detectors, organic photoreceptors, organic field-quench devices, light-emitting electrochemical cells, organic laser diodes and organic plasmon emitting devices.

10. An electronic device which is an organic electroluminescent device, characterized in that the compound according to claim 1 is employed as a matrix material for emitters, a hole-transport-material or an electron-transport material.

11. An electronic device characterized in that the device is organic electroluminescent devices comprising a cathode, an anode and at least one emitting layer arranged between the anode and the cathode, wherein the at least one emitting layer comprises at least one phosphorescent material as an emitter and at least one compound according to claim 1 as a matrix material.

12. The electronic device according to claim 11, characterized in that the phosphorescent material has an emission wavelength comprised between 550 nm to 680 nm.

13. The compound according to claim 2, characterized in that the compound is selected from the compounds of formulae (1-1) to (3-9) as listed below:

Formula (1-1)

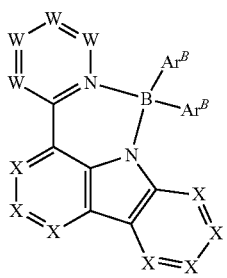

Formula (1-2)

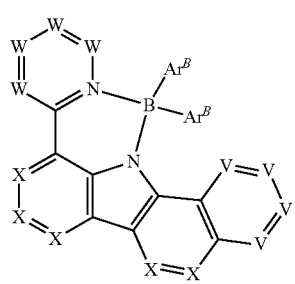

Formula (1-3)

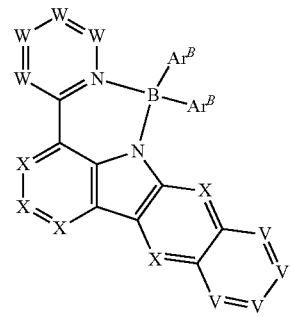

Formula (1-4)

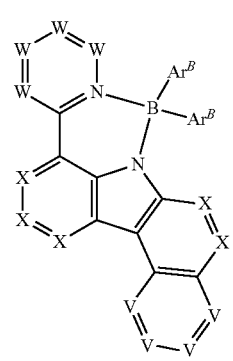

Formula (1-5)

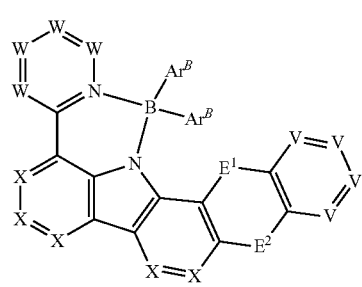

Formula (1-6)

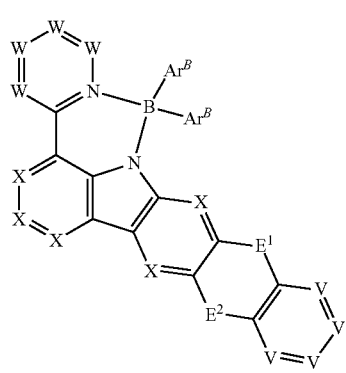

-continued
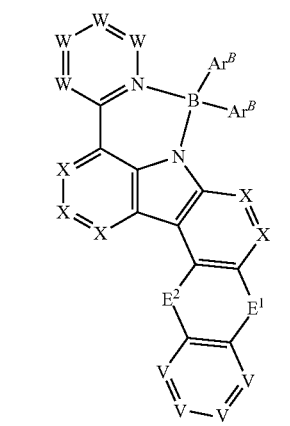
Formula (1-7)
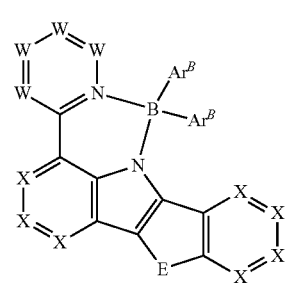
Formula (1-8)
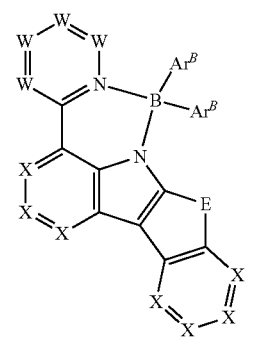
Formula (1-9)
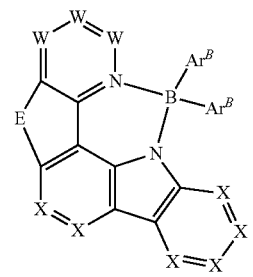
Formula (1-10)
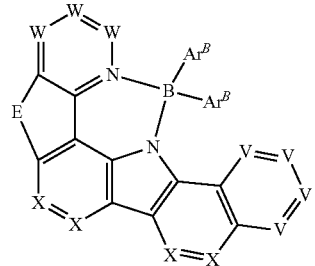
Formula (1-11)
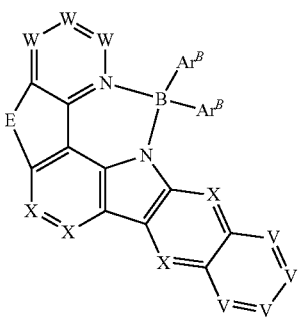
Formula (1-12)
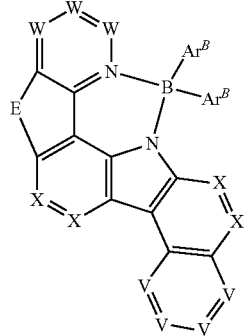
Formula (1-13)
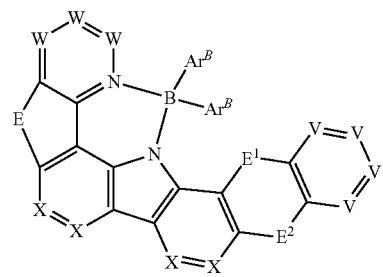
Formula (1-14)
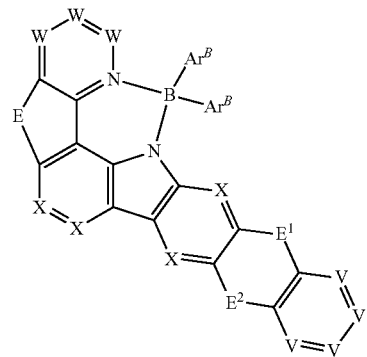
Formula (1-15)

-continued
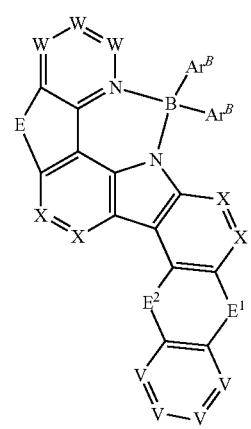
Formula (1-16)
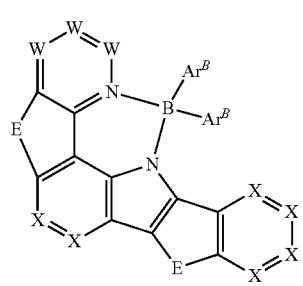
Formula (1-17)
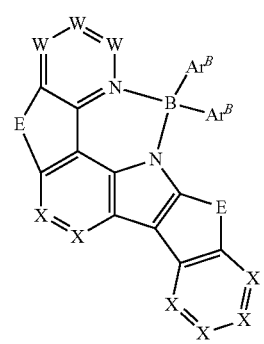
Formula (1-18)
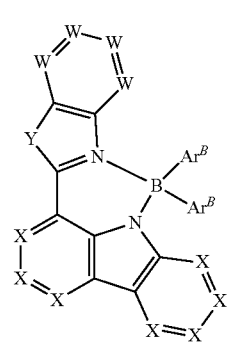
Formula (2-1)
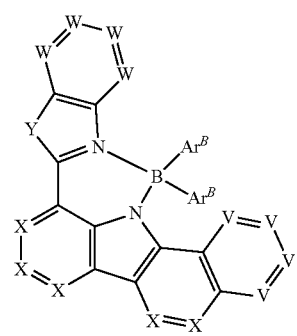
Formula (2-2)
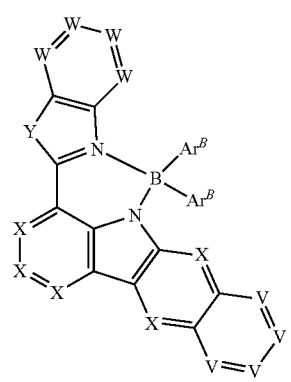
Formula (2-3)
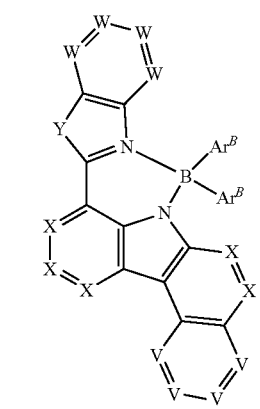
Formula (2-4)
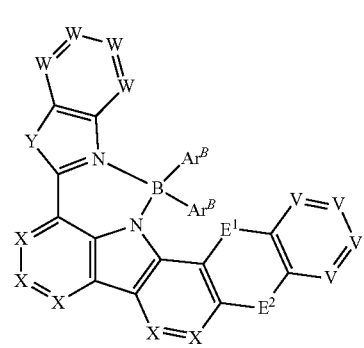
Formula (2-5)

-continued
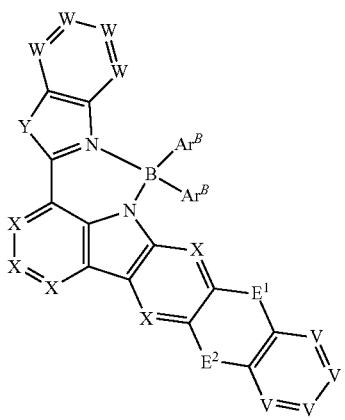
Formula (2-6)
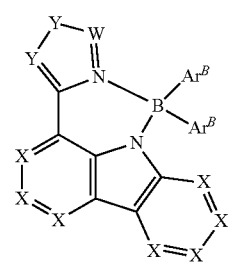
Formula (3-1)
Formula (2-7)
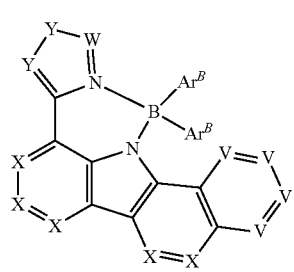
Formula (3-2)
Formula (3-3)
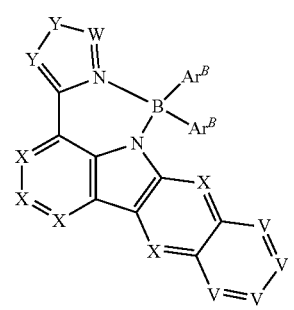
Formula (2-8)
Formula (3-4)
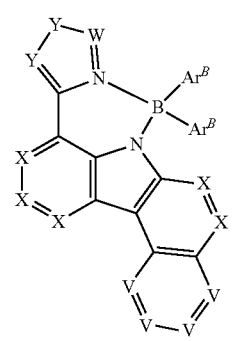
Formula (2-9)
Formula (3-5)
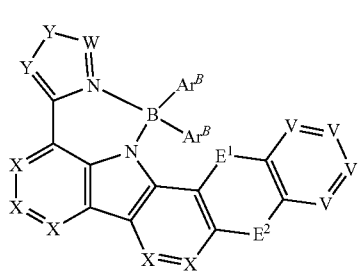

-continued

Formula (3-6)

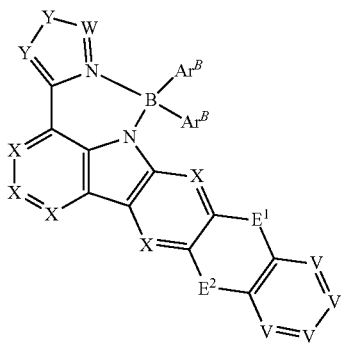

Formula (3-7)

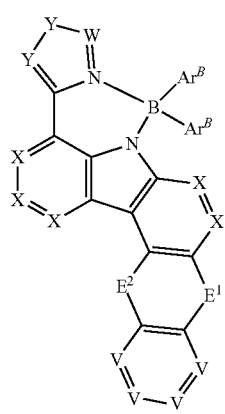

Formula (3-8)

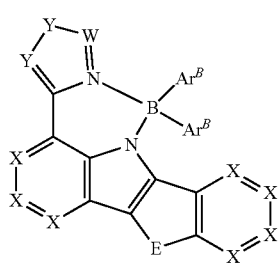

Formula (3-9)

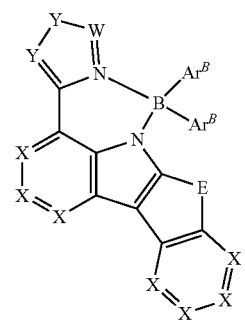

where the symbols X and $Ar^B$ have the same meaning as in claim 1,

Y stands on each occurrence, identically or differently, for O, S, $C(R^1)_2$ or $NR^1$;

W stands, on each occurrence, identically or differently, for $CR^1$ or N; or two adjacent groups W stand for a group of formula (W-1) or (W-2), Formula (W-1)

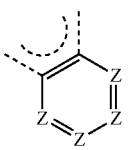

Formula (W-2)

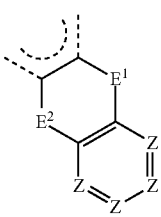

where the dashed bonds in formulae (W-1) and (W-2) indicate the bonding to the groups of formula (Ar1-1) or (Ar1-2);

Z is on each occurrence, identically or differently, CR' or N;

$E^1$, $E^2$ are, on each occurrence, identically or differently, selected from a single bond, $B(R^0)$, $C(R^0)_2$, $Si(R^0)_2$, C=O, C=$NR^0$, C=$C(R^0)_2$, O, S, S=O, $SO_2$, $N(R^0)$, $P(R^0)$ and P(=O)$R^0$, where at least one of the groups $E^1$ and $E^2$, present in the same ring, is not a single bond;

$R^0$ stands on each occurrence, identically or differently, for H, D, F, Cl, Br, I, CN, a straight-chain alkyl, alkoxy or thioalkyl groups having 1 to 40 C atoms or branched or a cyclic alkyl, alkoxy or thioalkyl groups having 3 to 40 C atoms, each of which may be substituted by one or more radicals $R^4$, where in each case one or more non-adjacent $CH_2$ groups may be replaced by $R^4$C=$CR^4$, C—C, $Si(R^4)_2$, $Ge(R^4)_2$, $Sn(R^4)_2$, C=O, C=S, C=Se, P(=O)($R^4$), SO, $SO_2$, O, S or $CONR^4$ and where one or more H atoms may be replaced by D, F, Cl, Br, I, CN or $NO_2$, an aromatic or heteroaromatic ring systems having 5 to 60 aromatic ring atoms, which may in each case be substituted by one or more radicals $R^4$, or an aryloxy groups having 5 to 60 aromatic ring atoms, which may be substituted by one or more radicals $R^4$, where two adjacent substituents $R^0$ may form an aliphatic or aromatic ring system together, which may be substituted by one or more radicals $R^4$; and the symbol E stands for —$B(R^0)$—, —$C(R^0)_2$—, —$Si(R^0)_2$—, —C(=O)—, —C(=$NR^0$)—, —$C(R^0)$=$C(R^0)$—, —C(=$C(R^0)_2$)—, —O—, —S—, —S(=O)—, —$SO_2$—, —$N(R^0)$—, —$P(R^0)$— or —P(=O)$R^0$—.

14. The compound according to claim 13, characterized in that there are maximum two X groups per 6-membered ring, which stand for N, there are maximum two W groups per 6-membered ring, which stand for N, there are maximum two V groups per 6-membered ring, which stand for N and there are maximum two Z groups per 6-membered ring, which stand for N.

15. The compound according to claim 1, characterized in that the compound is selected from the compounds of formulae (1-1a) to (3-9a), -continued
Formula (1-1a)
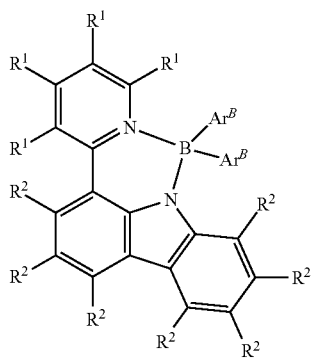
Formula (1-2a)
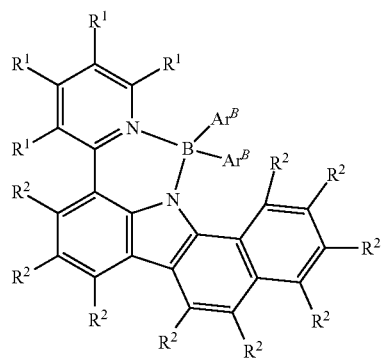
Formula (1-3a)
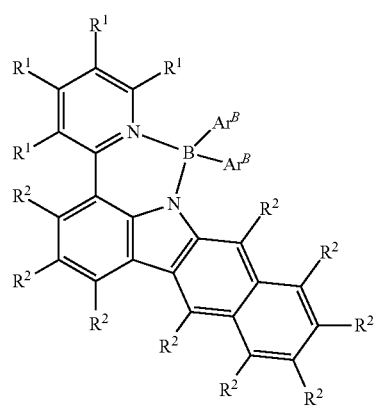
Formula (1-4a)
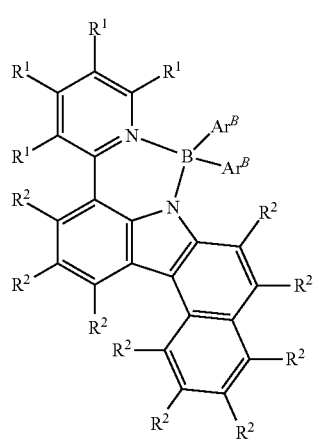
Formula (1-5a)
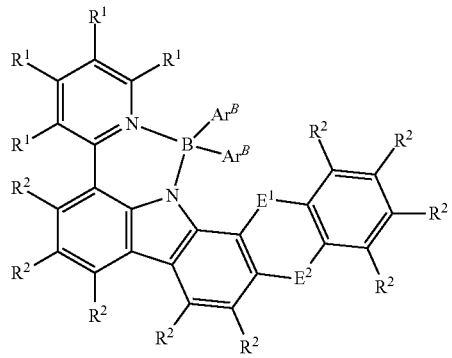
Formula (1-6a)
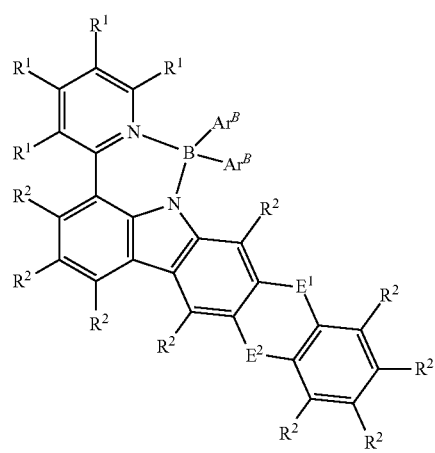
Formula (1-7a)
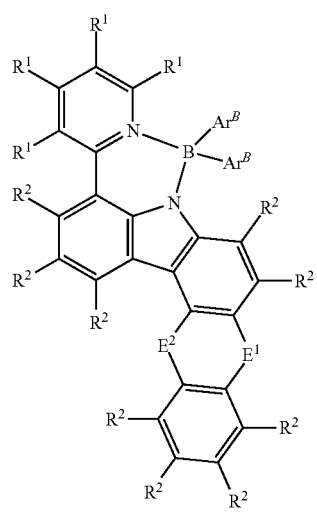

-continued
Formula (1-8a)
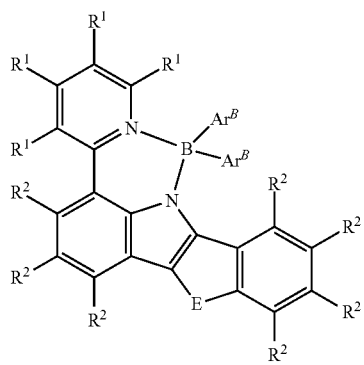
Formula (1-9a)
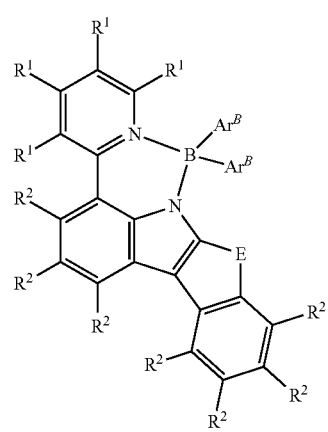
Formula (1-10a)
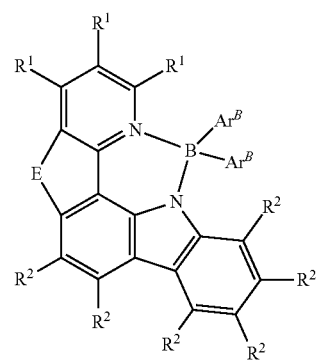
Formula (1-11a)
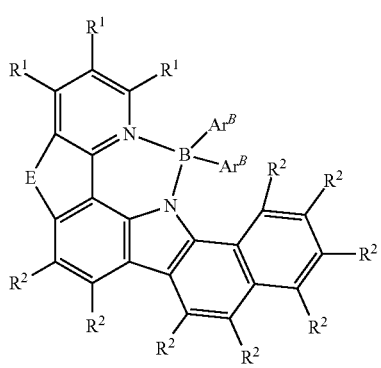
Formula (1-12a)
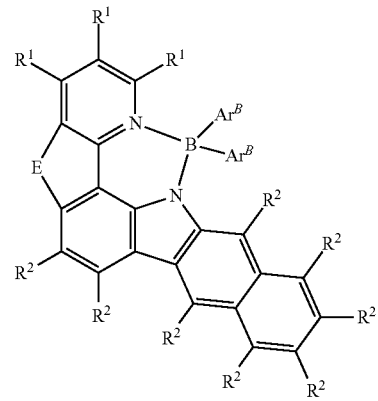
Formula (1-13a)
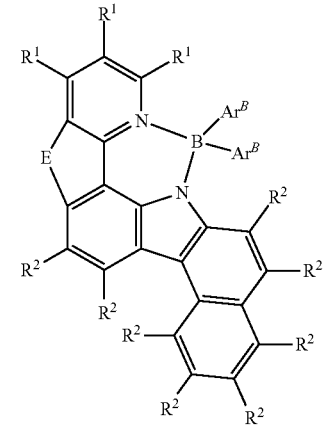
Formula (1-14a)
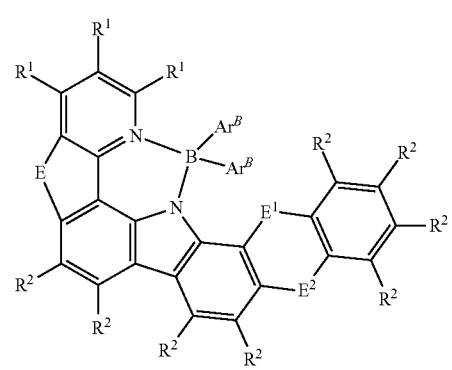

Formula (1-15a)
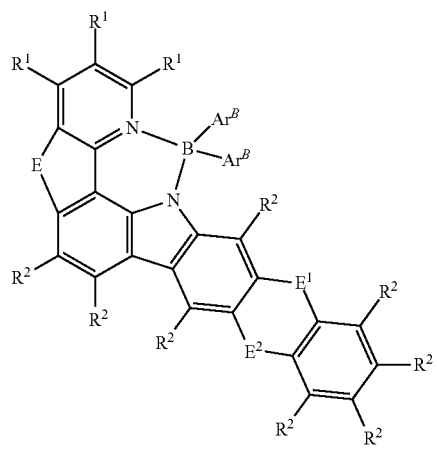
Formula (1-16a)
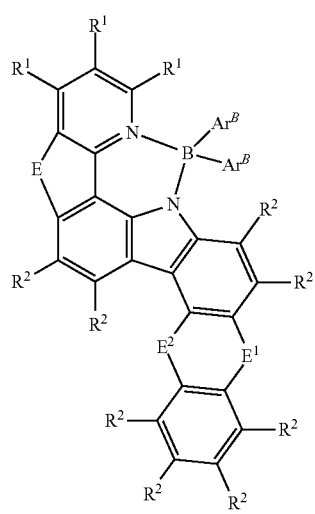
Formula (1-17a)
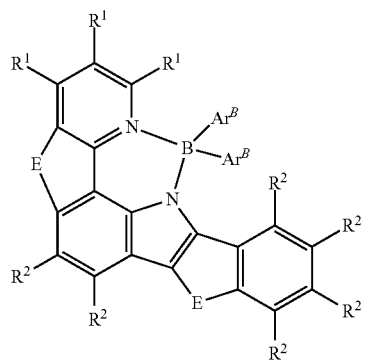
Formula (1-18a)
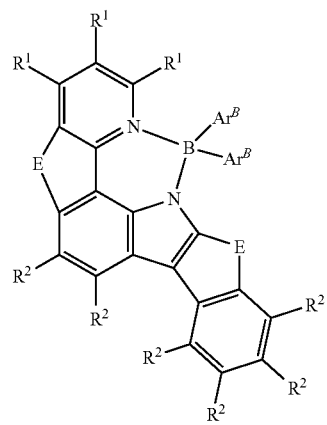
Formula (2-1a)
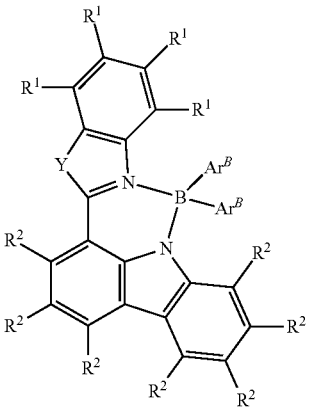
Formula (2-2a)
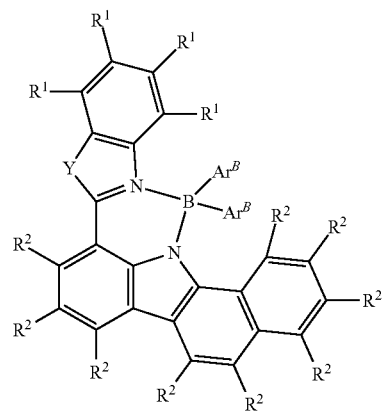

Formula (2-3a)
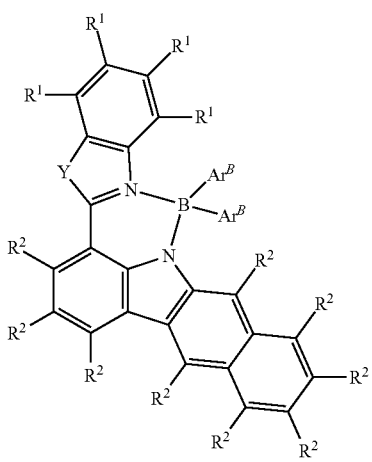
Formula (2-4a)
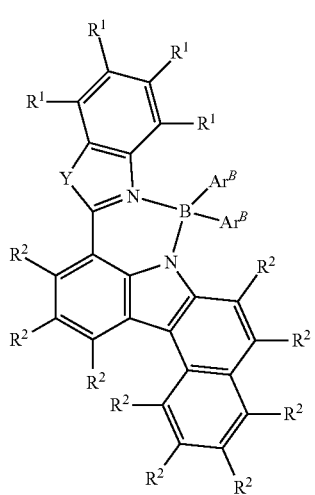
Formula (2-5a)
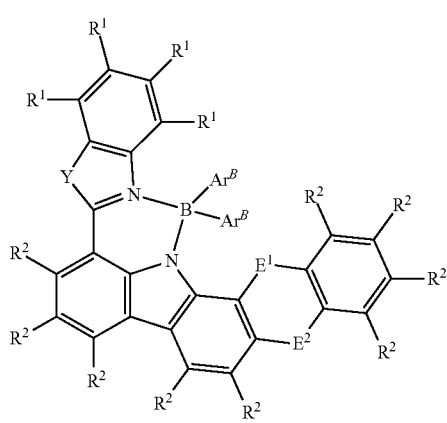
Formula (2-6a)
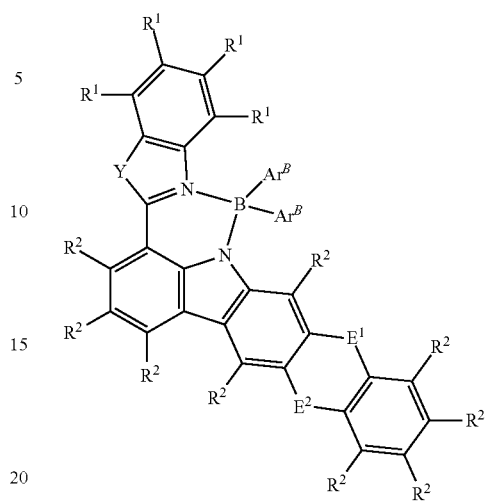
Formula (2-7a)
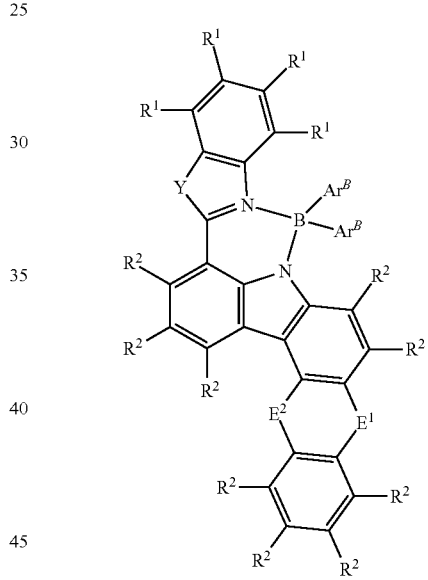
Formula (2-8a)
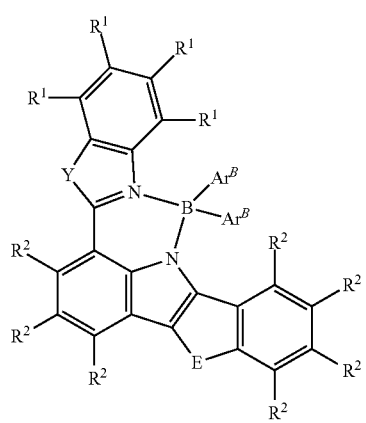

Formula (2-9a)
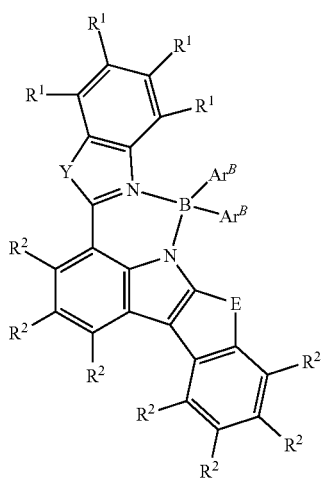
Formula (3-1a)
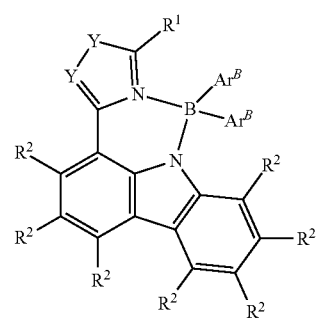
Formula (3-2a)
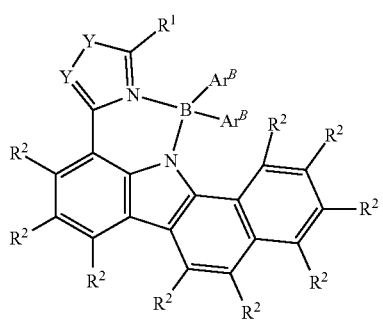
Formula (3-3a)
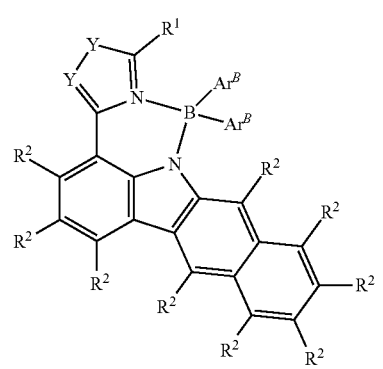
Formula (3-4a)
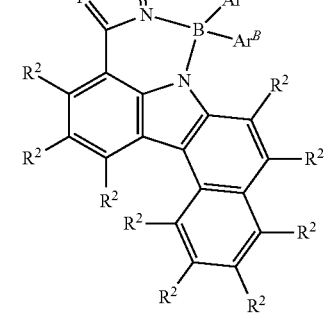
Formula (3-5a)
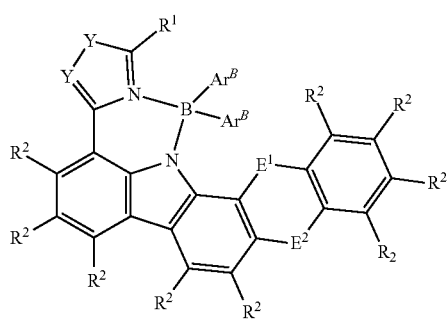
Formula (3-6a)
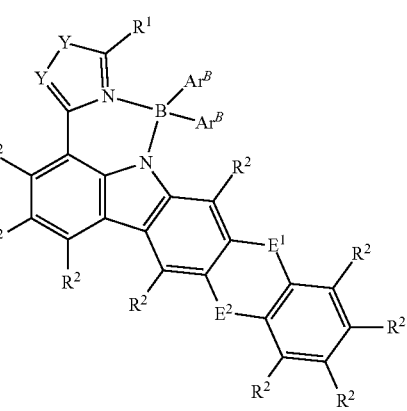
Formula (3-7a)
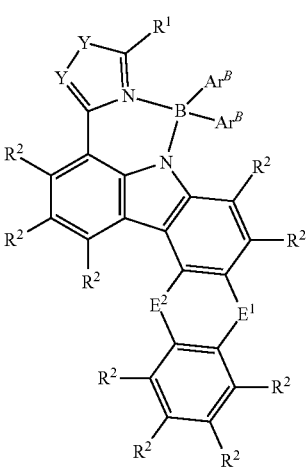

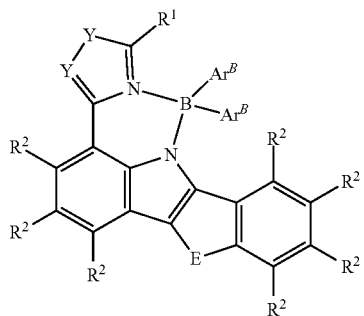

Formula (3-8a)

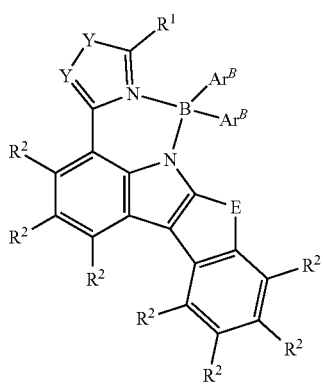

Formula (3-9a)

where the symbols $R^1$, $R^2$ and $Ar^B$ have the same meaning as given in claim 1, Y stands on each occurrence, identically or differently, for O, S, $C(R^1)_2$ or $NR^1$;

E stands for $—B(R^0)—$, $—C(R^0)_2—$, $—Si(R^0)_2—$, $—C(=O)—$, $—C(=NR^0)—$, $—C(R^0)=C(R^0)—$, $—C(=C(R^0)_2)—$, $—O—$, $—S—$, $—S(=O)—$, $—SO_2—$, $—N(R^0)—$, $—P(R^0)—$ or $—P((=O)R^0)—$ $E^1$ and $E^2$ are, on each occurrence, identically or differently, selected from a single bond, $B(R^0)$, $C(R^0)_2$, $Si(R^0)_2$, $C=O$, $C=NR^0$, $C=C(R^0)_2$, O, S, $S=O$, $SO_2$, $N(R^0)$, $P(R^0)$ and $P(=O)R^0$, where at least one of the groups $E^1$ and $E^2$, present in the same ring, is not a single bond;

and $R^0$ stands on each occurrence, identically or differently, for H, D, F, Cl, Br, I, CN, a straight-chain alkyl, alkoxy or thioalkyl groups having 1 to 40 C atoms or branched or a cyclic alkyl, alkoxy or thioalkyl groups having 3 to 40 C atoms, each of which may be substituted by one or more radicals $R^4$, where in each case one or more non-adjacent $CH_2$ groups may be replaced by $R^4C=CR^4$, $C\equiv C$, $Si(R^4)_2$, $Ge(R^4)_2$, $Sn(R^4)_2$, $C=O$, $C=S$, $C=Se$, $P(=O)(R^4)$, SO, $SO_2$, O, S or $CONR^4$ and where one or more H atoms may be replaced by D, F, Cl, Br, I, CN or $NO_2$, an aromatic or heteroaromatic ring systems having 5 to 60 aromatic ring atoms, which may in each case be substituted by one or more radicals $R^4$, or an aryloxy groups having 5 to 60 aromatic ring atoms, which may be substituted by one or more radicals $R^4$, where two adjacent substituents $R^0$ may form an aliphatic or aromatic ring system together, which may be substituted by one or more radicals $R^4$.

16. The compound according to claim 1, characterized in that the compound comprises at least one group $R^1$ or $R^2$ selected from the groups of formula (R-1) to (R-15),

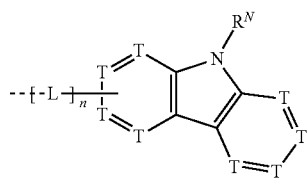

(R-1)

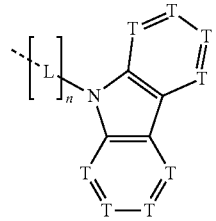

(R-2)

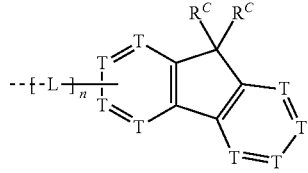

(R-3)

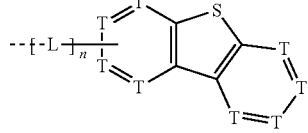

(R-4)

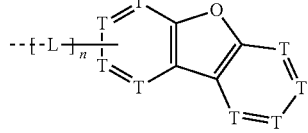

(R-5)

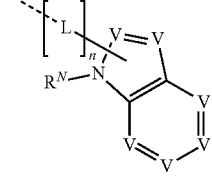

(R-6)

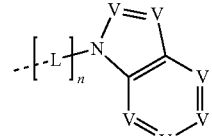

(R-7)

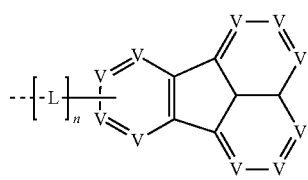

(R-8)

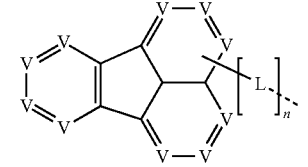

(R-9)

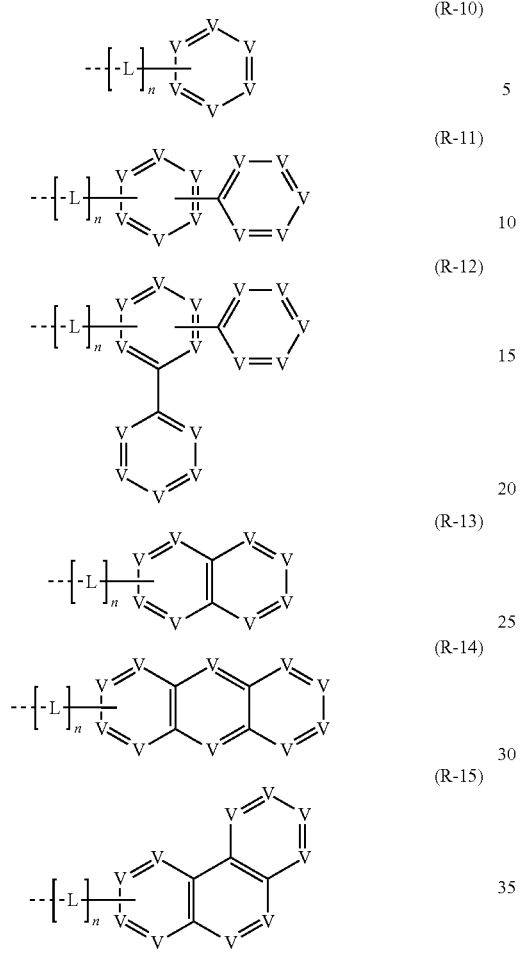

(R-10)
(R-11)
(R-12)
(R-13)
(R-14)
(R-15)

where:
the dashed bond indicates the bonding to the structure of formula (1) and the symbol V has the same meaning as in claim 1, with the proviso that V is a C atom when the dashed bond is bonded to V, and where:

$R^N$, $R^C$ are on each occurrence, identically or differently, H, D, F, Cl, Br, I, CHO, $N(Ar^3)_2$, $C(=O)Ar^3$, $(P(=O)(Ar^3)_2$, $S(=O)Ar^3$, $S(=O)_2Ar^3$, $(R)C=C(R)Ar^3$, CN, $NO_2$, $Si(R^4)_3$, $B(OR^4)_2$, $B(R^4)_2$, $B(N(R^4)_2)_2$, $OSO_2R^4$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^4$, where one or more, $CH_2$ groups may be replaced by $(R^4)C=C(R^4)$, $C≡C$, $Si(R^4)_2$, $Ge(R^4)_2$, $Sn(R^4)_2$, $C=O$, $C=S$, $C=Se$, $P(=O)(R^4)$, SO, $SO_2$, $N(R^4)$, O, S or a $CON(R^4)$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^4$, or an aryloxy or heteroaryloxy group having 5 to 60 aromatic ring atoms, which may be substituted by one or more radicals $R^4$, where optionally two adjacent substituents RC can form a mono- or polycyclic, aliphatic, aromatic or heteroaromatic ring system with one another; where $Ar^3$ and $R^4$ have the same definitions as in claim 1; and T stands, on each occurrence, identically or differently, for $CR^4$ or N, with the proviso that T is a C atom when the dashed bond is bonded to T; or two adjacent groups T stand for a group of formula (T-1) or (T-2),

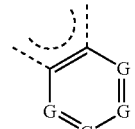

Formula (T-1)

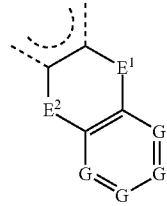

Formula (T-2)

where the dashed bonds in formulae (T-1) and (T-2) indicate the bonding to the groups of formulae (R-1) to (R-5);

G is on each occurrence, identically or differently, $CR^4$ or N; where $R^4$ has the same meaning as in claim 1;

$E^1$, $E^2$ are, on each occurrence, identically or differently, selected from a single bond, and $B(R^0)$, $C(R^0)_2$, $Si(R^0)_2$, $C=O$, $C=NR^0$, $C=C(R^0)_2$, O, S, $S=O$, $SO_2$, $N(R^0)$, $P(R^0)$ and $(P(=O)R^0$, where at least one of the groups $E^1$ and $E^2$, present in the same ring, is not a single bond;

L is an aromatic or heteroaromatic ring system having 5 to 30 aromatic ring atoms, which may be substituted by one or more radicals $R^4$; and n is 0 or 1.

17. The compound as claimed in claim 16, wherein $R^N$, $R^C$ are on each occurrence, identically or differently, H, D, F, Cl, Br, I, CHO, $N(Ar^3)_2$, $C(=O)Ar^3$, $(P(=O)(Ar^3)_2$, $S(=O)Ar^3$, $S(=O)_2Ar^3$, $(R)C=C(R)Ar^3$, CN, $NO_2$, $Si(R^4)_3$, $B(OR^4)_2$, $B(R^4)_2$, $B(N(R^4)_2)_2$, $OSO_2R^4$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^4$, where one or more, non-adjacent $CH_2$ groups may be replaced by $(R^4)C=C(R^4)$, $Si(R^4)_2$, $Ge(R^4)_2$, $Sn(R^4)_2$, $C=O$, $C=S$, $C=Se$, $P(=O)(R^4)$, SO, $SO_2$, $N(R^4)$, O, S or a $CON(R^4)$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^4$, or an aryloxy or heteroaryloxy group having 5 to 60 aromatic ring atoms, which may be substituted by one or more radicals $R^4$, where optionally two adjacent substituents RC can form a mono- or polycyclic, aliphatic, aromatic or heteroaromatic ring system with one another.

* * * * *